(12) United States Patent
Kabir et al.

(10) Patent No.: US 10,211,820 B2
(45) Date of Patent: Feb. 19, 2019

(54) CLOCK GENERATOR FOR MULTI-CHANNEL ANALOG TO DIGITAL CONVERTER

(71) Applicant: NXP USA, Inc., Austin, TX (US)

(72) Inventors: Mohammad Nizam Kabir, Tempe, AZ (US); Mariam Hoseini, San Mateo, CA (US); Rakesh Shiwale, Chandler, AZ (US); Doug Garrity, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 125 days.

(21) Appl. No.: 15/362,900

(22) Filed: Nov. 29, 2016

(65) Prior Publication Data

US 2018/0152181 A1    May 31, 2018

(51) Int. Cl.
*H03K 5/15*    (2006.01)
*H03L 7/18*    (2006.01)

(52) U.S. Cl.
CPC ........... *H03K 5/15066* (2013.01); *H03L 7/18* (2013.01)

(58) Field of Classification Search
CPC ....................................................... H03K 5/15
See application file for complete search history.

(56) References Cited

U.S. PATENT DOCUMENTS

| | | | |
|---|---|---|---|
| 5,574,457 A | 11/1996 | Garrity et al. | |
| 5,818,276 A | 10/1998 | Garrity et al. | |
| 5,886,562 A | 3/1999 | Garrity et al. | |
| 6,160,508 A | 12/2000 | Gustavsson et al. | |
| 6,541,952 B2 | 4/2003 | Nagaraj | |
| 7,064,700 B1 | 6/2006 | Garrity et al. | |
| 7,138,933 B2 | 11/2006 | Nairn | |
| 7,307,572 B2 | 12/2007 | Garrity et al. | |
| 7,649,957 B2 | 1/2010 | Garrity et al. | |
| 8,736,309 B2 * | 5/2014 | Garrity | H03K 5/1515 326/93 |
| 8,779,963 B1 | 7/2014 | Bales | |
| 9,748,964 B1 * | 8/2017 | Kabir | H03M 1/002 |

FOREIGN PATENT DOCUMENTS

EP    2618490 A2    7/2013

OTHER PUBLICATIONS

Notice of Allowance for U.S. Appl. No. 15/362,869 dated Jun. 16, 2017, 8 pages.

(Continued)

*Primary Examiner* — Hai L Nguyen

(57) ABSTRACT

Embodiments of a multi-stage clock generator architecture that generates multiple non-overlapping clock phase signals includes: a first stage clock generator configured to: divide an input clock signal into a number of clock signals, synchronize each clock signal to a transition edge of a synchronization signal to produce synchronized clock signals, wherein the synchronization signal is a delayed version of the input clock signal by at least an amount sufficient to ensure that each of the clock signals become stable in response to a transition edge of the input clock signal, and generate a number of clock phase signals based on the synchronized clock signals. The architecture also includes a later stage clock generator configured to: generate a set of mutually non-overlapping clock phase signals based on the input clock signal.

20 Claims, 22 Drawing Sheets

(56) References Cited

OTHER PUBLICATIONS

Garrity et al., "A Single Analog-to-Digital Converter That Converts Two Separate Channels (I and Q) in a Broadband Radio Receiver," IEEE Journal of Solid-State Circuits, vol. 43, No. 6, Jun. 2008, 12 pages.
Kaviani et al., "A Multichannel Pipeline Analog-to-Digital Converter for an Integrated 3-D Ultrasound Imaging System," IEEE Journal of Solid-State Circuits, vol. 38, No. 7, Jul. 2003, 5 pages.
Sumanen et al., "A 10-bit 200-MS/s CMOS Parallel Pipeline A/D Converter," IEEE Journal of Solid-State Circuits, vol. 36, No. 7, Jul. 2001, 8 pages.
Kwang et al., "A 10-b, 100-MS/s CMOS A/D Converter, IEEE Journal of Solid-State Circuits," vol. 32, No. 3, Mar. 1997, 10 pages.
"The Pipeline ADC / Gadgets, Unusual Equipment and Electronics," http://xn--vd-yka.info/, Sep. 2, 2015, 25 pages.
Yoshioka et al., "10-bit, 125MS/s, 40mW Pipelined ADC in 0.18um CMOS," Fujitsu Sci. Tech., Apr. 2006, pp. 248-257.

* cited by examiner

… (1)

CLOCK GENERATOR FOR MULTI-CHANNEL ANALOG TO DIGITAL CONVERTER

CROSS-REFERENCE TO RELATED APPLICATION(S)

This application is related to U.S. patent application Ser. No. 15/362,869, filed on even date, entitled "MULTI-CHANNEL ANALOG TO DIGITAL CONVERTER," naming Mohammad Nizam Kabir, Mariam Hoseini, Rakesh Shiwale, and Doug Garrity as inventors, and assigned to the current assignee hereof.

BACKGROUND

Field

This disclosure relates generally to electronic circuits, and more specifically, to pipelined analog to digital converters (ADCs) and clock generator circuits utilized in such ADCs.

Related Art

Applications such as digital video, wireless communications, and sensor signal interpretation often require low power and high speed analog-to-digital signal conversion. Pipelined analog-to-digital converters (ADCs) offer a combination of high throughput and small area. Pipelined ADCs are commonly used for medium to high resolution applications that can tolerate latency associated with the pipeline as signals are processed through each pipeline stage.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1:
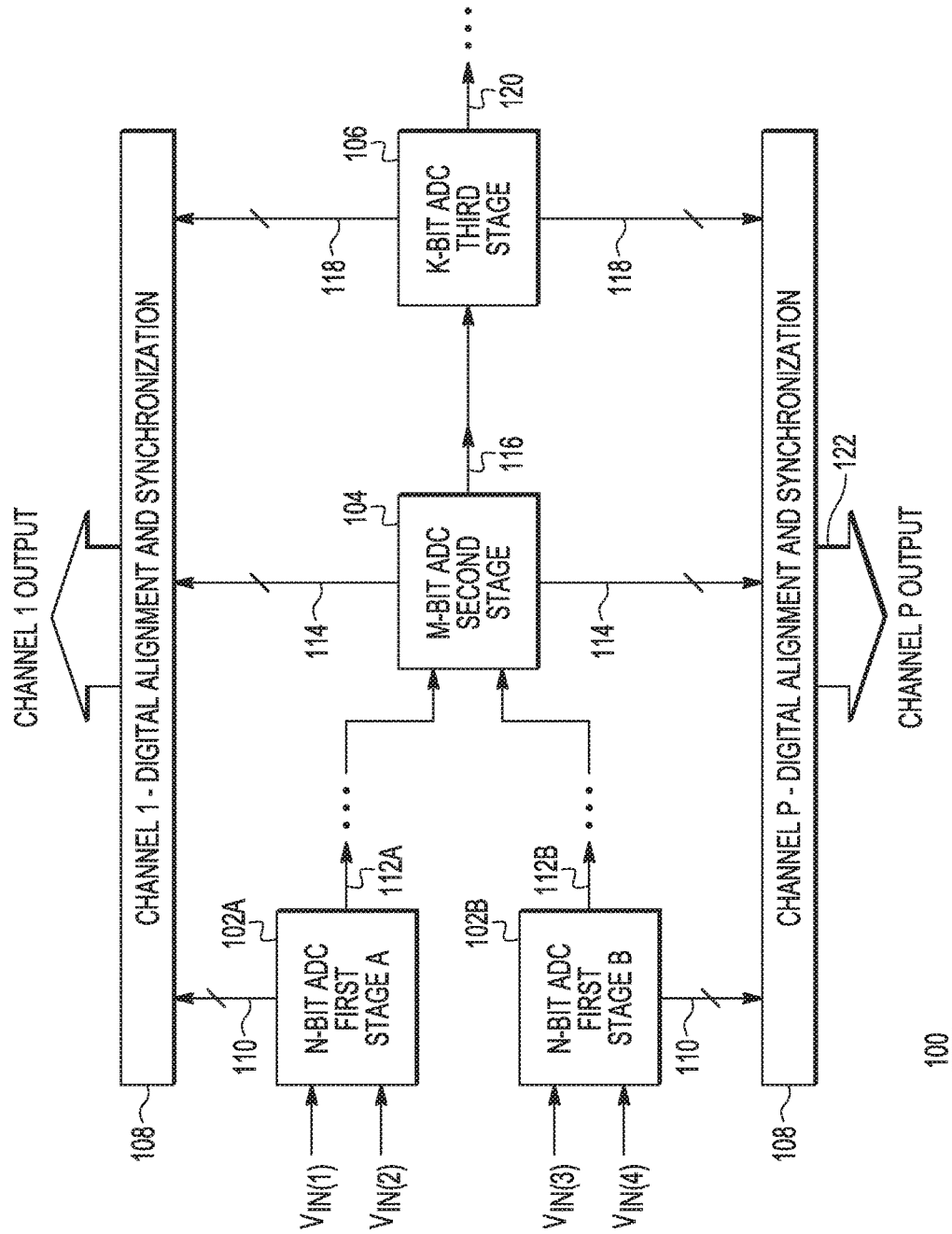
FIGS. 1 and 17 illustrate block diagrams depicting example pipelined ADCs in which the present disclosure is implemented, according to some embodiments.

The following sets forth a detailed description of various embodiments intended to be illustrative of the invention and should not be taken to be limiting.

Overview

The present disclosure provides for a low power and low area multiple channel (multi-channel) pipelined ADC for high speed applications. The multi-channel ADC includes two distinct input stages that provide four sampling channels, where the sampling channels are coupled to four distinct input channels or are tied together to a single input channel. In one embodiment, the input stages operate at half the system clock rate (fsys/2) and perform double sampling of multiple input channels. The output of these input stages are combined at a single subsequent stage, which operates at the system clock rate (fsys) and also performs double sampling in a time-interleaved manner. In another embodiment, the input stages are configured to sample a single input channel at two times the system clock rate (2×fsys), while operating at half the system clock rate to save power.

It is noted that the open-loop DC-gain of an operational amplifier (or gain stage) in a multiplying digital to analog converter (MDAC) is determined by the overall resolution of the ADC that is being implemented, and the slew rate and GBW (gain bandwidth) specifications can be derived from the sampling speed of the analog-to-digital converter (ADC). The MDAC output has to settle to the corresponding accuracy of the gain stage during the hold time. The power dissipation of a parallel pipelined ADC is to a great extent determined by the current consumption of the operational amplifiers of the MDACs (specifically, that of the first stage, which has the highest accuracy requirement). Consequently, to reduce current consumption and power dissipation, the disclosed multi-channel ADC employs two separate input stages, each operating at a sampling frequency (such as half the system clock), which allows the amplifier current to be scaled down by as much as a factor of four, which reduces power accordingly. This stage can accommodate a higher sampling rate if the current is not adjusted. Since the resolution required for the later stages in the pipelined ADC is relaxed, the two parallel paths of the input stages are merged into a single path operating at twice the sampling frequency of the first stage, maintaining the throughput of the multi-channel ADC.

The MDACs implemented in the multi-channel ADC employ a double sampling technique for effectively doubling the frequency of operation, thus saving area. However, double sampling introduces some non-ideal conditions, such as memory effect, offset, gain error, and timing skew. The former non-ideal conditions can be tolerated to some extent with adequate amplifier open loop DC-gain, sufficient bandwidth (e.g., complete settling), and careful layout techniques.

The later condition, timing skew, is an important condition to address in embodiments of the multi-channel ADC that sample a single input channel, which may cause distortion. Timing skew is resolved in such embodiments by using a clock generation system that generates precisely matched clock phase signals with minimized timing skew. These clock phase signals may be provided as multiple sets of non-overlapping signals or may be provided as a single set of mutually non-overlapping signals. In such embodiments, all clock phase signals are synchronized with one signal that is a delayed version of the clock generation system's input clock, which in the embodiments discussed herein is twice the system clock rate (2×fsys). This synchronization significantly reduces the timing skew between the clock phase signals delivered to the various stages (i.e., the timing skew between the clock phase signals delivered to the sampling channels are within operating tolerances). This also eliminates the need for an explicit sample and hold circuit before the input stages for timing skew-independent sampling, which saves area and power.

In other embodiments of the multi-channel ADC that sample multiple input channels, timing skew is not as significant an issue since each channel uses a dedicated one of the clock phase signals. In such embodiments, the clock phase signals are generated based on the clock generation system's input clock, which in the embodiments discussed herein is the full system clock rate (fsys) without needing to use a synchronization signal.

Example Embodiments

FIG. 1 is a schematic representation of a generalized pipelined multiple channel (or multi-channel) analog-to-digital converter (ADC) 100 configured in accordance with an example embodiment of the present disclosure. In the embodiment shown, ADC 100 includes a number of pipeline stages connected in series, such as a first stage A 102A (also referred to as a first stage 102A or an input stage 102A), a first stage B 102B (also referred to as a first stage 102B or an input stage 102B), a second stage 104, and a third stage 106. ADC 100 is depicted in FIG. 1 in a generalized manner that is intended to represent the flexible nature of ADC 100. In this regard, although ADC 100 is depicted as including a single third stage 106, different embodiments of ADC 100 may include any number (including zero) of third stages 106, depending on the particular application of the ADC 100. For example, multiple third stages 106 may be implemented in various embodiments, as indicated by the ellipsis following the output of third stage 106. In other embodiments, zero third stages 106 are implemented, where a simple embodiment of ADC 100 can be realized with first stages 102A and 102B and second stage 104 alone. In still other embodiments, multiple instances of first stages 102A connected in series and multiple instances of first stages 102B connected in series may be implemented, as indicated by the ellipses following the outputs of first stages 102A and 102B.

ADC 100 is configured to implement P sampling channels, where the number of P sampling channels is dependent on the application of ADC 100. In the embodiment shown, four sampling channels are implemented, one sampling channel for each input node of ADC 100. In some embodiments, each input node Vin(1)-(4) of ADC 100 is coupled to a respective one of four different input channels. In other embodiments, the input nodes Vin(1)-(4) are tied together to sample a single input channel. In other words, the structure provided in the present disclosure can be used to sample either a single input channel or multiple input channels, as discussed below.

In the embodiment shown, ADC 100 implements at least one instance of first stage 102A and at least one instance of first stage 102B, each stage having two input nodes and one output node. The output nodes of stages 102A and 102B are coupled to respective input nodes of second stage 104, which has two input nodes and one output node. The output node of stage 104 is coupled to an input node of stage 106 (if present), which has a single input node and a single output node. Each stage includes at least one sub-ADC circuit and at least one MDAC (multiplying digital to analog converter) circuit, which in turn includes a gain element, such as an operational amplifier. The circuitry implemented in each stage includes a number of circuitry paths, where each circuitry path is associated with a respective one of the P sampling channels.

Each of the first, second, and third stages is configured to sample an analog voltage signal present at its respective input node(s) and generate an output voltage at its output node for the next stage (if any), as further discussed below. Each of the first, second, and third stages is also configured to generate a digital output (such as number of bits) for each channel. For example, stages 102A and 102B each generate an N-bit digital output 110 for each sampling channel, where each N-bit digital output 110 is generated based at least in part on an input voltage provided at a respective one of Vin(1)-(4). Second stage 104 generates an M-bit digital output 114 for each sampling channel, where each M-bit digital output 114 is generated based at least in part on a voltage provided at a respective one of first stage outputs 112A and 112B. Third stage 106 generates a K-bit digital output 118 for each sampling channel, where each K-bit digital output 118 is generated based at least in part on a voltage provided at second stage output 116.

In the embodiment shown, ADC 100 also includes an architecture or arrangement 108 configured to perform digital alignment, synchronization, correction, or a combination thereof for each channel supported by ADC 100, which is coupled to each implemented stage of ADC 100. The digital outputs 110, 114, and 118 of the stages are provided to architecture 108, which is configured to align and synchronize the various digital outputs from the pipelined stages of ADC 100 to provide proper timing of the ultimate channel output data 122 for each of the P sampling channels processed by ADC 100. In addition, architecture 108 may be configured to perform digital correction, bit consolidation, and other digital processing of the various digital outputs prior to generating the channel output data 122 for each channel. In this regard, architecture 108 may leverage conventional digital correction logic employed by known ADC circuits.

It is noted that the variables N, M, and K need not be correlated in any way other than that they ultimately determine the overall resolution of the ADC being implemented. It is also noted that the various stages of ADC 100 need not process any specific number of bits for each sampling channel, and the actual number of bits in the digital outputs produced by the various stages of ADC 100 for each sampling channel need not be the same. The bit resolution of ADC 100 and the various stages of ADC 100 can be selected to suit the needs of the particular application of ADC 100. The number of P sampling channels that are processed by each stage in ADC 100 may also be adjusted as needed for the particular application of ADC 100.

Analog-to-Digital Converter (ADC)

Figure 17:
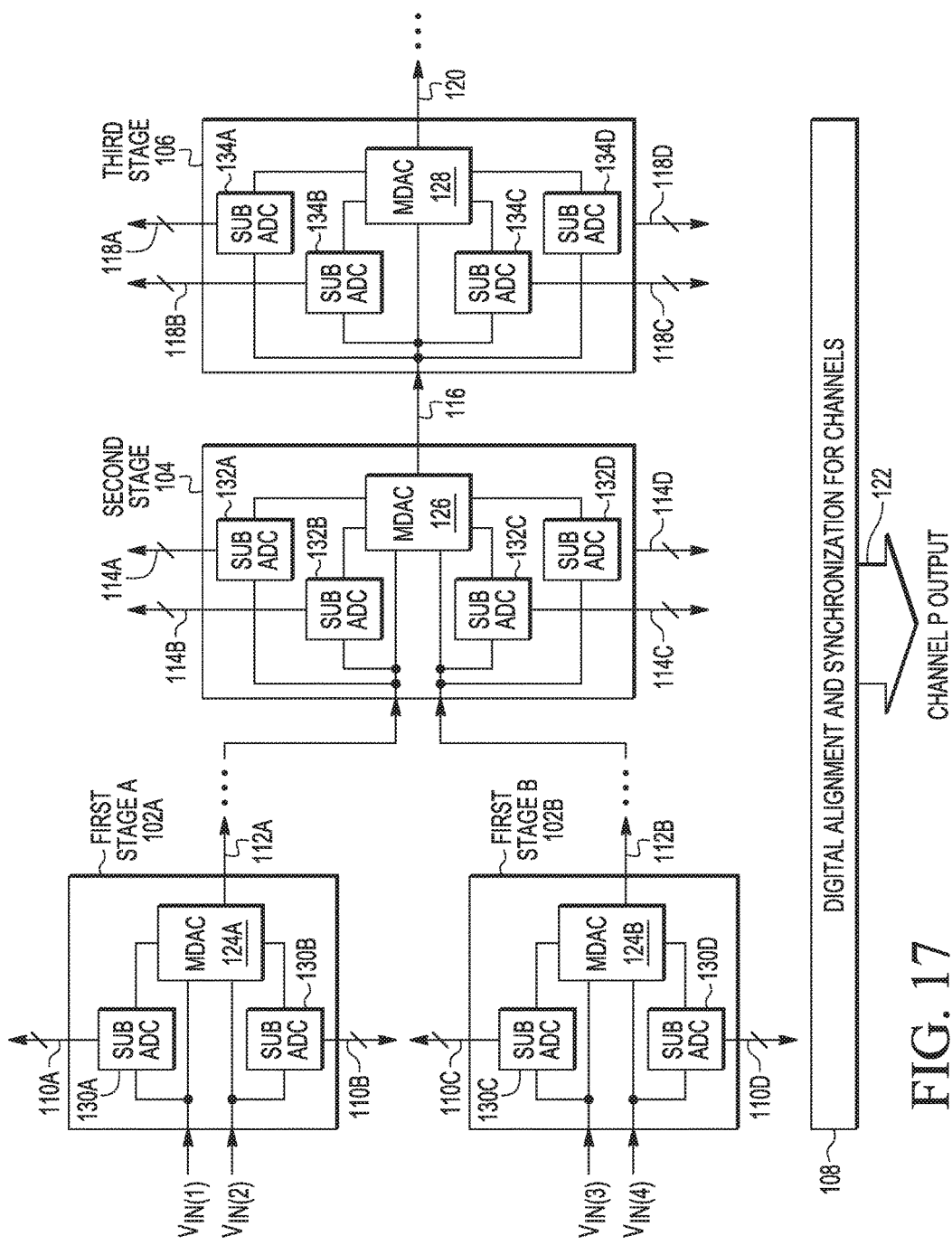

FIG. 17 illustrates an example embodiment of ADC 100. In the embodiments discussed below, the values of N, M, and K are each equal to 2 (e.g., two bits are generated for each channel by each stage), and the value of P is equal to four (e.g., four sampling channels). In the embodiments discussed herein, each stage is configured with a gain of 2, although different gain may be utilized in other embodiments.

First stage 102A includes sub-ADC circuits 130A and 130B respectively coupled to input nodes Vin(1) and Vin(2) and respectively associated with a first and second sampling channel. First stage 102A also includes an MDAC circuit 124A coupled to both Vin(1) and Vin(2), as well as to outputs of sub-ADC circuits 130A and 130B. MDAC 124A includes two circuit paths that are each associated with one of the first and second sampling channels and has an output node 112A. First stage 102B includes sub-ADCs 130C and 130D respectively coupled to input nodes Vin(3) and Vin(4) and respectively associated with a third and fourth sampling channel. First stage 102B also includes an MDAC 124B coupled to both Vin(3) and Vin(4) and to outputs of sub-ADCs 130C and 130D. MDAC 124B includes two circuit paths that are each associated with one of the third and fourth sampling channels and has an output node 112B.

Second stage 104 includes sub-ADCs 132A and 132B each coupled to a first input node of stage 104, which in turn is coupled to the output node 112A of stage 102A. Second stage 104 also includes sub-ADCs 132C and 132D each coupled to a second input node of stage 104, which in turn is coupled to the output node 112B of stage 102B. Each of the sub-ADCs 132A-D is respectively associated with one of the first, second, third, and fourth sampling channels. Second stage 104 also includes an MDAC 126 coupled to both input nodes of stage 104 and to outputs of sub-ADCs 132A-D. MDAC 126 includes four circuit paths that are each associated with one of the four sampling channels and has an output node 116.

Third stage 106 includes sub-ADCs 134A-D each coupled to the input node of stage 106, which in turn is coupled to the output node 116 of stage 104. Each of the sub-ADCs 134A-D is respectively associated with one of the four sampling channels. Third stage 106 also includes MDAC 128 coupled to the input node of stage 106 and to outputs of sub-ADCs 134A-D. MDAC 128 includes four circuit paths that are each associated with one of the four sampling channels and has an output node 120.

Each first stage MDAC is configured to alternately sample analog voltage signals at the input nodes of its two associated sampling channels and to alternately generate corresponding output voltages (or residual voltages) for the next stage. A channel's sampling phase occurs when the channel's associated circuit path in the MDAC is coupled to the channel's associated input node to sample the voltage present at the node, and a channel's gain phase occurs when the channel's circuit path is coupled to the gain element to generate the corresponding output voltage. Each first stage MDAC implements double sampling for its two channels, where each channel's sampling phase occurs while the other channel's gain phase occurs, which effectively doubles the sampling rate of the first stage MDACs with minimal increase in power consumption. As a result, each first stage MDAC provides a sequence of time-interleaved output voltages that are alternately associated with the two channels (e.g., every other voltage is associated with one channel, and the remaining interleaved voltages are associated with the other channel). In the embodiment shown, MDAC 124A generates a sequence of output voltages at node 112A that includes voltages that are alternately associated with the first and second channels, and MDAC 124B generates a sequence of output voltages at node 112B that includes voltages alternately associated with the third and fourth channels. It is also noted that the output voltages of nodes 112A and 112B are staggered in time with respect to one another, where one output voltage is generated at node 112A, then an output voltage is subsequently generated at node 112B, then another output voltage is subsequently generated at node 112A, and so on. In the embodiments discussed herein, each first stage MDAC is operated at half of a system clock frequency (fsys/2).

The second stage MDAC is similarly configured to alternately sample the analog voltage signals at its two input nodes and to alternately generate corresponding output voltages using a double sampling technique, where a given channel's sampling phase occurs while another channel's gain phase occurs. Since each voltage sequence received from the first stage MDACs are time-interleaved, the second stage MDAC performs sampling at twice the sampling rate of the first stage MDAC and outputs a sequence of time-interleaved output voltages that are alternately associated with the four channels, in a repeating cyclical manner (i.e., a "round robin" manner). In the embodiment shown, MDAC 126 generates output 116 that includes every fourth voltage being associated with a given channel. In this manner, second stage MDAC incorporates voltages corresponding to the four channels into a single output stream. In the embodiments discussed herein, the second stage MDAC is operated at a full system clock frequency (fsys).

The third stage MDAC is similarly configured to periodically sample the analog voltage signals at its input node and to generate corresponding output voltages using a double sampling technique. Since the voltage sequence received from the second stage MDAC is time-interleaved, the third stage MDAC also performs sampling at twice the sampling rate of the first stage MDAC and outputs a sequence of time-interleaved output voltages that are alternately associated with the four channels. In the embodiment shown MDAC 128 generates output 120 that includes every fourth voltage being associated with a given channel. In the embodiments discussed herein, each third stage MDAC is operated at a full system clock frequency (fsys).

The double sampling technique implemented by each MDAC of the first, second, and third stages is operated by a number of clock phase signals. In an embodiment where multiple input channels are being sampled (e.g., each input node is coupled to a different input channel), the clock phase signals for the first stage are generated based on a full system clock rate, or fsys. In an embodiment where a single input channel is being sampled (e.g., all four input nodes are tied), the clock phase signals for the first stage are generated based on twice the full system clock rate, or 2×fsys. In both embodiments, the first stage MDACs continue to be operated at half the system clock rate, or fsys/2, which satisfies hold time and other operational requirements while reducing power. In both embodiments, either 1) a single set of non-overlapping clock phase signals are provided to the first stage, where all signals of the set are mutually or fully non-overlapping with respect to one another, or 2) two sets of non-overlapping clock phase signals are provided to the first stage, where the signals within each set are non-overlapping with respect to one another, but where the signals of one set may overlap the signals of the other set.

In both single input channel and multiple input channel embodiments of ADC 100, it is noted that the use of first stages 102A and 102B reduces the accuracy requirements of second stage 104, which enables the practical use of second stage 104 in applications that require high precision. It is also noted that the MDACs discussed herein provide 1.5 bit resolution; however, MDACs providing different resolution (e.g., 2.5 bit, 3.5 bit) may be used in other embodiments.

Each sub-ADC of the first, second and third stages is configured to output a set of control signals during the associated channel's gain phase, based on the voltage sampled during the channel's preceding sampling phase. Each set of control signals is provided to the channel's circuit path in the corresponding MDAC, in order to generate the appropriate corresponding output voltage for the channel, as discussed below.

The sub-ADCs are also configured to generate a digital output for each sampling channel at each stage, where the digital output corresponds to a respective voltage signal Vin present at the respective stage input node, dependent on a threshold comparison process (further discussed below). Sub-ADCs 130A-D are configured to generate a respective one of N-bit digital outputs 110A-D for its associated channel, based on the input voltage present at a respective one of Vin(1)-(4). Sub-ADCs 132A-B are each configured to generate a respective one of M-bit digital outputs 114A-B for its associated channel based on first stage A output node 112A, and sub-ADCs 132C-D are each configured to generate a respective one of M-bit digital outputs 114C-D for its associated channel based on first stage B output node 112B. First stage A output node 112A provides time-interleaved voltages for the first and second channels, and first stage B output node 112B provides time-interleaved voltages for the third and fourth channels. Sub-ADCs 134A-D are each configured to generate a respective one of K-bit digital outputs 118A-D for its associated channel based on second stage output node 116, which provides time-interleaved voltages for the four channels. The digital output(s) from each sub-ADC is provided to digital alignment and synchronization architecture 108. An example sub-ADC circuit that may be utilized in each stage of ADC 100 is discussed below in connection with FIG. 14.

Figure 2:
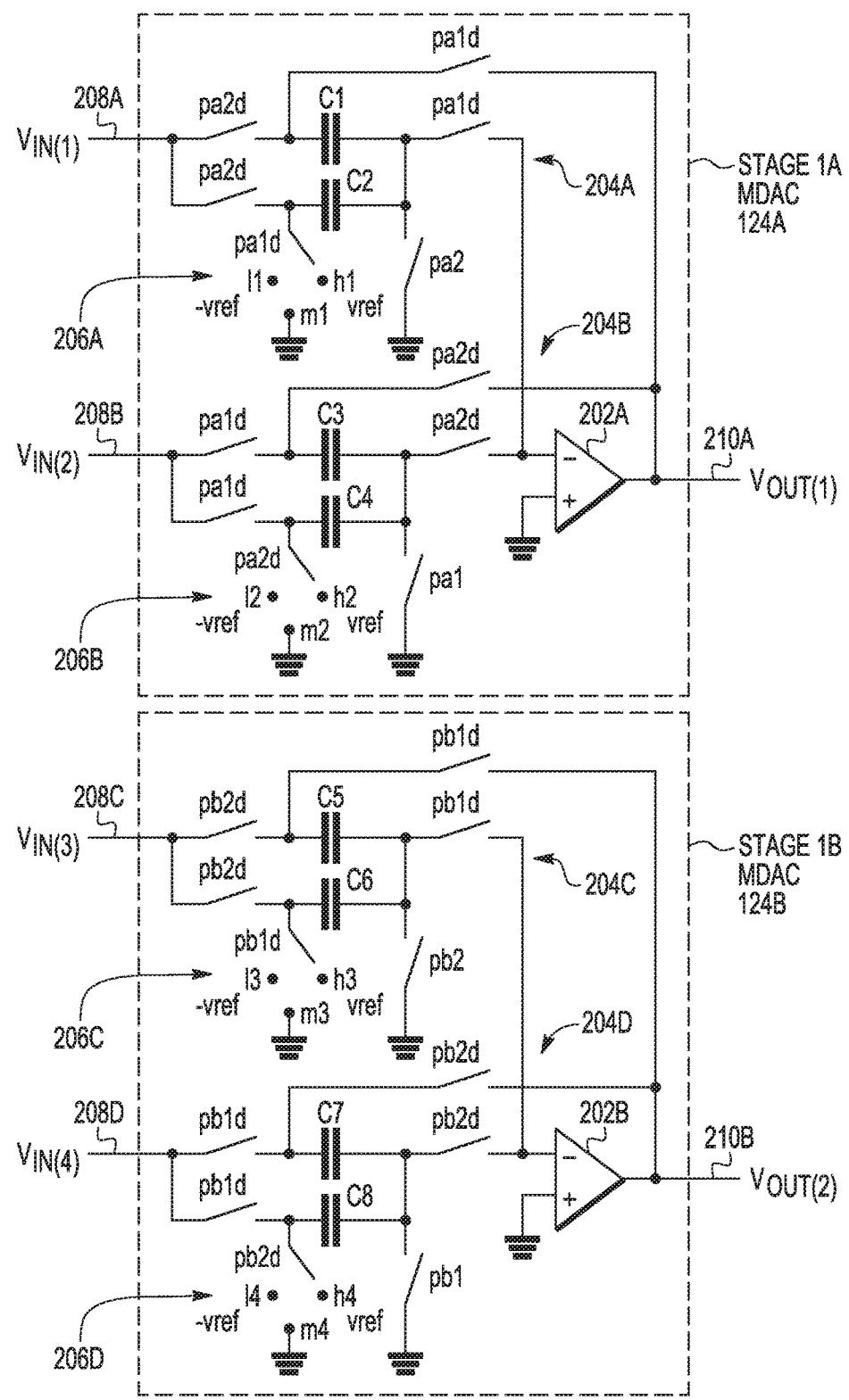
FIG. 2-4 illustrate circuit diagrams of example MDAC circuits that can be utilized in the pipelined ADC of FIG. 1, according to some embodiments.
Figure 3:
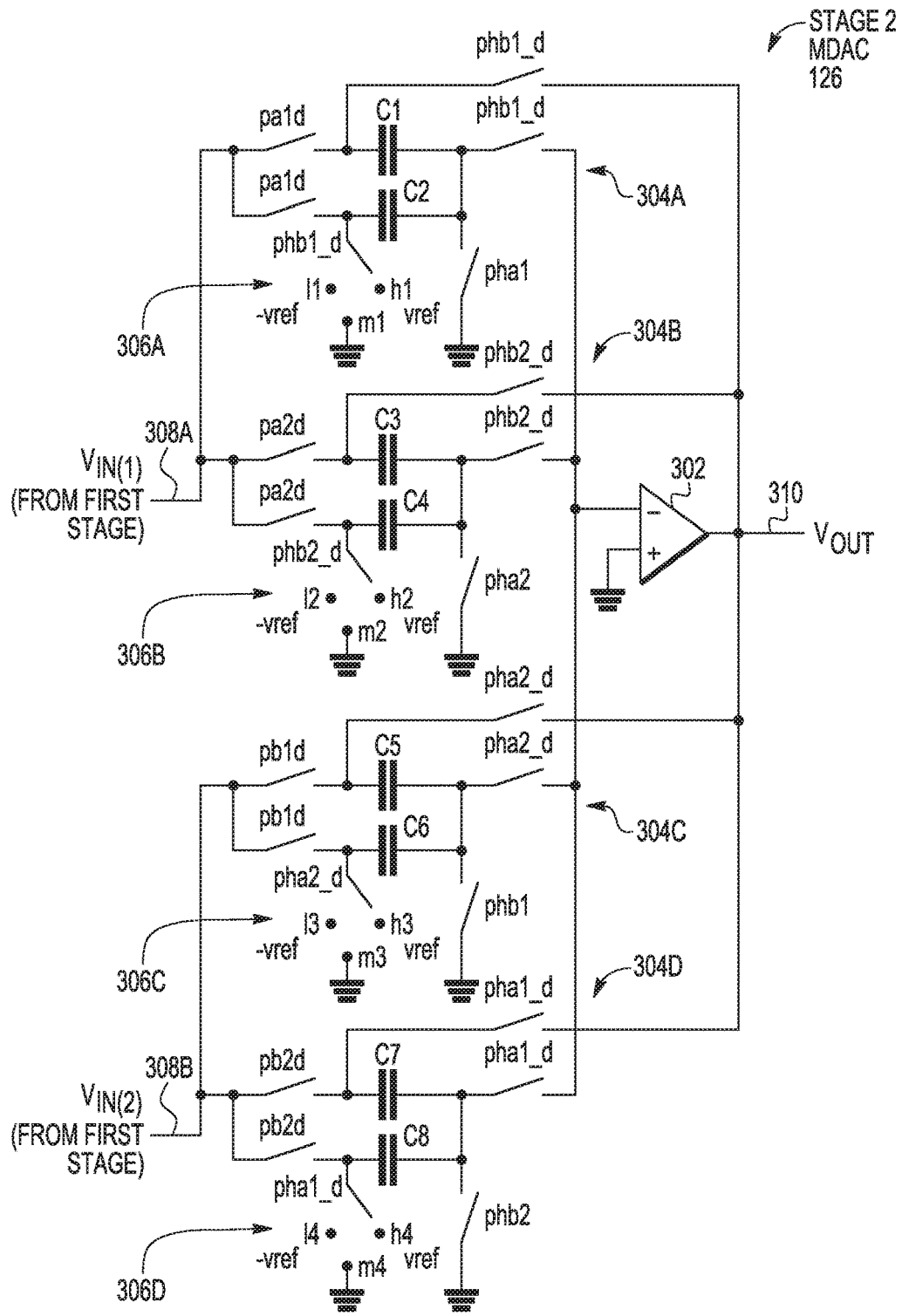
Figure 4:
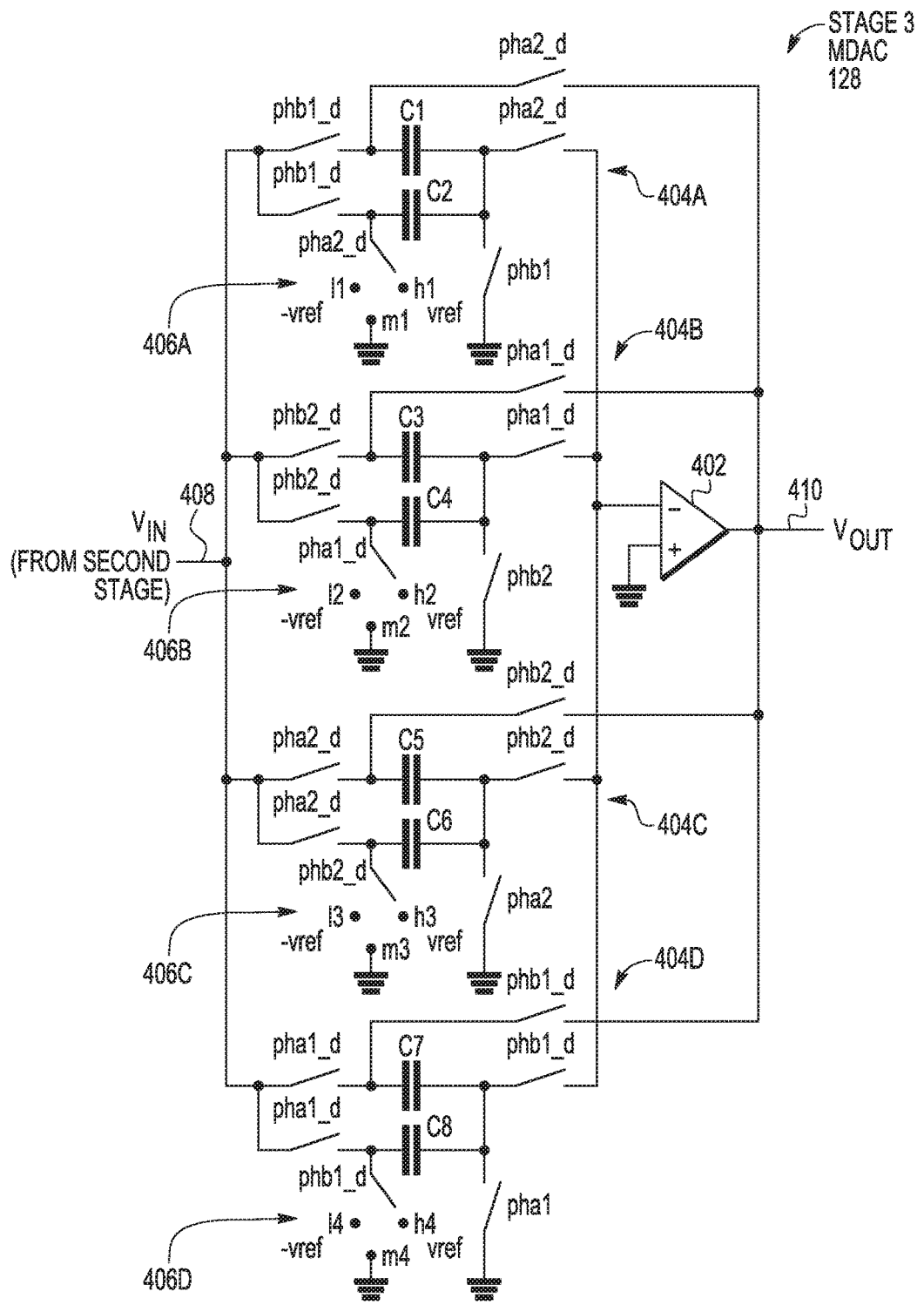

FIG. 2-4 illustrate circuit diagrams of example MDAC circuits that can be utilized in a pipelined ADC 100. Although the simplified circuit diagrams shown in FIG. 2-4 are depicted in a single-ended configuration in order to simplify the explanation, another embodiment would be designed to be differential throughout ADC 100 in order to realize improved dynamic range and power supply rejection. Each switch in FIG. 2-4 is labeled with its respective governing clock phase signal. The switches in FIG. 2-4 may also be referred to as a switching architecture. It is noted that when a clock phase signal or control signal is activated (e.g., logic high), the associated switch is closed to complete the path, and when a clock phase signal or control signal is cleared (e.g., logic low), the associated switch is opened to break the path. The clock phase signals are generated by a clock signal generation system, which is further discussed below in connection with FIG. 5.

First Stage—Circuitry

FIG. 2 illustrates a circuit diagram of an example pair of MDACs 124A and 124B that can be utilized in first stages 102A and 102B of ADC 100. MDACs 124A and 124B each implement a number of switched capacitor circuit paths 204 (or simply referred to as circuit paths), where each circuit path 204 is configured to sample a respective input node 208, and each circuit path 204 is associated with a sampling channel of ADC 100. In some embodiments, the input nodes may be each coupled to a respective one of four input channels, while in other embodiments, the input nodes may be tied to a single input channel.

First stage MDAC 124A receives clock phase signals pa1, pa2, pa1$d$, and pa2$d$, where pa1$d$ and pa2$d$ are delayed versions of clock phase signals pa1 and pa2. Similarly, first stage MDAC 124B receives clock phase signals pb1, pb2, pb1$d$, and pb2$d$, where pb1$d$ and pb2$d$ are delayed versions of clock phase signals pb1 and pb2. These clock phase signals may also be referred to as first stage clock phase signals. Clock phase signals pa1 and pa2 (and also their delayed versions pa1$d$ and pa2$d$) are non-overlapping with respect to one another, and clock phase signals pb1 and pb2 (and also their delayed versions pb1$d$ and pb2$d$) are non-overlapping with respect to one another. For example, the falling edge of each pa2 and pb2 clock pulse always respectively occurs before the rising edge of the next pa1 and pb1 clock pulse, and the falling edge of the pa1 and pb1 clock pulse always respectively occurs before the rising edge of the next pa2 and pb2 clock pulse. In other embodiments, all clock phase signals pa1, pa2, pb1, and pb2 (and their delayed versions) are mutually non-overlapping with respect to one another. Example waveforms of the clock phase signals generated for the first stage MDACs 124A and 124B are discussed below in connection with FIGS. 10A and 12A for single input channel embodiments, and FIGS. 10B and 12B for multiple input channel embodiments.

MDAC 124A includes a first circuit path 204A associated with a first sampling channel for a first input node 208A that receives an input voltage signal Vin(1). Circuit path 204A is coupled between input node 208A and an inverting input (−) of a first gain element 202A. A non-inverting input (+) of gain element 202A is coupled to ground. The first circuit path 204A includes a pair of parallel capacitors pb1 and C2, each having a first terminal coupled to node 208A via a respective pa2$d$ switch and a second terminal tied to one another. The first terminal of pb1 is further coupled to an output node 210A of gain element 202A via a pa1$d$ switch, and the second terminal of pb1 is further coupled to the inverting input (−) of gain element 202A via a pa1$d$ switch. The first terminal of C2 is further coupled to a reference voltage switch 206A that is enabled with pa1$d$ (where operation of switches 206A-D are discussed below), and the second terminal of C2 is further coupled to ground via a pa2 switch.

MDAC 124A also includes a second circuit path 204B associated with a second sampling channel for a second input node 208B that receives an input voltage signal Vin(2). Circuit path 204B is coupled between input node 208B and the inverting input (−) of gain element 202A. The second circuit path 204B includes parallel capacitors C3 and C4, each having a first terminal coupled to node 208B via a respective paid switch and a second terminal tied to one another. The first terminal of C3 is further coupled to output node 210A via a pa2$d$ switch, and the second terminal of C3 is further coupled to the inverting input (−) of gain element 202A via a pa2$d$ switch. The first terminal of C4 is further coupled to reference voltage switch 206B that is enabled with pa2$d$, and the second terminal of C4 is further coupled to ground via a pa1 switch.

MDAC 124B includes a third circuit path 204C associated with a third sampling channel for a third input node 208C that receives an input voltage signal Vin(3). Circuit path 204C is coupled between input node 208C and an inverting input (−) of a second gain element 202B. A non-inverting input (+) of gain element 202B is coupled to ground. The third circuit path 204C includes parallel capacitors C5 and C6, each having a first terminal coupled to node 208C via a respective pb2$d$ switch and a second terminal tied to one another. The first terminal of C5 is further coupled to an output node 210B of gain element 202B via a pb1$d$ switch, and the second terminal of C5 is further coupled to the inverting input (−) of gain element 202B via a pb1$d$ switch. The first terminal of C6 is further coupled to reference voltage switch 206C that is enabled with pb1$d$, and the second terminal of C6 is further coupled to ground via a pb2 switch.

MDAC 124B also includes a fourth circuit path 204D associated with a fourth sampling channel for a fourth input node 208D that receives an input voltage signal Vin(4). Circuit path 204D is coupled between input node 208D and the inverting input (−) of the second gain element 202B. The fourth circuit path 204D includes parallel capacitors C7 and C8, each having a first terminal coupled to node 208D via a respective pb1d switch and a second terminal tied to one another. The first terminal of C7 is further coupled to output node 210B via a pb2d switch, and the second terminal of C7 is further coupled to the inverting input (−) of the gain element 202B via a pb2d switch. The first terminal of C8 is further coupled to reference voltage switch 206D that is enabled with pb2d, and the second terminal of C8 is further coupled to ground via a pb1 switch.

Figure 14:
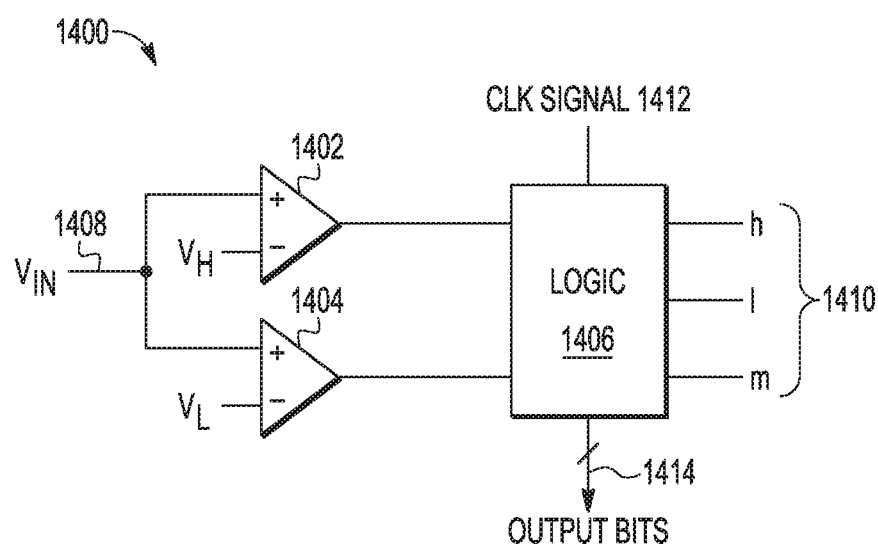
FIG. 14 illustrates a circuit diagram of an example sub-ADC circuit that can be utilized in a pipelined ADC, according to some embodiments.

An example sub-ADC circuit 1400 is illustrated in FIG. 14, which may be used to implement each of the four sub-ADCs 130A-D in first stages 102A and 102B, each of the four sub-ADCs 132A-D in second stage 104, and each of the four sub-ADCs 134A-D in third stage 106.

Each sampling channel in first stages 102A and 102B has an associated sub-ADC circuit 130A-D (which are shown in FIG. 17) that includes an input node 1408 (shown in FIG. 14) coupled to the channel's input node 208 (shown in FIG. 2). In other words, each sub-ADC circuit 130A-D receives a respective input voltage signal Vin(1)-(4) from input nodes 208A-D. Each sub-ADC circuit 130A-D includes a pair of comparators 1402 and 1404 (shown in FIG. 14) that are configured to compare the respective Vin with a high voltage threshold (VH) and a low voltage threshold (VL), such as during the associated channel's sampling phase when the channel's parallel capacitors are also coupled to the respective input node 208A-D (shown in FIG. 2). For example, the pair of comparators 1402 and 1404 may be operated using the non-delayed version of the associated clock phase signal of the channel used to connect the channel's parallel capacitors. Each sub-ADC circuit 130A-D also includes logic circuit 1406 (shown in FIG. 14) that is coupled to the outputs of comparators 1402 and 1404, where logic circuit 1406 is also coupled to receive a clock phase signal 1412 as an enable signal. When enabled, logic circuit 1406 generates a set of control signals 1410 based on the result of the comparisons for the associated channel. Each channel's sub-ADC circuit outputs a set of control signals 1410 to the channel's reference voltage switch 206A-D (shown in FIG. 2). Logic circuit 1406 is enabled to properly output the set of control signals 1410 during the associated channel's gain phase when the channel's parallel capacitors are coupled to the inverting input (−) of the respective gain element (e.g., gain element 202A for first and second channels, gain element 202B for third and fourth channels). Each reference voltage switch 206A-D is also enabled during the associated channel's gain phase, according to the reference voltage switch's labeled clock phase signal.

Each set of control signals 1410 controls the respective reference voltage switch 206A-D (shown in FIG. 2) to select one of three nodes: a first node (l or low node) that provides a first reference voltage, a second node (h or high node) that provides a second reference voltage, and a third node (m node) that provides ground. The voltage levels provided at each node may be different for each channel implemented in a given ADC stage, as well as different across ADC stages, as indicated by each reference voltage switch 206A-D (and 306A-D and 406A-D) having a different set of h, l, and m labels. The control signals 1410 (shown in FIG. 14) include three control signals h, l, and m, although a different number of control signals 1410 may be output to control the respective reference voltage switch 206 in other embodiments, which would also require additional comparators and logic. For each reference voltage switch 206A-D (shown in FIG. 2), if the m node is selected, then only the channel's parallel capacitors coupled to the inverting input (−) contribute to the output voltage at the output node of the respective gain element 202A-B. If the low node is selected, then the first reference voltage is subtracted from the output voltage that would otherwise be generated at the output node. If the high node is selected, then the second reference voltage is subtracted from the output voltage that would otherwise be generated at the output node. In one embodiment, the first reference voltage is a negative reference voltage (−Vref), the second reference voltage is a positive reference voltage (+Vref) having a same magnitude as the negative reference voltage, and each channel's pair of parallel capacitors have equal capacitance. In one example of such an embodiment using the first channel, the output voltage at output node 210A is twice the input voltage of input node 208A when the m node is selected, and the output voltage is otherwise modified by the addition or subtraction of Vref when either the low or high node is selected.

Also when enabled, logic circuit 1406 (shown in FIG. 14) of each sub-ADC circuit generates a digital output 1414 based on the result of the comparisons output by comparators 1402 and 1404. When implemented for the first stages 102A and 102B, digital output 1414 is an N-bit digital output that corresponds to the respective Vin for each channel (shown in FIG. 1).

First Stage—Clock Phase Signals

Two single input channel embodiments and two multiple input channel embodiments of ADC 100 are presented herein, although additional embodiments may be implemented.

Figure 6A:
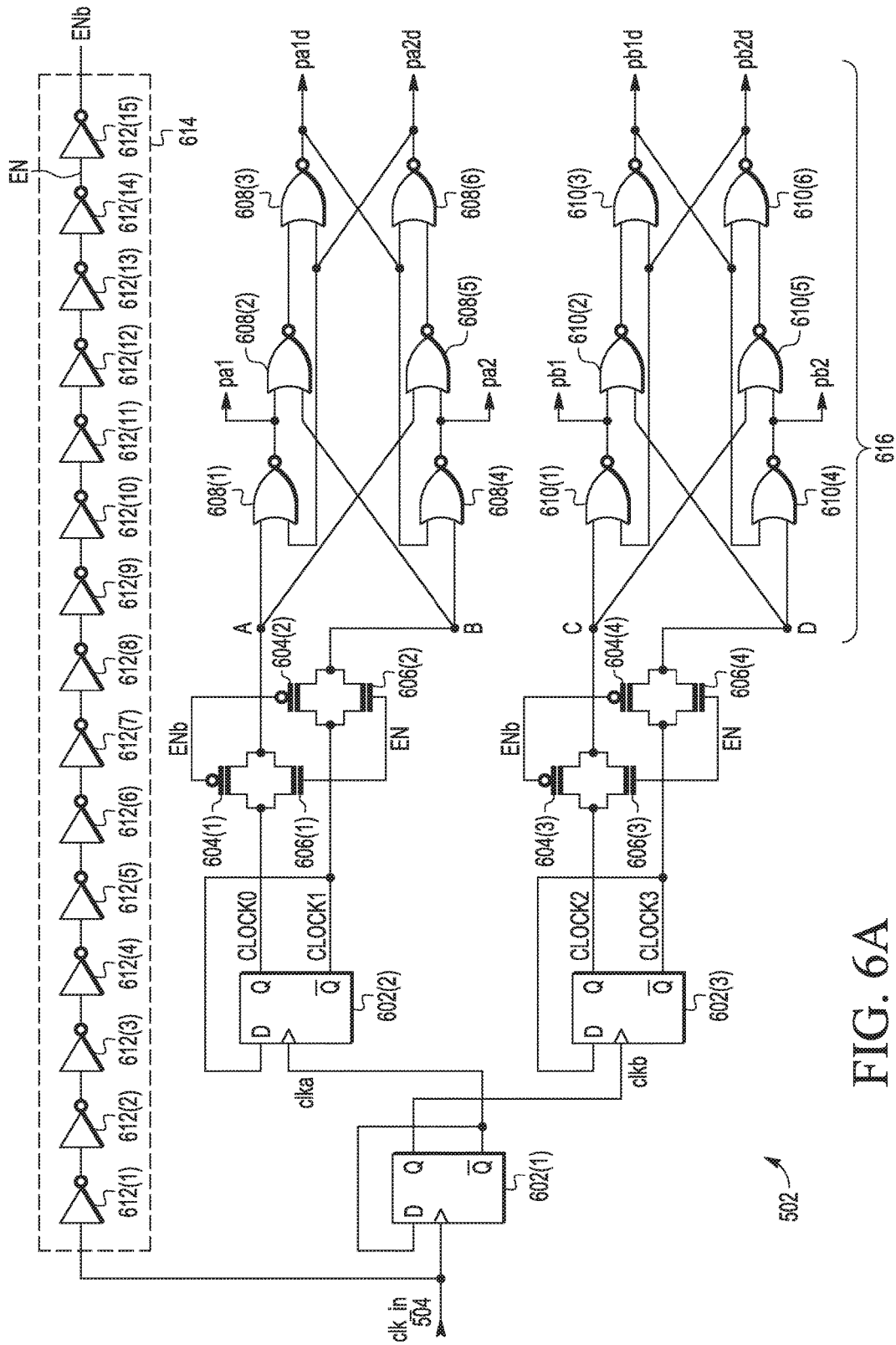
FIGS. 6A, 6B, 7A, 7B, 8A, and 8B illustrate circuit diagrams of example clock generator circuits that can be utilized in the clock generation system of FIG. 5, according to some embodiments.
Figure 9:
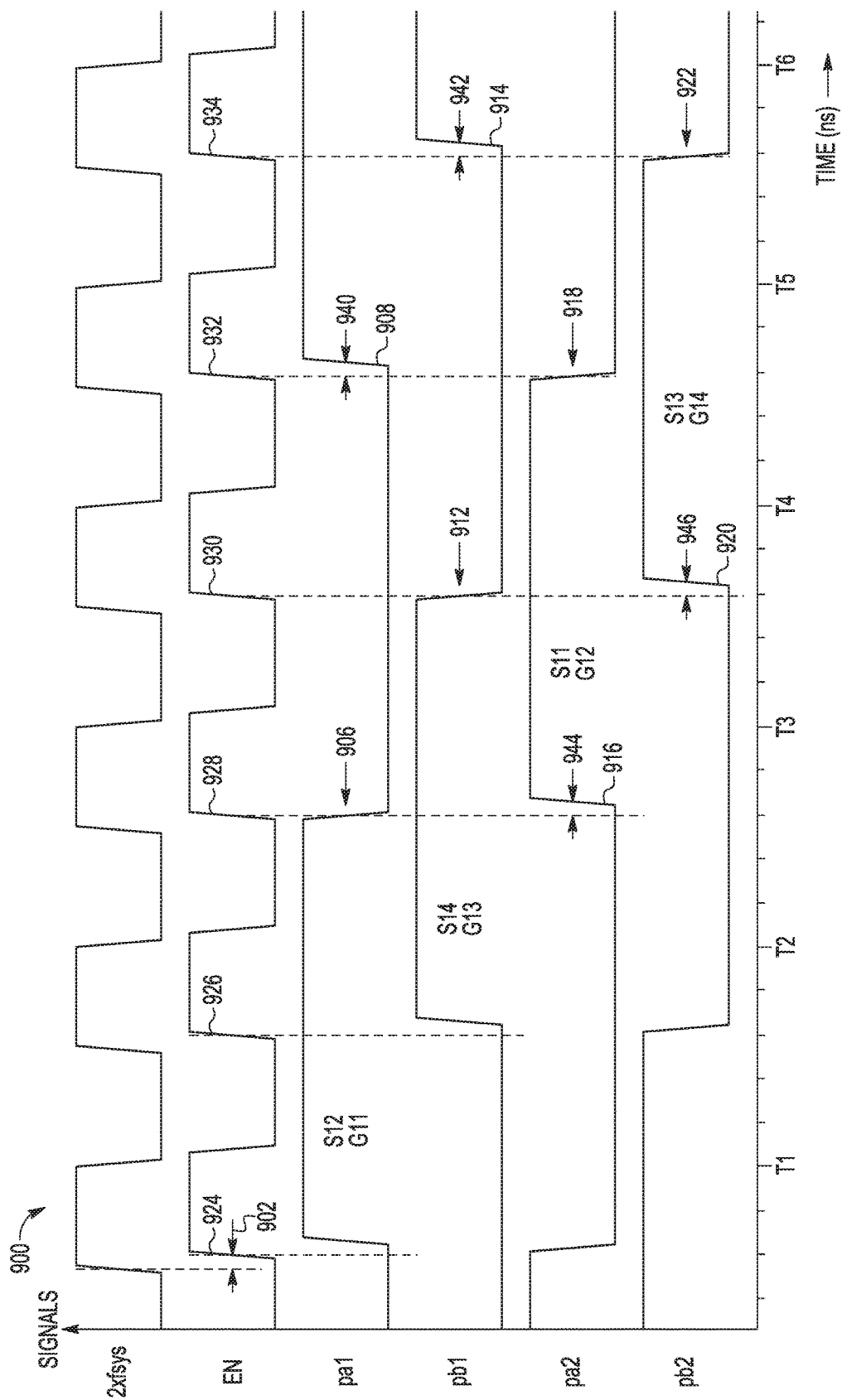
FIGS. 9, 10A, 10B, 11, 12A, 12B and 15-16 illustrate waveform diagrams depicting relative timing of example clock phase signals generated by clock generator system of FIG. 5, according to some embodiments.
Figure 10A:
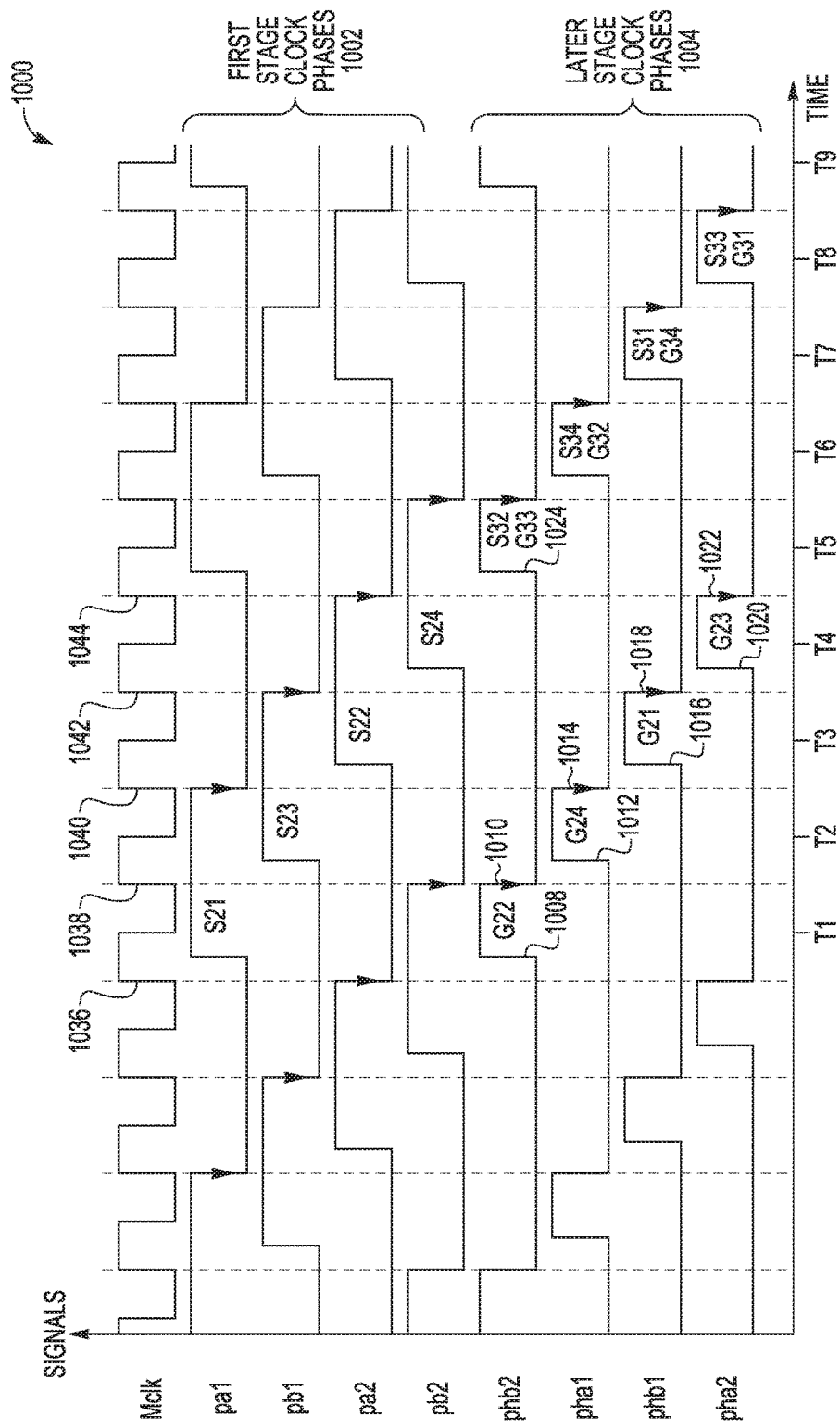

A) In one single input channel embodiment, the first stage utilizes two sets of non-overlapping clock phase signals as illustrated in FIG. 9 and at the top of FIG. 10A, which are generated by a circuit of FIG. 6A using 2×fsys as the input clock. FIG. 6A also generates a delayed version of 2×fsys to synchronize the clock phase signals. Such an embodiment also utilizes clock phase signals generated by a circuit of FIG. 7A for later stages using 2×fsys as the input clock.

Figure 7A:
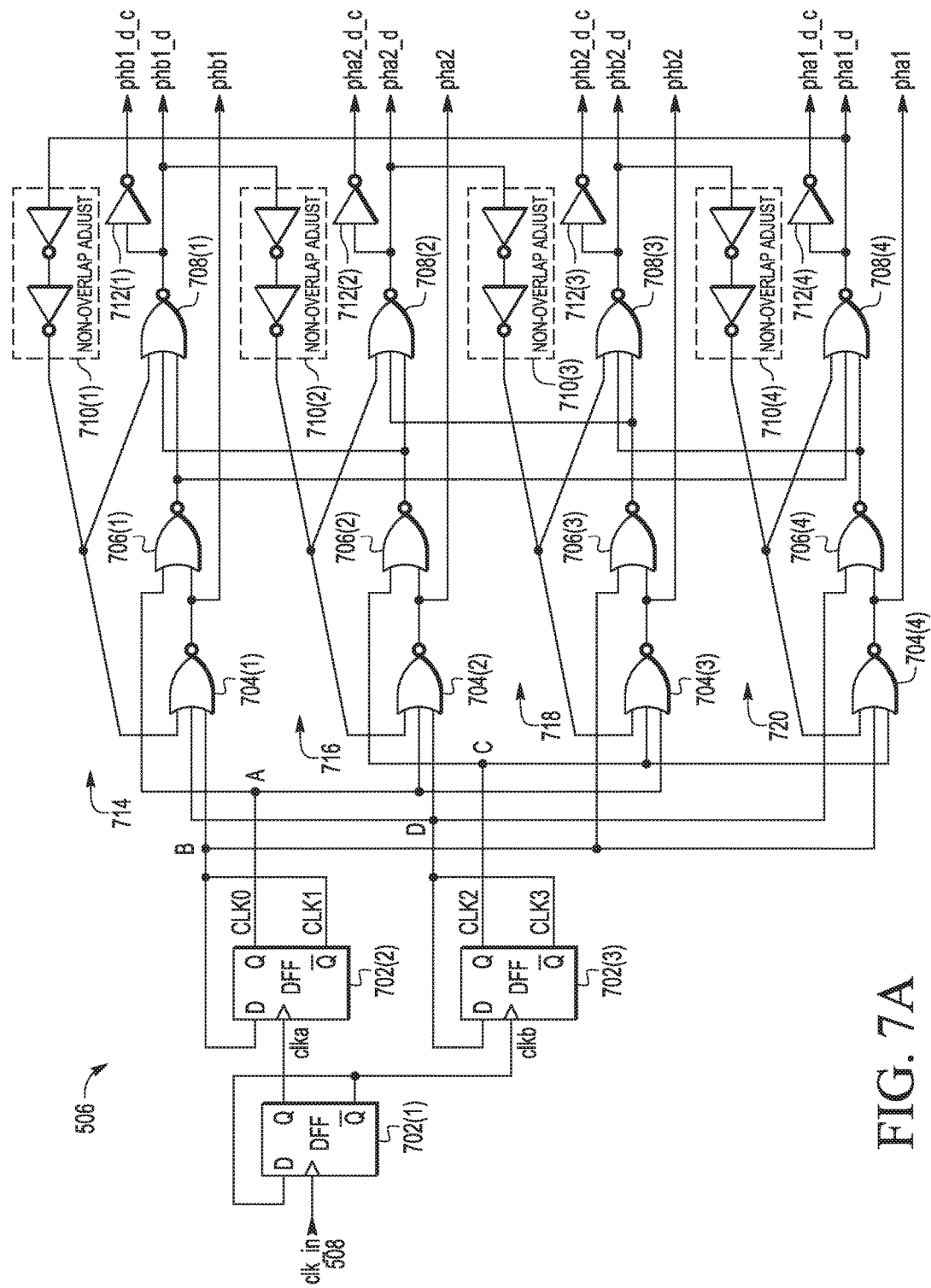
Figure 8A:
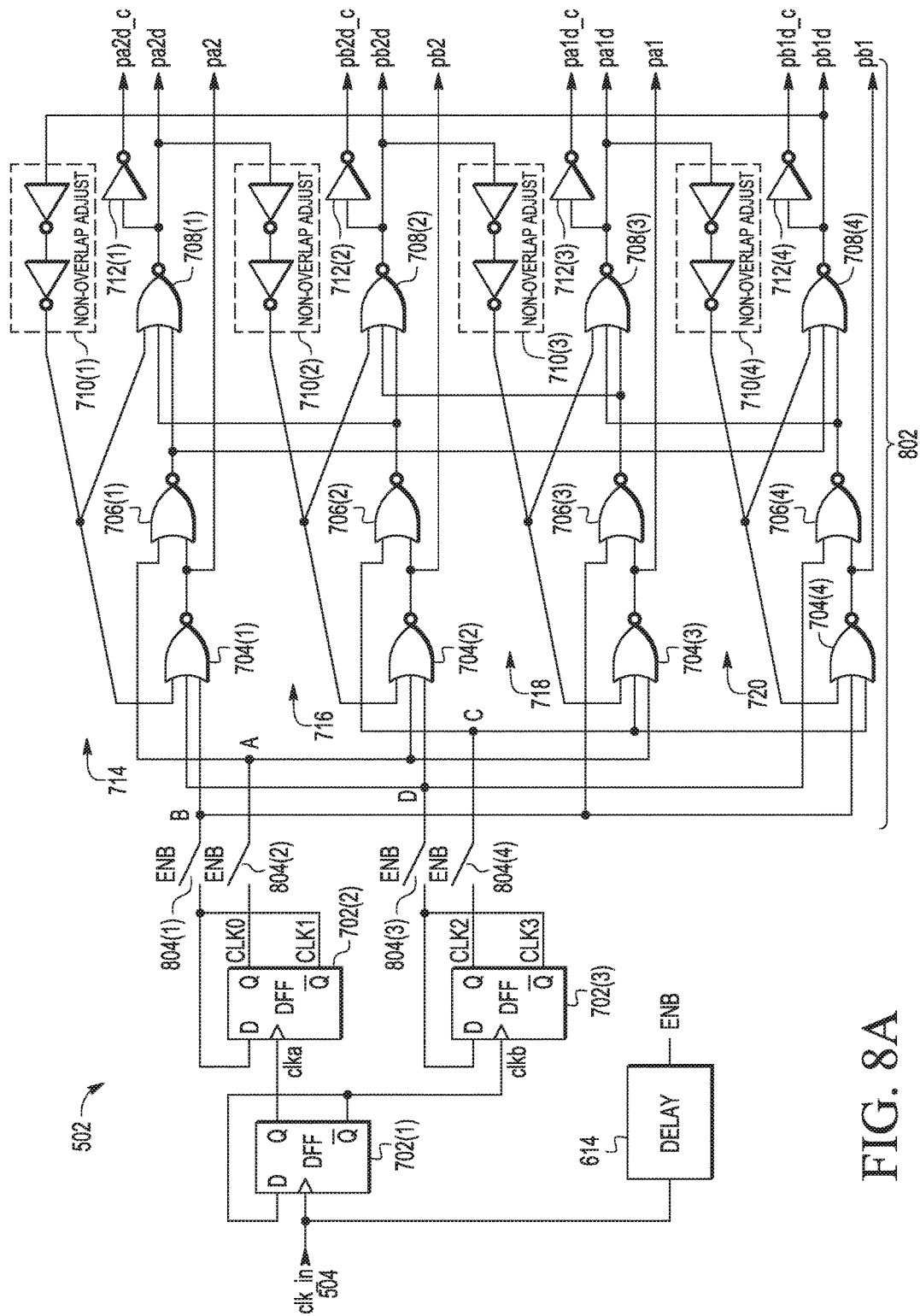
Figure 11:
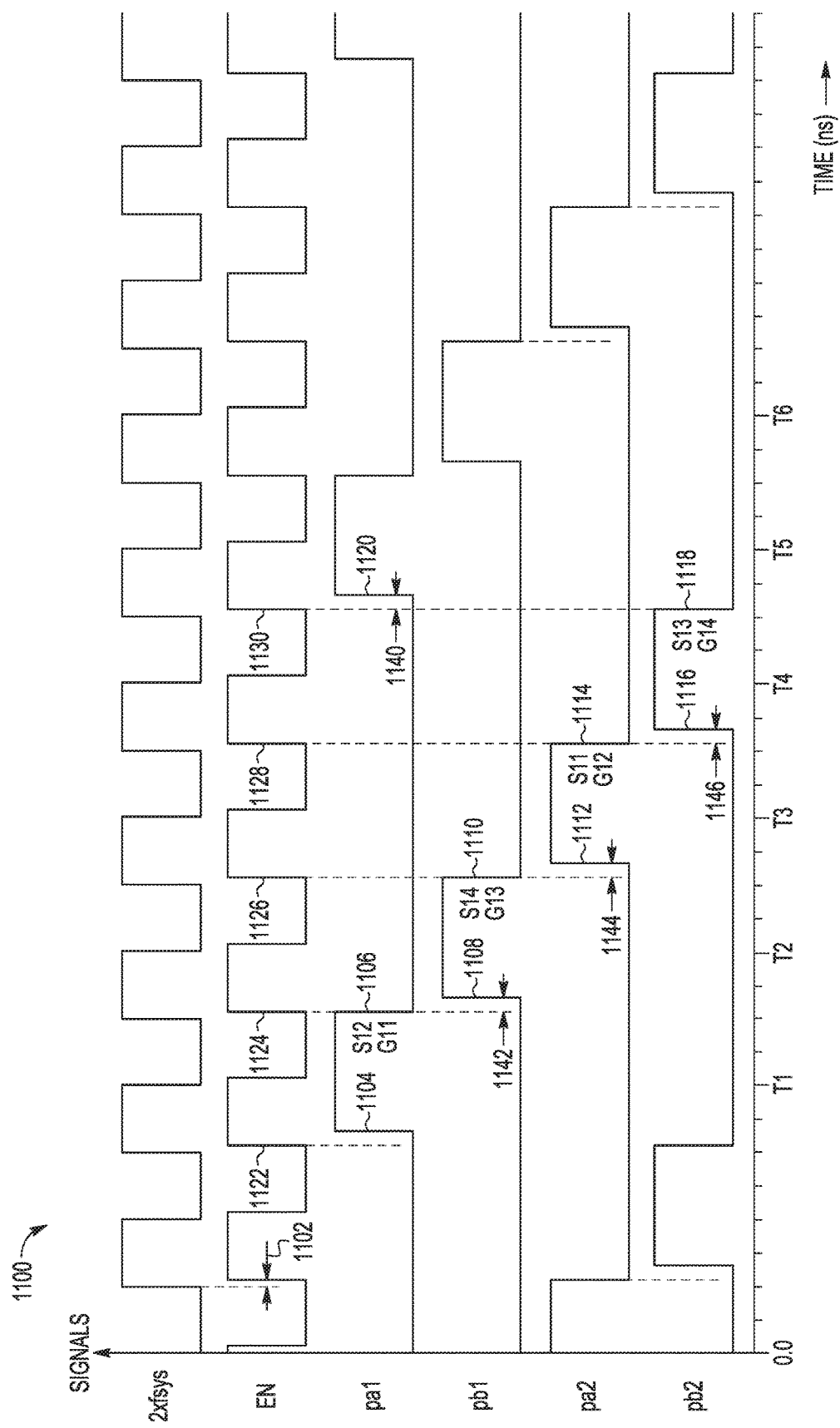
Figure 12A:
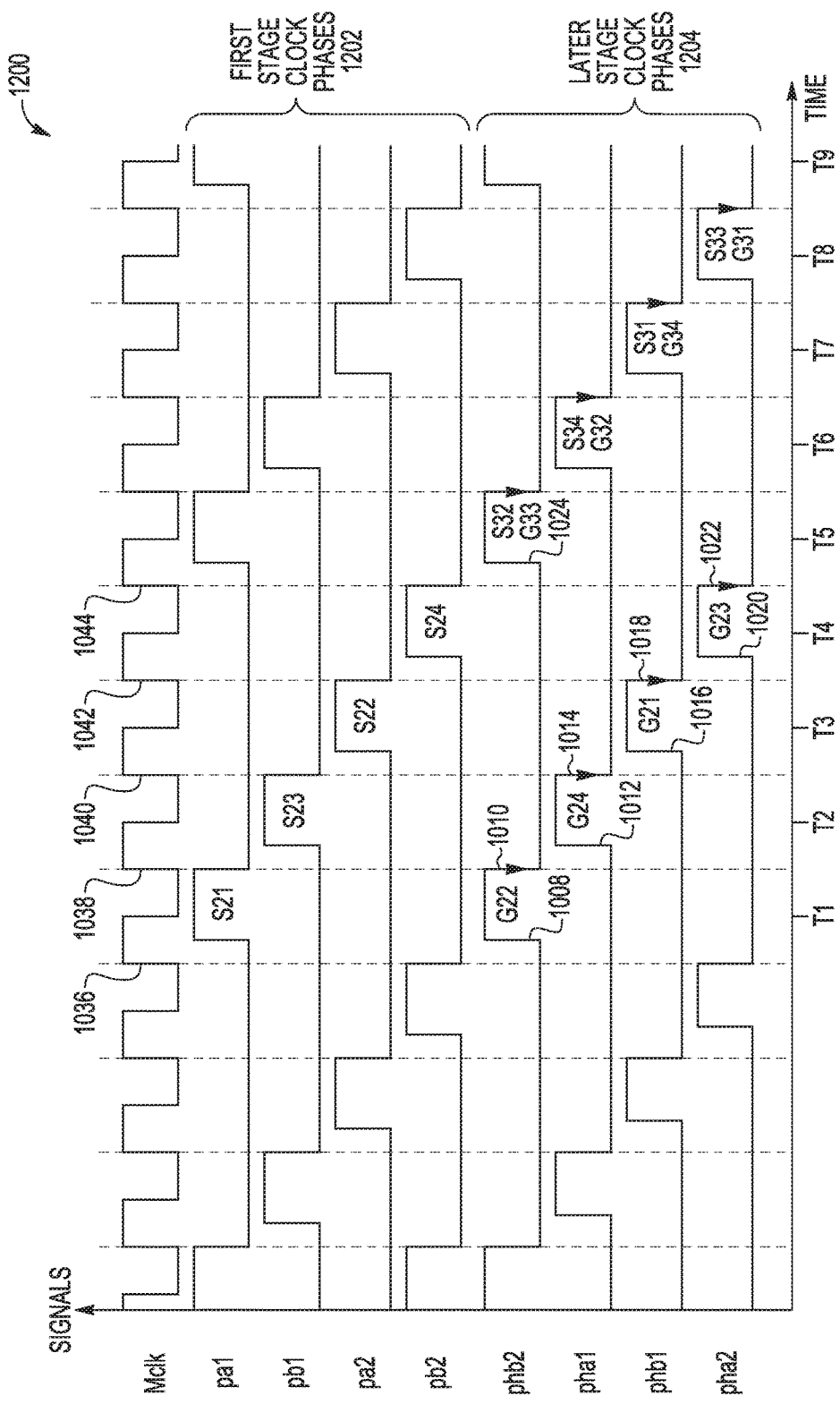

B) In another single input channel embodiment, the first stage utilizes a single set of non-overlapping clock phase signals as illustrated in FIG. 11 and at the top of FIG. 12A, which are generated by a circuit of FIG. 8A using 2×fsys as the input clock. FIG. 8A also generates a delayed version of 2×fsys to synchronize the clock phase signals. Such an embodiment also utilizes clock phase signals generated by a circuit of FIG. 7A for later stages using 2×fsys as the input clock.

Figure 6B:
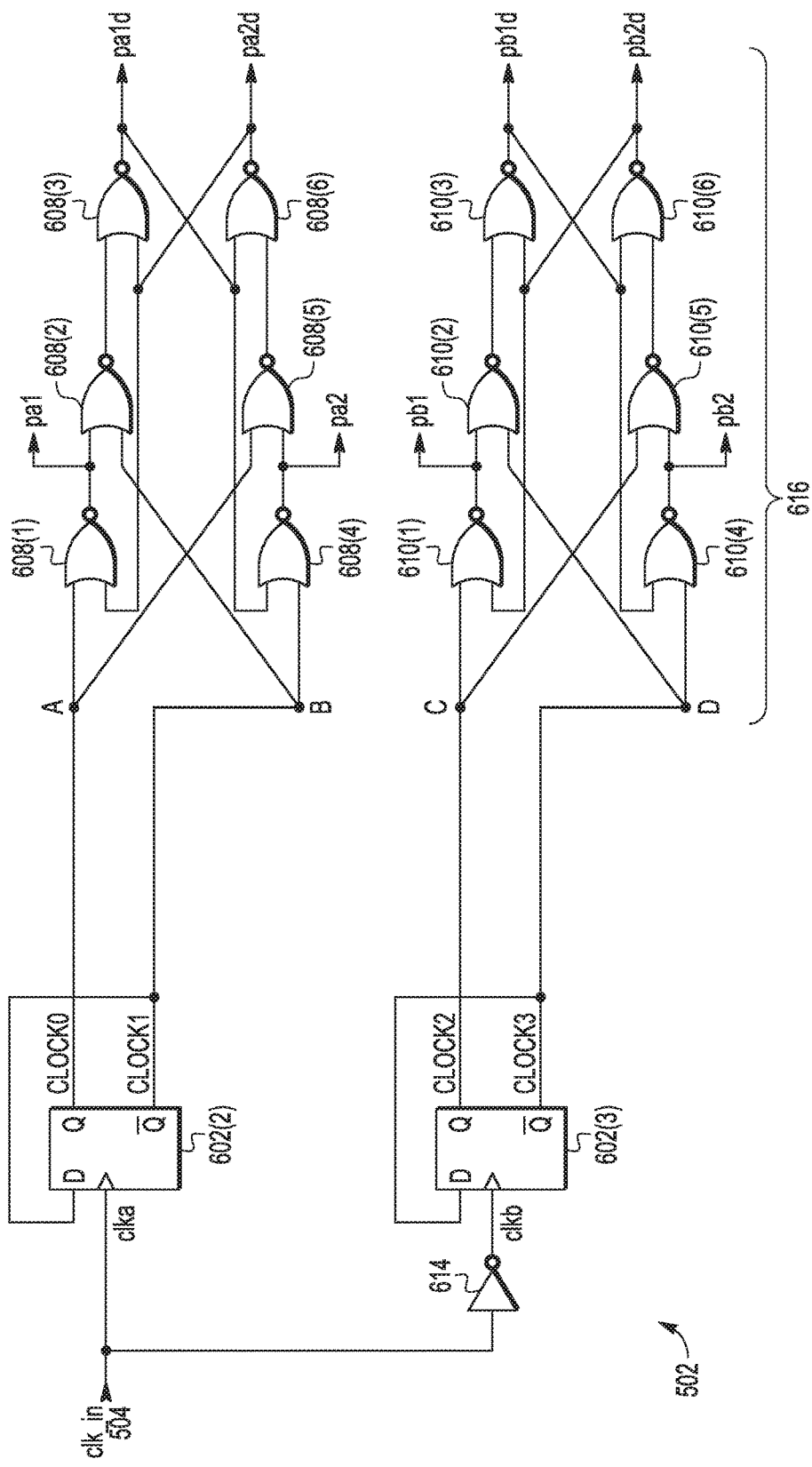
Figure 10B:
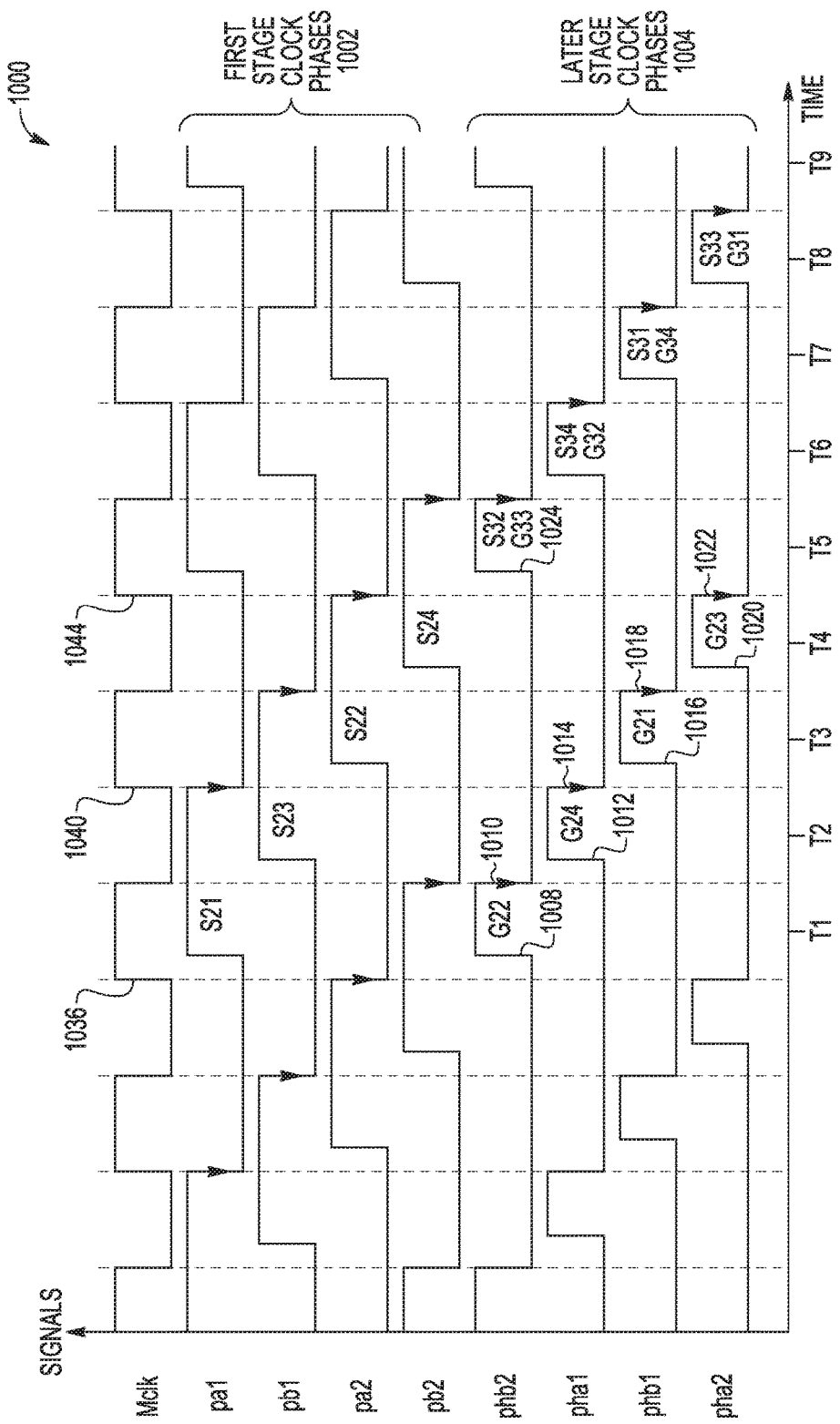

C) In one multiple input channel embodiment, the first stage utilizes two sets of non-overlapping clock phase signals as illustrated at the top of FIG. 10B, which are generated by a circuit of FIG. 6B using fsys as the input clock, without needing to generate a synchronization signal (although one may be generated in other embodiments). Such an embodiment also utilizes clock phase signals generated by a circuit of 7B for later stages using fsys as the input clock.

Figure 12B:
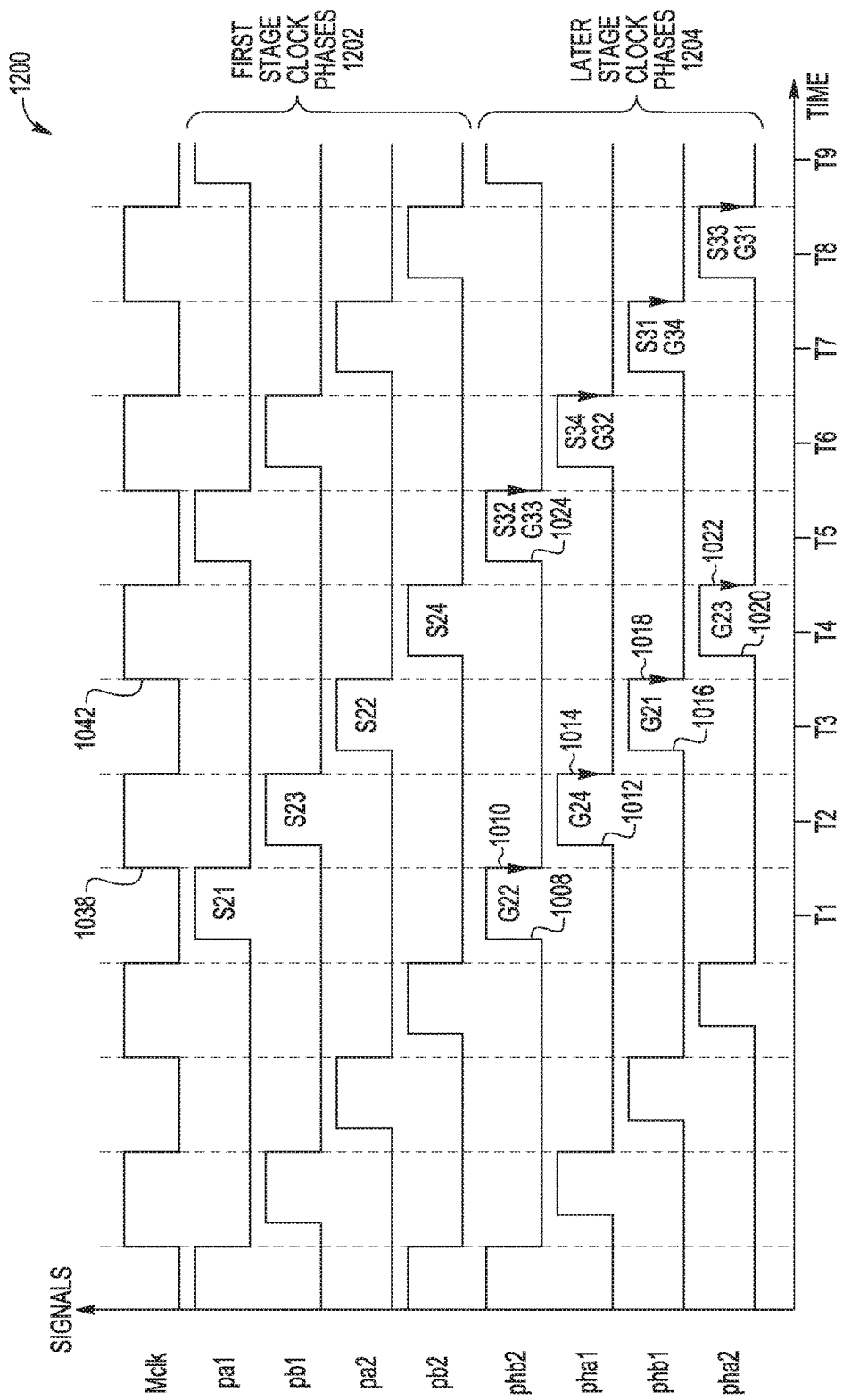

D) In another multiple input channel embodiment, the first stage utilizes a single set of non-overlapping clock phase signals as illustrated at the top of FIG. 12B, which are generated by a circuit of 8B using fsys as the input clock, without needing to generate a synchronization signal (although one may be generated in other embodiments). Such an embodiment also utilizes clock phase signals generated by a circuit of 7B for later stages using fsys as the input clock.

The operation of the first stage MDACs is described herein according to the single input channel embodiments of ADC 100 that utilize two sets of synchronized non-overlapping clock phase signals as illustrated in FIG. 9 and that utilize one set of synchronized non-overlapping clock phase signals as illustrated in FIG. 11. The first stage MDACs operate in a similar manner in the multiple input channel embodiments of ADC 100 that utilize two sets of non-synchronized non-overlapping clock phase signals (which have a timing relationship to one another that is analogous to that shown in FIG. 9, but for a different input clock, as shown at the top of FIG. 10B) and that utilize one set of non-synchronized non-overlapping clock phase signals (which have a timing relationship to one another that is analogous to that shown in FIG. 11, but for a different input clock, as shown at the top of FIG. 12B). Additional timing detail for two sets of (synchronized and non-synchronized) non-overlapping clock phase signals is discussed below in connection with FIG. 15, while additional timing detail for one set of (synchronized and non-synchronized) non-overlapping clock phase signals is discussed below in connection with FIG. 16.

As shown in FIG. 9, two sets of non-overlapping clock phase signals are provided: pa1 and pa2 (and pa1$d$ and pa2$d$) in one set and pb1 and pb2 (and pb1$d$ and pb2$d$) in another set. Clock phase signals pa1, pb1, pa2, and pb2 are generated based on an input clock signal, which (in the embodiment shown) is twice the system clock fsys (or 2×fsys). A delayed version of twice the system clock fsys (or 2×fsys), which is also referred to as an enable (EN) clock signal, is used to synchronize the clock phase signals by enabling pass gates or switches that control the output timing of a respective clock signal, as further discussed below in connection with FIG. 6A. A rising edge of an EN clock pulse occurs after a delay 902, as compared with a corresponding rising edge of a 2×fsys clock pulse.

Each falling edge 906, 912, 918, and 922 of the clock phase signals occurs after a corresponding EN rising edge 928, 930, 932, and 934. Each rising edge of the next clock phase signal always occurs after the corresponding falling edge by a respective non-overlap delay for each set of non-overlapping clock phase signals. For example, falling edge 906 of pa1 always occurs before next rising edge 916 of pa2, where the edges are separated by non-overlap delay 944, and falling edge 918 of pa2 always occurs before next rising edge 908 of pa1, separated by non-overlap delay 940. Similarly, falling edge 912 of pb1 always occurs before next rising edge 920 of pb2, separated by non-overlap delay 946, and falling edge 922 of pb2 always occurs before next rising edge 914 of pb1, separated by non-overlap delay 942. In this manner, each clock pulse of the clock phase signals spans the length of substantially two EN clock cycles (at 2×fsys), or the equivalent of substantially one clock cycle of the full system clock fsys. It is noted that in a multiple input channel embodiment with two sets of non-overlapping clock phase signals, each clock pulse of the clock phase signals spans the length of substantially one clock cycle of the full system clock fsys, as shown at the top of FIG. 10B.

It is noted that signals pa1, pa2, pb1, and pb2 (and also their delayed versions pa1$d$, pa2$d$, pb1$d$, and pb2$d$) are staggered in time with respect to one another. In the embodiment shown, the rising edges of the clock phase signals occur in repeating sequential order of pa1, pb1, pa2, and pb2 (starting arbitrarily with pa1), where each rising edge is separated from a next rising edge by the equivalent of one EN clock cycle. It is also noted that the signals illustrated in FIG. 9 control each MDAC 124A and 124B to sample the single input channel at a rate of 2×fsys, while being operated at half the system clock rate (or fsys/2).

FIG. 11 illustrates a single set of mutually non-overlapping clock phase signals: pa1, pa2, pb1, and pb2 (and pa1$d$, pa2$d$, pb1$d$, and pb2$d$). Clock phase signals pa1, pb1, pa2, and pb2 are generated based on an input clock signal, which (in the embodiment shown) is twice the full system clock fsys, or 2×fsys. A delayed version of 2×fsys, also referred to as the enable (EN) clock signal, is used to synchronize the clock phase signals, as further discussed below in connection with FIG. 8A. A rising edge of an EN clock pulse occurs after a delay 1102, as compared with a corresponding rising edge of a 2×fsys clock pulse.

Each falling edge 1106, 1110, 1114, and 1118 of the clock phase signals occurs after a corresponding EN rising edge 1124, 1126, 1128, and 1130. Each rising edge of the next phase clock signal always occurs after the corresponding falling edge by a respective non-overlap delay for the set of mutually non-overlapping clock phase signals. For example, falling edge 1106 of pa1 always occurs before the next rising edge 1108 of pb1, separated by non-overlap delay 1142; the falling edge 1110 of pb1 always occurs before the next rising edge 1112 of pa2, separated by non-overlap delay 1144; the falling edge 1114 of pa2 always occurs before the next rising edge 1116 of pb2, separated by non-overlap delay 1146; and the falling edge 1118 of pb2 always occurs before the next rising edge 1120 of pa1, separated by non-overlap delay 1140. In this manner, each clock pulse of the clock phase signals spans the length of substantially one EN clock cycle, or the equivalent of substantially one half clock cycle of the full system clock fsys. It is noted that in a multiple input channel embodiment with one set of non-overlapping clock phase signals, each clock pulse of the clock phase signals spans the length of substantially one half clock cycle of the full system clock fsys, as shown at the top of FIG. 12B.

It is noted that signals pa1, pa2, pb1, and pb2 (and also their delayed versions pa1$d$, pa2$d$, pb1$d$, pb2$d$) are also staggered in time with respect to one another. In the embodiment shown, the rising edges of the clock phase signals occur in repeating sequential order of pa1, pb1, pa2, and pb2 (starting arbitrarily with pa1), where each rising edge is separated from a next rising edge by the equivalent of one EN clock cycle. It is also noted that the signals illustrated in FIG. 11 control each MDAC 124A and 124B to sample the single input channel at a rate of 2×fsys, while being operated at half the system clock (fsys/2).

First Stage—Operation

In both single and multiple input channel embodiments, MDACs 124A and 124B each alternately sample the voltages at respective input nodes 208A-B and 208C-D in a time-interleaved manner, according to the staggered clock phase signals. MDACs 124A and 124B also each alternately generate an output voltage on respective output nodes 210A and 210B in a time-interleaved manner, according to the staggered clock phase signals. It is noted that a set of times T1-T6 are indicated in both FIGS. 9 and 11 and are used to discuss the operation of sub-ADCs 130A-D and MDACs 124A and 124B of first stages 102A and 102B of FIG. 2, since the waveforms of non-delayed counterparts pa1, pa2, pb1, and pb2 are substantially equivalent to the waveforms of the delayed signals pa1$d$, pa2$d$, pb1$d$, and pb2$d$. Additionally, first stage sampling phases "S1" and gain phases "G1" are illustrated for each channel (e.g., the first digit corresponds to the stage and the second digit corresponds to the channel, as S11, S12, S13, and S14, or G11, G12, G13, and G14). Each of the four channels respectively corresponds to inputs 208A, 208B, 208C, and 208D, as well as to circuit paths 204A, 204B, 204C, and 204D.

Beginning (arbitrarily) during first time T1, the pa1*d* signal is activated and pa2*d* signal is cleared. Capacitors C1 and C2 are coupled to the inverting input (−) of gain element 202A ("G11"). Capacitors C3 and C4 are coupled to input node 208B and charge to sample the input voltage applied to input node 208B ("S12"). Also during time T1, the reference voltage switch 206A is enabled and receives a set of control signals 1410 (shown in FIG. 14) from the sub-ADC circuit 130A for the first channel (shown in FIG. 17), which select one of the high node, the low node, and the m node of switch 206A (shown in FIG. 2). The node selection depends upon the comparisons of the input voltage at input node 208A that was sampled by pb1 and C2, relative to VH and VL (shown in FIG. 14). The result of the comparisons also determines the N-bit values for digital output 110A for the first channel (shown in FIG. 17). Gain element 202A generates an output voltage at output node 210A for the first channel, based on the voltages provided by pb1 and C2 and switch 206A.

During a subsequent time T3, the pa2*d* signal is activated and pa1*d* signal is cleared. Capacitors pb1 and C2 are coupled to input node 208A and charge to sample the input voltage applied to input node 208A ("S11"). Capacitors C3 and C4 are coupled to the inverting input (−) of gain element 202A ("G12"). Also during time T3, the reference voltage switch 206B is enabled and receives a set of control signals 1410 (shown in FIG. 14) from the sub-ADC circuit 130B for the second channel (shown in FIG. 17), which select one of the three nodes of switch 206B (shown in FIG. 2), depending upon the comparisons of the voltage at node 208B that was sampled by C3 and C4, relative to VH and VL (shown in FIG. 14). The result of the comparisons also determines the N-bit values for digital output 110B for the second channel (shown in FIG. 17). Gain element 202A generates an output voltage at output node 210A for the second channel, based on the voltages provided by C3 and C4 and switch 206B.

During a subsequent time T5, another iteration of the procedure described above occurs (e.g., equivalent to the procedure described beginning at time T1), where the procedure continues to repeat in periodic fashion. In this manner, gain element 202A generates a sequence of output voltages (also referred to as residual voltages) that correspond to (or derived from) samples obtained from the first and second input nodes 208A and 208B in an alternating and time-interleaved manner.

First stage 102B is operated in a similar manner as first stage 102A. Beginning (arbitrarily) at a time T2 (which occurs after time T1 and before time T3), the pb1*d* signal is activated and the pb2*d* signal is cleared. Capacitors C5 and C6 are coupled to the inverting input (−) of gain element 202B ("G13"). Capacitors C7 and C8 are coupled to input node 208D and charge to sample the input voltage applied to input node 208D ("S14"). Also during time T2, the reference voltage switch 206C is enabled and receives a set of control signals 1410 (shown in FIG. 14) from the sub-ADC circuit 130C for the third channel (shown in FIG. 17), which select one of the three nodes of switch 206C (shown in FIG. 2), depending upon the comparisons of the voltage at node 208C that was sampled by C5 and C6, relative to VH and VL (shown in FIG. 14). The result of the comparisons also determines the N-bit values for digital output 110C for the third channel (shown in FIG. 17). Gain element 202B generates an output voltage at output node 210B for the third channel, based on the voltages provided by C5 and C6 and switch 206C.

During a subsequent time T4 (which occurs after time T3 and before time T5), the pb2*d* signal is activated and the pb1*d* signal is cleared. Capacitors C5 and C6 are coupled to input node 208C and charge to sample the input voltage applied to input node 208C ("S13"). Capacitors C7 and C8 are coupled to the inverting input (−) of gain element 202B ("G14"). Also during time T4, the reference voltage switch 206D is enabled and receives a set of control signals 1410 (shown in FIG. 14) from the sub-ADC circuit 130D for the fourth channel (shown in FIG. 17), which select one of the three nodes of switch 206D (shown in FIG. 2), depending upon comparisons of the voltage at node 208D that was sampled by C7 and C8, relative to VH and VL (shown in FIG. 14). The result of the comparisons also determines the N-bit values for digital output 110D for the fourth channel (shown in FIG. 17). Gain element 202B generates an output voltage at output node 210B for the fourth channel, based on the voltages provided by C7 and C8 and switch 206D.

During a subsequent time T6 (which occurs after time T5), another iteration of the procedure described above occurs (e.g., equivalent to the procedure described beginning at time T2), where the procedure continues to repeat in periodic fashion. In this manner, gain element 202B generates a sequence of output voltages (or residual voltages) of the third and fourth channels that correspond to (or are derived from) samples obtained from the third and fourth input nodes 208C and 208D in an alternating and time-interleaved manner. It is also noted that the output voltages of the third and fourth channels are staggered with respect to the output voltages of the first and second channels, due to the staggered nature of the clock phase signals.

Second Stage—Circuitry

FIG. 3 illustrates a circuit diagram of an example MDAC 126 that can be utilized in second stage 104 of ADC 100. Second stage MDAC 126 implements a number of switched capacitor circuit paths 304 (also simply referred to as circuit paths), where each circuit path 304 is configured to sample a respective input node 308A-B, and each circuit path 304 is associated with a sampling channel of ADC 100. Input node 308A is coupled to output 210A of first stage MDAC 124A, and input node 308B is coupled to output 210B of first stage MDAC 124B. Node 308A receives the time-interleaved output voltages of the first and second channels from MDAC 124A, and a node 308B receives the time-interleaved output voltages of the third and fourth channels from MDAC 124B.

MDAC 126 receives first stage clock phase signals paid, pa2*d*, pb1*d*, and pb2*d*. MDAC 126 also receives signals pha1, pha2, phb1, phb2, pha1_*d*, pha2_*d*, phb1_*d*, and phb2_*d*, which are referred to as later stage clock phase signals. Clock phase signals pha1_*d* and pha2_*d* are delayed versions of clock phase signals pha1 and pha2, and signals phb1_*d* and phb2_*d* are delayed versions of clock phase signals phb1 and phb2. Signals pha1, pha2, phb1, and phb2 (and their delayed versions) are a single set of non-overlapping clock phase signals with respect to one another. Generation of pha1, phb1, pha2, and phb2 signals and their delayed versions are discussed below in connection with FIGS. 7A and 7B. Example waveforms of the clock phase signals generated for the second stage 104 are discussed below in connection with FIGS. 10A and 12A for single input channel embodiments, and FIGS. 10B and 12B for multiple input channel embodiments.

MDAC 126 includes a first circuit path 304A associated with a first sampling channel. Circuit path 304A is coupled between input node 308A and an inverting input (−) of a gain element 302. A non-inverting input (+) of gain element 302 is coupled to ground. The first circuit path 304A includes a pair of parallel capacitors C1 and C2, each having a first terminal coupled to node 308A via a respective paid switch and a second terminal tied to one another. The first terminal of C1 is further coupled to an output node 310 of gain element 302 via a phb1_d switch, and the second terminal of C1 is further coupled to the inverting input (−) of gain element 302 via a phb1_d switch. The first terminal of C2 is further coupled to a reference voltage switch 306A that is enabled with phb1_d (where operation of switches 306A-D are discussed below), and the second terminal of C2 is further coupled to ground via a pha1 switch.

MDAC 126 also includes a second circuit path 304B associated with a second sampling channel. Circuit path 304B is also coupled between input node 308A and the inverting input (−) of gain element 302. The second circuit path 304B includes parallel capacitors C3 and C4, each having a first terminal coupled to node 308A via a respective pa2d switch and a second terminal tied to one another. The first terminal of C3 is further coupled to output node 310 via a phb2_d switch, and the second terminal of C3 is further coupled to the inverting input (−) of gain element 302 via a phb2_d switch. The first terminal of C4 is further coupled to a reference voltage switch 306B that is enabled with phb2_d, and the second terminal of C2 is further coupled to ground via a pha2 switch.

MDAC 126 also includes a third circuit path 304C associated with a third sampling channel. Circuit path 304C is coupled between input node 308B and the inverting input (−) of gain element 302. The third circuit path 304C includes parallel capacitors C5 and C6, each having a first terminal coupled to node 308B via a respective pb1d switch and a second terminal tied to one another. The first terminal of C5 is further coupled to output node 310 via a pha2_d switch, and the second terminal of C5 is further coupled to the inverting input (−) of gain element 302 via a pha2_d switch. The first terminal of C6 is further coupled to a reference voltage switch 306C that is enabled with pha2_d, and the second terminal of C6 is further coupled to ground via a phb1 switch.

MDAC 126 also includes a fourth circuit path 304D associated with a fourth sampling channel. Circuit path 304D is coupled between input node 308B and the inverting input (−) of gain element 302. The fourth circuit path 304D includes parallel capacitors C7 and C8, each having a first terminal coupled to node 308B via a respective pb2d switch and a second terminal tied to one another. The first terminal of C7 is further coupled to output node via a pha1_d switch, and the second terminal of C7 is further coupled to the inverting input (−) of gain element 302 via a pha1_d switch. The first terminal of C8 is further coupled to a reference voltage switch 306D that is enabled with pha1_d, and the second terminal of C8 is further coupled to ground via a phb2 switch.

Node 308A is coupled to a sub-ADC 132A and 132B, and node 308B is coupled to a sub-ADC 132C and 132D (shown in FIG. 17). Each sub-ADC 132A-D may be implemented by an embodiment of sub-ADC circuit 1400 that includes a pair of comparators 1402 and 1404 and a logic circuit 1406 (shown in FIG. 14). Input 1408 of sub-ADC 132A is configured to receive the time-interleaved output voltages of the first sampling channel and input 1408 of sub-ADC 132B is configured to receive the time-interleaved output voltages of the second sampling channel, which are alternately available at Vin(1) output by MDAC 124A of first stage 102A (shown in FIG. 3). Input 1408 of sub-ADC 132C receives the time-interleaved output voltages of the third sampling channel, and input 1408 of sub-ADC 132D receives the time-interleaved output voltages of the fourth sampling channel, which are alternately available at Vin(2) output by MDAC 124B of first stage 102B (shown in FIG. 3). Accordingly, each sub-ADC 132A-D is respectively associated with one of the four sampling channels.

The sub-ADCs 132A-D operate in a similar manner as the sub-ADCs 130A-D described above. Each logic circuit receives a respective clock phase signal 1412 as an enable signal (shown in FIG. 14). When respectively enabled, each logic circuit 1406 of sub-ADCs 132A-D is configured to output a respective set of control signals 1410 for a respective one of the four sampling channels, based on comparisons of the respective Vin with VH and VL during the associated channel's sampling phase. Each set of control signals 1410 is output to the associated channel's reference voltage switch 306A-D (shown in FIG. 3) during the associated channel's gain phase. Each reference voltage switch 306A-D is also enabled during the channel's gain phase, according to the reference voltage switch's labeled clock phase signal. When enabled, each logic circuit also generates a digital output 1414 that corresponds to the respective Vin for the respective sampling channel. When implemented for the second stage 104, the digital output 1414 is an M-bit digital output (shown in FIG. 1).

Second Stage—Clock Phase Signals

The operation of the second stage MDAC 126 is described herein according to the single input channel embodiments of ADC 100 that utilize two sets of synchronized non-overlapping first stage clock phase signals as illustrated in FIG. 10A, and that utilize a single set of synchronized non-overlapping first stage clock phase signals as illustrated in FIG. 12A. The second stage MDAC 126 operates in a similar manner in the multiple input channel embodiments of ADC 100 that utilize two sets of non-synchronized non-overlapping first stage clock phase signals as illustrated in FIG. 10B (which have a timing relationship to one another that is analogous to that shown in FIG. 10A, but for a different input clock), and that utilize a single set of non-synchronized non-overlapping first stage clock phase signals as illustrated in FIG. 12B (which have a timing relationship to one another that is analogous to that shown in FIG. 12A, but for a different input clock). Additional timing detail for two sets of (synchronized and non-synchronized) non-overlapping clock phase signals is discussed below in connection with FIG. 15, while additional timing detail for one set of (synchronized and non-synchronized) non-overlapping clock phase signals is discussed below in connection with FIG. 16.

The top portion of FIG. 10A shows the clock phase signals pa1, pa2, pb1, and pb2 (labeled as first stage clock phase signals 1002) that have the same timing relationships as those shown in FIG. 9, which illustrates two sets of non-overlapping clock phase signals generated by a circuit like that shown in FIG. 6A. The first stage clock phase signals 1002 are generated based on an input clock or master clock (Mclk), which (in the embodiment shown) is twice the system clock fsys (or 2×fsys). A delayed version of the Mclk is used to synchronize the first stage clock phase signals 1001, in a similar manner as discussed in connection with FIG. 9. The second stage MDAC 126 utilizes the delayed versions of pa1, pa2, pb1, and pb2. It is noted that the waveforms of non-delayed counterparts pa1, pa2, pb1, and pb2 are shown in FIGS. 10A, 10B, 12A, and 12B for simplicity's sake since they are substantially equivalent to the waveforms of the delayed signals pa1d, pa2d, pb1d, and pb2d.

The bottom portion of FIG. 10A shows a set of later stage clock phase signals 1004 utilized by the second and later stages of the ADC 100. The set of later stage clock phase signals 1004 include pha1, pha2, phb1, and phb2 (and their delayed versions) that are part of a single set of mutually non-overlapping clock phase signals, which are generated by a circuit like that shown in FIG. 7A. It is noted that the waveforms of non-delayed counterparts pha1, pha2, phb1, and phb2 are shown in FIGS. 10A, 10B, 12A, and 12B for simplicity's sake since they are substantially equivalent to the waveforms of the delayed signals pha1, pha2, phb1, and phb2.

Each falling edge 1010, 1014, 1018, and 1022 of the later stage clock phase signals 1004 occurs in response to a corresponding rising edge 1038, 1040, 1042, and 1044 of Mclk clock signal. Each rising edge of the next phase clock signal always occurs after the corresponding falling edge by a respective non-overlap delay. For example, falling edge 1010 of phb2 always occurs before the next rising edge 1012 of pha1, separated by some non-overlap delay; the falling edge 1014 of pha1 always occurs before the next rising edge 1016 of phb1, separated by some non-overlap delay; the falling edge 1018 of phb1 always occurs before the next rising edge 1020 of pha2, separated by some non-overlap delay; and the falling edge 1022 of pha2 always occurs before the next rising edge 1024 of phb2, separated by some non-overlap delay. In this manner, each clock pulse of the later stage clock phase signals 1004 spans the length of substantially one Mclk clock cycle, or the equivalent of substantially one half clock cycle of the full system clock fsys.

It is noted that signals pha1, pha2, phb1, and phb2 (and also their delayed versions) are also staggered in time with respect to one another. In the embodiment shown, the rising edges of the clock phase signals 1004 occur in repeating sequential order of phb2, pha1, phb1, and pha2 (starting arbitrarily with phb2), where each rising edge is separated from a next rising edge by the equivalent of one Mclk clock cycle. It is also noted that the signals illustrated in FIG. 10A control MDAC 126 to sample the single input channel at a rate of 2×fsys, while being operated at the full system clock (fsys).

The top portion of FIG. 10B shows the set of first stage clock phase signals 1002 that have similar timing relationships as those first stage clock phase signals shown in FIG. 10A, but for a different input clock at the full clock rate (fsys). The first stage clock phase signals 1002 are two sets of non-overlapping clock phase signals that are generated by a circuit like that shown in FIG. 6B, where the first stage clock phase signals need not be synchronized. The bottom portion of FIG. 10B shows a single set of mutually non-overlapping later stage clock phase signals 1004, which are generated by a circuit like that shown in FIG. 7B.

The top portion of FIG. 12A shows a set of first stage clock phase signals 1202 that have similar timing relationships as those shown in FIG. 11, which illustrates a single set of non-overlapping clock phase signals generated by a circuit like that shown in FIG. 8A. The first stage clock phase signals 1202 are generated based on an input clock or master clock (Mclk), which (in the embodiment shown) is twice the system clock (2×fsys). A delayed version of the Mclk is used to synchronize the first stage clock phase signals 1202, in a similar manner as discussed in connection with FIG. 11. The bottom portion of FIG. 12A shows another single set of mutually non-overlapping later stage clock phase signals 1204 utilized by the second and later stages of the ADC 100, which are generated by a circuit like that shown in FIG. 7A.

The top portion of FIG. 12B shows the set of first stage clock phase signals 1202 that have similar timing relationships as those first stage clock phase signals shown in FIG. 12A, but for a different input clock at the full clock rate (fsys). The first stage clock phase signals 1202 are a single set of non-overlapping clock phase signals that are generated by a circuit like that shown in FIG. 8B, where the first stage clock phase signals need not be synchronized. The bottom portion of FIG. 12B shows a single set of mutually non-overlapping later stage clock phase signals 1204, which are generated by a circuit like that shown in FIG. 7B.

Second Stage—Operation

In both single and multiple input channel embodiments, MDAC 126 alternately samples the voltages at input nodes 308A-B in a time-interleaved manner, according to the staggered and delayed clock phase signals pa1, pa2, pb1, and pb2. MDAC 126 also generates an output voltage on output node 310 for each sampling channel in a time-interleaved manner, according to the staggered clock phase signals pha1, pha2, phb1, and phb2. It is noted that a set of times T1-T5 are indicated in FIGS. 10A, 10B, 12A, and 12B and are used to discuss the operation of the sub-ADCs 132A-D and MDAC 126 of second stage 104, since the waveforms of non-delayed counterparts pa1, pa2, pb1, pb2, pha1, pha2, phb1, and phb2 show substantially equivalent waveforms of the delayed versions of such signals. Additionally, second stage sampling phases "S2" and gain phases "G2" are illustrated for each channel (e.g., first digit corresponds to the stage and the second digit corresponds to the channel, such as S21, S22, S23, and S24, or G21, G22, G23, and G24). Each of the four channels respectively correspond to circuit paths 304A, 304B, 304C, and 304D). Sampling phases occur in relation to delayed versions of signals pa1, pa2, pb1, and pb2, while gain phases occur in relation to delayed versions of signals pha1, pha2, phb1, and phb2.

Beginning (arbitrarily) during a first time T1, the pa1$d$ signal is activated, the pa2$d$ signal is cleared, the phb2_$d$ signal is activated, and phb1_$d$ signal is cleared. Capacitors C1 and C2 are coupled to input node 308A and charge to sample the input voltage applied to node 308A ("S21"). Capacitors C3 and C4 are coupled to the inverting input (−) of gain element 302 ("G22"). Also during time T1, reference voltage switch 306B is enabled and receives a set of control signals 1410 (shown in FIG. 14) from the sub-ADC 132B for the second channel (shown in FIG. 17) to select one of the three (h, l, m) nodes of switch 306B (shown in FIG. 3), depending upon the comparisons of the voltage at node 308A that was sampled by C3 and C4, relative to VH and VL (shown in FIG. 14). The result of the comparisons also determines the M-bit values for digital output 114A for the second channel (shown in FIG. 17). Gain element 302 generates an output voltage at node 310 for the second channel, based on the voltages provided by C3 and C4 and switch 306B.

During a subsequent time T2, pb1$d$ is activated, pb2$d$ signal is cleared, the pha1_$d$ signal is activated, and the pha2_$d$ signal is cleared. Capacitors C5 and C6 are coupled to input node 308B and charge to sample the input voltage applied to node 308B ("S23"). Capacitors C7 and C8 are coupled to the inverting input (−) of gain element 302 ("G24"). Also during time T2, reference voltage switch 306D is enabled and receives a set of control signals 1410 (shown in FIG. 14) from sub-ADC 132D for the fourth channel (shown in FIG. 17) to select one of the three nodes of switch 306D (shown in FIG. 3), depending upon comparisons of the voltage at node 308B that was sampled by C7 and C8, relative to VH and VL (shown in FIG. 14). The result of the comparisons also determines the M-bit values for digital output 114B for the fourth channel (shown in FIG. 17). Gain element 302 generates an output voltage at node 310 for the fourth channel, based on the voltages provided by C7 and C8 and switch 306D.

During a subsequent time T3, the pa2d signal is activated, the pa1d signal is cleared, the phb1_d signal is activated, and the phb2_d is cleared. Capacitors C3 and C4 are coupled to input node 308A and charge to sample the input voltage applied to node 308A ("S22"). Capacitors C1 and C2 are coupled to the inverting input (−) of gain element 302 ("G21"). Also during time T3, reference voltage switch 306A is enabled and receives a set of control signals 1410 (shown in FIG. 14) from sub-ADC 132A for the first channel (shown in FIG. 17) to select one of the three nodes of switch 306A (shown in FIG. 3), depending upon comparisons of the voltage at node 308A that was sampled by C1 and C2, relative to VH and VL (shown in FIG. 14). The result of the comparisons also determines the M-bit values for digital output 114A for the first channel (shown in FIG. 17). Gain element 302 generates an output voltage at node 310 for the first channel, based on the voltages provided by C1 and C2 and switch 306A.

During a subsequent time T4, the pb2d signal is activated, the pb1d signal is cleared, the pha2_d signal is activated, and pha1_d signal is cleared. Capacitors C7 and C8 are coupled to input node 308B and charge to sample the input voltage applied to node 308B ("S24"). Capacitors C5 and C6 are coupled to the inverting input (−) of gain element 302 ("G23"). Also during time T4, reference voltage switch 306C is enabled and receives a set of control signals 1410 (shown in FIG. 14) from sub-ADC 132C for the third channel (shown in FIG. 17) to select one of the three nodes of switch 306C (shown in FIG. 3), depending upon comparisons of the voltage at node 308B that was sampled by C5 and C6, relative to VH and VL (shown in FIG. 14). The result of the comparisons also determines the M-bit values for digital output 114B for the third channel (shown in FIG. 17). Gain element 302 generates an output voltage at node 310 for the third channel, based on the voltages provided by C5 and C6 and switch 306C.

During a subsequent time T5, another iteration of the procedure described above occurs (e.g., equivalent to the procedure described beginning at time T1), where the procedure continues to repeat in periodic fashion. In this manner, gain element 302 generates a sequence of output voltages (or residual voltages) that correspond to (or are derived from) samples obtained from the input nodes 308A and 308B in an alternating and time-interleaved manner.

Third Stage—Circuitry

FIG. 4 illustrates a circuit diagram of an example MDAC 128 that can be utilized in third stage 106 of ADC 100. Third stage MDAC 128 implements a number of switched capacitor circuit paths 404 (also simply referred to as circuit paths), where each circuit path 304 is configured to sample an input node 408, and each circuit path 404 is associated with a sampling channel of ADC 100. Input node 408 is coupled to output 310 of second stage MDAC 126 to receive the time-interleaved output voltages of the four channels from second stage 104.

MDAC 128 receives later stage clock phase signals pha1, pha2, phb1, pb2, and their delayed versions, which are generated by a circuit like that shown in FIG. 7. Signals pha1, pha2, phb1, and phb2 (and their delayed versions) are mutually non-overlapping with respect to one another. Example waveforms of the clock phase signals generated for the third stage 106 are similar to the waveforms of the later stage clock phases 1004 discussed above in connection with FIG. 10A and FIG. 12A for single input channel embodiments, and to the waveforms of the later stage clock phase signals 1204 discussed above in connection with FIG. 10B and FIG. 12B for multiple input channel embodiments.

MDAC 128 includes a first circuit path 404A associated with a first sampling channel. Circuit path 404A is coupled between input node 408 and an inverting input (−) of a gain element 402. A non-inverting input (+) of gain element 402 is coupled to ground. The first circuit path 404A includes a pair of parallel capacitors C1 and C2, each having a first terminal coupled to node 408 via a respective phb1_d switch and a second terminal tied to one another. The first terminal of C1 is further coupled to an output node 410 of gain element 402 via a pha2_d switch, and the second terminal of C1 is further coupled to the inverting input (−) of gain element 402 via a pha2_d switch. The first terminal of C2 is further coupled to a reference voltage switch 406A that is enabled with pha2_d (where operation of switches 406A-D are discussed below), and the second terminal of C2 is further coupled to ground via a phb1 switch.

MDAC 128 also includes a second circuit path 404B associated with a second sampling channel. Circuit path 404B is coupled between input node 408 and the inverting input (−) of gain element 402. The second circuit path 404B includes parallel capacitors C3 and C4, each having a first terminal coupled to node 408 via a respective phb2_d switch and a second terminal tied to one another. The first terminal of C3 is further coupled to output node 410 via a pha1_d switch, and the second terminal of C3 is further coupled to the inverting input (−) of gain element 402 via a pha1_d switch. The first terminal of C4 is further coupled to reference voltage switch 406B that is enabled with pha1_d, and the second terminal of C4 is further coupled to ground via a phb2 switch.

MDAC 128 also includes a third circuit path 404C associated with a third sampling channel. Circuit path 404C is coupled between input node 408 and the inverting input (−) of gain element 402. The third circuit path 404C includes parallel capacitors C5 and C6, each having a first terminal coupled to node 408 via a respective pha2_d switch and a second terminal tied to one another. The first terminal of C5 is further coupled to output node 410 via a phb2_d switch, and the second terminal of C5 is further coupled to the inverting input (−) of gain element 402 via a phb2_d switch. The first terminal of C6 is further coupled to reference voltage switch 406C that is enabled with phb2_d, and the second terminal of C6 is further coupled to ground via a pha2 switch.

MDAC 128 also includes a fourth circuit path 404D associated with a fourth sampling channel. Circuit path 404D is coupled between input node 408 and the inverting input (−) of gain element 402. The fourth circuit path 404D includes parallel capacitors C7 and C8, each having a first terminal coupled to node 408 via a respective pha1_d switch and a second terminal tied to one another. The first terminal of C7 is further coupled to output node 410 via a phb1_d switch, and the second terminal of C7 is further coupled to the inverting input (−) of gain element 402 via a phb1_d switch. The first terminal of C8 is further coupled to reference voltage switch 406D that is enabled with phb1_d, and the second terminal of C8 is further coupled to ground via a pha1 switch.

Node 408 is also coupled to sub-ADCs 134A-D (shown in FIG. 17), each of which may be implemented by an embodiment of sub-ADC circuit 1400 that includes a pair of comparators 1402 and 1404 and a logic circuit 1406 (shown in FIG. 14). Each input 1408 of sub-ADCs 134A-D receives the time-interleaved output voltages for a respective one of the four sampling channels, available in a time-interleaved manner at Vin output by MDAC 126 of second stage 104 (shown in FIG. 4). Accordingly, each sub-ADC 134A-D is respectively associated with one of the four sampling channels.

The sub-ADCs 134A-D operate in a similar manner as the sub-ADCs 130A-D described above. Each logic circuit receives a respective clock phase signal 1412 as an enable signal. When respectively enabled, each logic circuit 1406 of sub-ADCS 134A-D is configured to output a respective set of control signals 1410 for a respective one of the four sampling channels, based on comparisons of the respective Vin with VH and VL during the associated channel's sampling phase. Each set of control signals 1410 is output to the associated channel's reference voltage switch 406A-D during the associated channel's gain phase. Each reference voltage switch 406A-D is also enabled during the channel's gain phase, according to the reference voltage switch's labeled clock phase signal. When enabled, each logic circuit also generates a digital output 1414 that corresponds to the respective Vin for the respective sampling channel. When implemented for the third stage 106, the digital output 1414 is a K-bit digital output (shown in FIG. 1).

Third Stage—Operation

In both single and multiple input channel embodiments, MDAC 128 alternately samples the voltages at input node 408 in a time-interleaved manner, according to the staggered clock phase signals pha1, pha2, phb1, phb2, and their delayed versions. MDAC 128 also generates an output voltage on output node 410 for each sampling channel in a time-interleaved manner, according to the staggered clock phase signals. It is noted that a set of times T5-T9 are indicated in both FIGS. 10A, 10B, 12A, and 12B and are used to discuss the operation of the sub-ADCs 134A-D and MDAC 128 of third stage 106, since the waveforms of non-delayed counterparts pha1, pha2, phb1, and phb2 show substantially equivalent waveforms of the delayed versions of such signals. Additionally, third stage sampling phases "S3" and gain phases "G3" are illustrated for each channel (e.g., the first digit corresponds to the stage and the second digit corresponds to the channel, such as S31, S32, S33, and S34, and G31, G32, G33, and G34). Each of the four channels respectively correspond to circuit paths 404A, 404B, 404C, and 404D.

Beginning (arbitrarily) during a first time T5, the phb2_d signal is activated and the pha1_d, phb1_d, and pha2_d signals are cleared. Capacitors C3 and C4 are coupled to input node 408 and charge to sample the input voltage applied to node 408 ("S32"). Capacitors C5 and C6 are coupled to the inverting input (−) of gain element 402 ("G33"). Also during time T5, reference voltage switch 406C is enabled and receives a set of control signals 1410 (shown in FIG. 14) from sub-ADC 134C for the third channel (shown in FIG. 17) to select one of the three (l, h, m) nodes of switch 406C (shown in FIG. 4), depending upon comparisons of the voltage at node 408 that was sampled by C5 and C6, relative to VH and VL (shown in FIG. 14). The result of the comparisons also determines the K-bit values for digital output 116 for the third channel (shown in FIG. 17). Gain element 402 generates an output voltage at output node 410 for the third channel, based on the voltages provided by C5 and C6 and switch 406C.

During a subsequent time T6, the pha1_d signal is activated and the phb1_d, pha2_d, and phb2_d signals are cleared. Capacitors C7 and C8 are coupled to input node 408 and charge to sample the input voltage applied to node 408 ("S34"). Capacitors C3 and C4 are coupled to the inverting input (−) of gain element 402 ("G32"). Also during time T6, reference voltage switch 406B is enabled and receives a set of control signals 1410 (shown in FIG. 14) from sub-ADC 134B for the second channel (shown in FIG. 17) to select one of the three nodes of switch 406B (shown in FIG. 4), depending upon comparisons of the voltage at node 408 that was sampled by C3 and C4, relative to VH and VL (shown in FIG. 14). The result of the comparisons also determines the K-bit values for digital output 116 for the second channel (shown in FIG. 17). Gain element 402 generates an output voltage at output node 410 for the second channel, based on the voltages provided by C3 and C4 and switch 406B.

During a subsequent time T7, the phb1_d signal is activated and the pha2_d, phb2_d, and pha1_d signals are cleared. Capacitors C1 and C2 are coupled to input node 408 and charge to sample the input voltage applied to input node 408 ("S31"). Capacitors C7 and C8 are coupled to the inverting input (−) of gain element 402 ("G34"). Also during time T3, reference voltage switch 406D is enabled and receives a set of control signals 1410 (shown in FIG. 14) from sub-ADC 134D for the fourth channel (shown in FIG. 17) to select one of the three nodes of switch 406D (shown in FIG. 4), depending upon the comparisons of the voltage at node 408 that was sampled by C7 and C8, relative to VH and VL (shown in FIG. 14). The result of the comparisons also determines the K-bit values for digital output 116 for the fourth channel (shown in FIG. 17). Gain element 402 generates an output voltage at node 410 for the fourth channel, based on the voltages provided by C7 and C8 and switch 406D.

During a subsequent time T8, the pha2_d signal is activated and the phb2_d, pha1_d, and phb1_d signals are cleared. Capacitors C5 and C6 are coupled to input node 408 and charge to sample the input voltage applied to input node 408 ("S33"). Capacitors C1 and C2 are coupled to the inverting input (−) of gain element 402 ("G31"). Also during time T4, reference voltage switch 406A is enabled and receives a set of control signals 1410 (shown in FIG. 14) from sub-ADC 134A for the first channel (shown in FIG. 17) to select one of the three nodes of switch 406A (shown in FIG. 4), depending upon comparisons of the voltage at node 408 that was sampled by pb1 and C2, relative to VH and VL (shown in FIG. 14). The result of the comparisons also determines the K-bit values for digital output 116 for the first channel (shown in FIG. 17). Gain element 402 generates an output voltage at output node 410 for the first channel, based on the voltages provided by pb1 and C2 and switch 406A.

During a subsequent time T9, another iteration of the procedure described above occurs (e.g., equivalent to the procedure described beginning at time T5), where the procedure continues to repeat in periodic fashion. In this manner, gain element 402 generates a sequence of output voltages (or residual voltages) that correspond to (or are derived from) samples obtained from input node 408 in a time-interleaved manner.

Clock Generation

Figure 5:
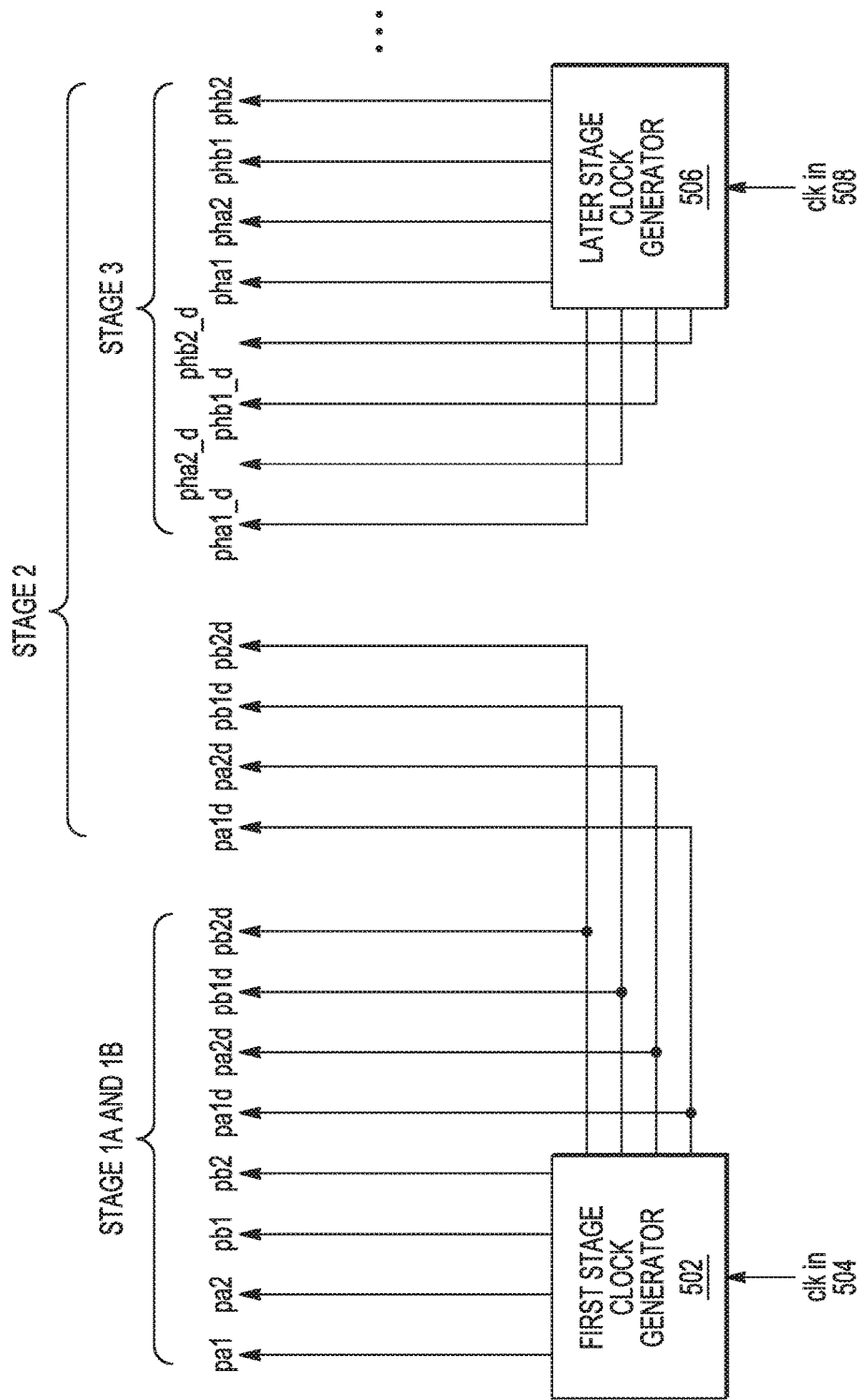
FIG. 5 illustrates a block diagram depicting an example clock generation system utilized for a pipelined ADC in which the present disclosure is implemented, according to some embodiments.

FIG. 5 illustrates a block diagram depicting an example clock generation system that may be utilized for a pipelined ADC. First stage clock generator 502 and later stage clock generator 506 are configured to generate a plurality of clock signals based on a respective received clock signal 504 and 508. In some embodiments, both clock signals 504 and 508 are provided with twice a system clock rate (or 2×fsys), while in other embodiments, both clock signals 504 and 508 are provided with the full system clock rate fsys.

Each ADC stage receives the clock phase signals identified in connection with the vertical arrows in FIG. 5. For example, first stages 102A and 102B receive clock phase signals pa1, pa2, pb1, and pb2, as well as delayed versions of those signals including pa1d, pa2d, pb1d, and pb2d, which are generated by the first stage clock generator 502. Second stage 104 receives the delayed signals pa1d, pa2d, pb1d, and pb2d from first stage clock generator 502, while also receiving clock phase signals pha1, pha2, phb1, and phb2 and their delayed versions from later stage clock generator 506. Third stage 106 receives signals pha1, pha2, phb1, and phb2, as well as delayed versions of those signals including pha1_d, pha2_d, phb1_d, and phb2_d from later stage clock generator 506. Each ADC stage may also receive complementary versions of the delayed signals.

Figure 13:
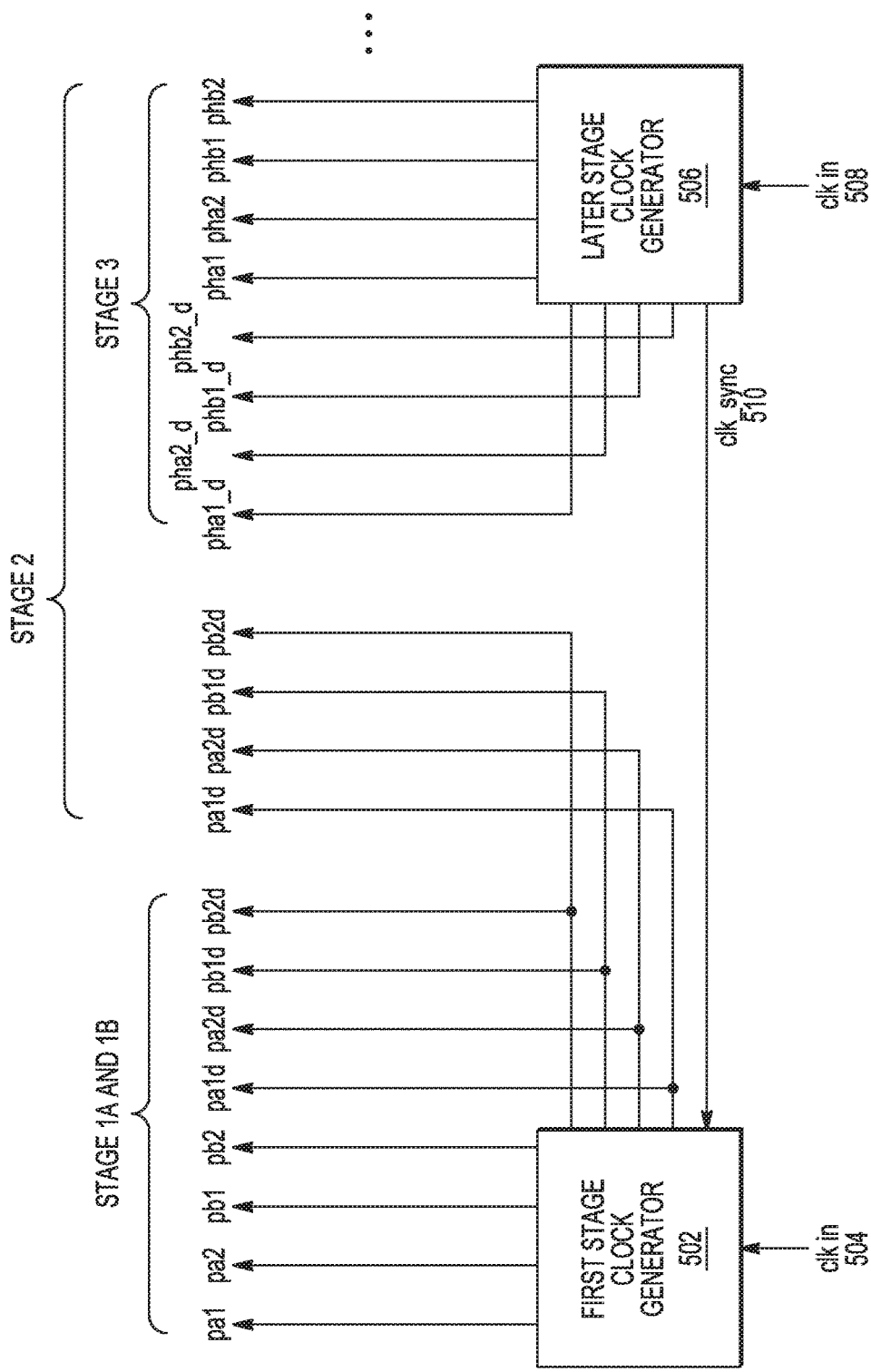
FIG. 13 illustrates a block diagram depicting another example clock generation system utilized for a pipelined ADC in which the present disclosure is implemented, according to some embodiments.

FIG. 13 illustrates a block diagram depicting another example clock generation system that may be utilized for a pipelined ADC. The clock generation system shown in FIG. 13 is similar to the clock generation system shown in FIG. 5, with the addition of a clock synchronization signal clk_sync 510 provided from later stage clock generator 506 to first stage clock generator 502. First stage clock generator 502 utilizes the clock synchronization signal 510 to maintain the correct timing relationships of the first stage clock generated signals and the later stage clock generated signals.

Four embodiments of clock generation system are presented herein, although additional embodiments may be implemented.

A) In one embodiment, the clock generation system includes the first stage clock generator of FIG. 6A to generate two sets of non-overlapping clock phase signals using an input clock of 2×fsys, which are synchronized by a delayed version of 2×fsys. Such an embodiment also includes the later stage clock generator of FIG. 7A to generate a set of mutually non-overlapping clock phase signals using an input clock of 2×fsys. The clock phase signals of such an embodiment are illustrated in FIG. 10A.

B) In another embodiment, the clock generation system includes the first stage clock generator of FIG. 8A to generate a single set of non-overlapping clock phase signals using an input clock of 2×fsys, which are synchronized by a delayed version of 2×fsys. Such an embodiment also includes the later stage clock generator of FIG. 7A to generate a set of mutually non-overlapping clock phase signals using an input clock of 2×fsys. The clock phase signals of such an embodiment are illustrated in FIG. 12A.

C) In another embodiment, the clock generation system includes the first stage clock generator of FIG. 6B to generate two sets of non-overlapping clock phase signals using an input clock of fsys, without needing to synchronize the signals (although they may be synchronized in other embodiments). Such an embodiment also includes the later stage clock generator of FIG. 7B to generate a set of mutually non-overlapping clock phase signals using an input clock of fsys. The clock phase signals of such an embodiment are illustrated in FIG. 10B.

Figure 8B:
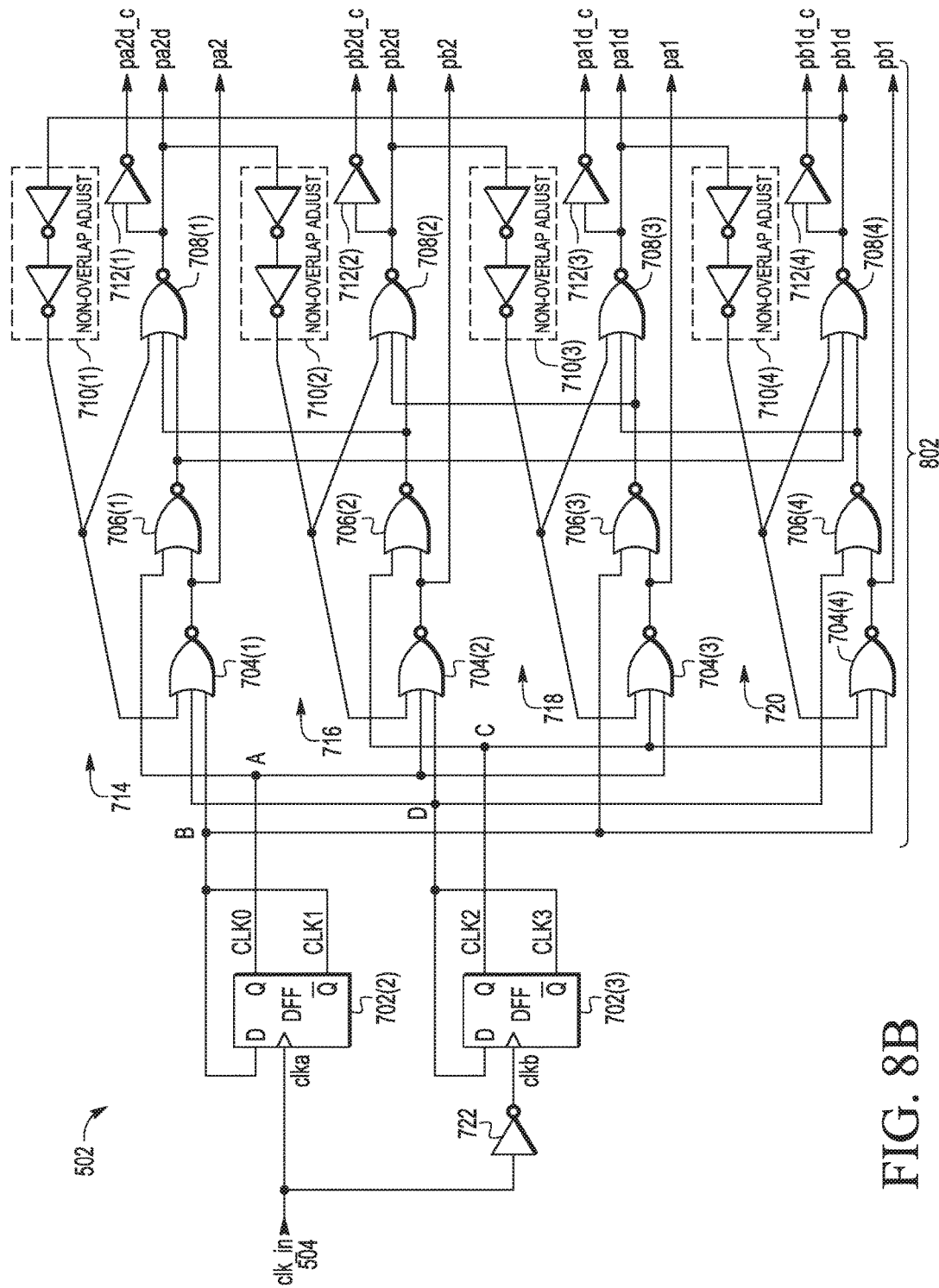

D) In another embodiment, the clock generation system includes the first stage clock generator of FIG. 8B to generate a single set of non-overlapping clock phase signals using an input clock of fsys, without needing to synchronize the signals (although they may be synchronized in other embodiments). Such an embodiment also includes the later stage clock generator of 7B to generate a set of mutually non-overlapping clock phase signals using an input clock of fsys. The clock phase signals of such an embodiment are illustrated in FIG. 12B.

First Stage Clock Generator—Circuitry

FIG. 6A illustrates a circuit diagram of an example first stage clock generator 502 that can be utilized in the clock generation system of FIG. 5. In this example, first stage clock generator 502 is configured to generate two sets of non-overlapping clock signals for the first stages 102A and 102B of ADC 100, when ADC 100 is configured to sample a single input channel. The non-overlapping clock signals are generated based on an input clock signal clk_in 504, which is twice the system clock rate (2×fsys) in the embodiment shown. Another embodiment of generator 502 is provided in FIG. 6B that is configured to generate two sets of non-overlapping clock signals when ADC 100 is configured to sample multiple input channels, based on an input clock signal of the full system clock rate (fsys). Another embodiment of generator 502 is provided in FIG. 8A that is configured to generate a single set of non-overlapping clock signals when ADC 100 is configured to sample a single input channel, based on an input clock signal of twice the system clock rate (2×fsys). Another embodiment of generator 502 is provided in FIG. 8B that is configured to generate a single set of non-overlapping clock signals when ADC 100 is configured to sample multiple input channels, based on an input clock signal of the full system clock rate (fsys).

FIG. 6A includes frequency divider circuits 602(1)-(3), which may be implemented using D-type flip flops, and four clock generation circuitry paths, which may be implemented using a number of NOR gates. The circuitry paths are configured to output clock phase signals pa1, pa2, pb1, pb2, and their delayed versions of pa1d, pa2d, pb1d, and pb2d, as discussed below. Circuits 602(1)-(3) are each arranged such that its inverted-Q output node is coupled to its D input node.

Input clock clk_in 504 is received at an input of frequency divider circuit 602(1), which is configured to divide the input clock signal by two in frequency to obtain first and second complementary clock signals clka and clkb. Frequency divider circuit 602(2) has an input that receives the inverted-Q output (clka) from circuit 602(1), and frequency divider circuit 602(3) has an input that receives the Q output (clkb) from circuit 602(1). Circuit 602(2) is configured to divide the clka clock signal by two in frequency to obtain first and second clock signals at the Q (clock0) and inverted-Q (clock1) output nodes of circuit 602(2). Circuit 602(3) is configured to divide the clkb clock signal by two in frequency to obtain third and fourth clock signals at the Q (clock2) and inverted-Q (clock3) output nodes of circuit 602(3). Signals clock0-clock3 each have a frequency that is one quarter of the frequency of the input clock signal 504. For desired operation of the clock generator system, rising edges corresponding to each rising edge of clka and clkb are required, but once the rising edges occur, the clock0-clock3 signals each need to stay high for an entire clock period of clka or clkb. Circuits 602(2) and 602(3) generate four desired edges, the signals stay high for the desired time periods, and the clock phase signals are generated at the correct frequency.

FIG. 6A also includes a delay circuit 614 that includes a plurality of serially coupled inverters 612(1)-(15). Delay circuit 614 outputs an inverted enable clock signal (ENb or inverted-EN), while the penultimate inverter 612(14) of delay circuit 614 outputs an enable clock signal (EN). Delay circuit 614 produces the EN and inverted-EN clock signals by delaying the input clock 504 by an amount sufficient to ensure that clock0-clock3 become stable in response to being activated by the input clock 504 in frequency divider circuits 602(2) and 602(3). The inverted-EN clock signal is coupled to each gate of p-type transistors 604(1)-(4), and the EN clock signal is coupled to each gate of n-type transistors 606(1)-(4), where a pass gate or transmission gate is formed by a combination of a p-type transistor 604 and an n-type transistor 606. The EN clock signal controls the pass gates that each allow a respective one of clock0-clock3 to pass to a respective one of nodes A, B, C, and D, where the resulting clock signals at nodes A, B, C, and D are thereby synchronized with the EN clock signal. The synchronized clock signals are used by the NOR gate circuitry paths coupled to the nodes A, B, C, and D in order to generate the clock phase signals. By synchronizing the clock signals clock0-clock3 to a transition edge of the EN clock signal, essentially skew free clock phase signals are generated by the circuitry paths (e.g., the timing skew between the clock phase signals delivered to the sampling channels are within operating tolerances).

Transistors 604(1) and 606(1) each have a first terminal coupled to clock0 and a second terminal coupled to node A, forming a first transmission gate that operates as a switch providing a conduction path between clock0 and an input of gate NOR 608(1) at node A. The conduction path is formed when an activated (e.g., logic high) EN control signal is applied to the gate of n-type transistor 606(1) or a cleared (e.g., logic low) inverted-EN control signal is applied to the gate of p-type transistor 604(1).

Transistors 604(2) and 606(2) each have a first terminal coupled to clock1 and a second terminal coupled to node B, forming a second transmission gate that operates as a switch providing a conduction path between clock1 and an input of NOR gate 608(4) at node B. The conduction path is formed when an activated (e.g., logic high) EN control signal is applied to the gate of n-type transistor 606(2) or a cleared (e.g., logic low) inverted-EN control signal is applied to the gate of p-type transistor 604(2).

Transistors 604(3) and 606(3) each have a first terminal coupled to clock2 and a second terminal coupled to node C, forming a third transmission gate that operates as a switch providing a conduction path between clock2 and an input of NOR gate 610(1) at node C. The conduction path is formed when an activated (e.g., logic high) EN control signal is applied to the gate of n-type transistor 606(3) or a cleared (e.g., logic low) inverted-EN control signal is applied to the gate of p-type transistor 604(3).

Transistors 604(4) and 606(4) each have a first terminal coupled to clock3 and a second terminal coupled to node D, forming a fourth transmission gate that operates as a switch providing a conduction path between clock3 and an input of NOR gate 610(4) at node D. The conduction path is formed when an activated (e.g., logic high) EN control signal is applied to the gate of n-type transistor 606(4) or a cleared (e.g., logic low) inverted-EN control signal is applied to the gate of p-type transistor 604(4).

NOR gate 608(1) has inputs coupled to node A and to the output of NOR gate 608(6). NOR gate 608(1) outputs the pa1 clock phase signal. NOR gate 608(2) has inputs coupled to the output of NOR gate 608(1) and to node B. NOR gate 608(3) has inputs coupled to the output of NOR gate 608(2) and the output of NOR gate 608(6). NOR gate 608(3) outputs the pa1d clock phase signal.

NOR gate 608(4) has inputs coupled to node B and to the output of NOR gate 608(3). NOR gate 608(4) outputs the pa2 clock phase signal. NOR gate 608(5) has inputs coupled to the output of NOR gate 608(4) and to node A. NOR gate 608(6) has inputs coupled to the output of NOR gate 608(5) and to the output of NOR gate 608(3). NOR gate 608(6) outputs the pa2d clock phase signal.

NOR gate 610(1) has inputs coupled to node C and to the output of NOR gate 610(6). NOR gate 610(1) outputs the pb1 clock phase signal. NOR gate 610(2) has inputs coupled to the output of NOR gate 610(1) and to node D. NOR gate 610(3) has inputs coupled to the output of NOR gate 610(2) and the output of NOR gate 610(6). NOR gate 610(3) outputs the pb1d clock phase signal.

NOR gate 610(4) has inputs coupled to node D and to the output of NOR gate 610(3). NOR gate 610(4) outputs the pb2 clock phase signal. NOR gate 610(5) has inputs coupled to the output of NOR gate 610(4) and to node C. NOR gate 610(6) has inputs coupled to the output of NOR gate 610(5) and to the output of NOR gate 610(3). NOR gate 610(6) outputs the pb2d clock phase signal.

NOR gates 608(1)-(3) are configured as a first circuitry path and NOR gates 608(4)-(6) are configured as a second circuitry path, where the first and second circuitry paths are cross-coupled to operate as a latch circuit 616. A falling edge of pa1d is delayed after a falling edge of pa1 by a first non-overlap delay (also discussed below in connection with FIG. 15 as delay T5-T4), which is implemented by propagation delay between the outputs of NOR gates 608(1) and 608(3). A falling edge of pa1d drives a rising edge of pa2d, where the time period in which both pa1d and pa2d are low is referred to as a second non-overlap delay (or delay T6-T5), which is implemented by propagation delay between the outputs of NOR gates 608(3) and 608(6). The falling edge of pa1d also simultaneously drives a rising edge of pa2.

A rising edge of the synchronized clock1 signal at node B drives a falling edge of pa2. A falling edge of pa2d is delayed after a falling edge of pa2 by a third non-overlap delay (or delay T19-T18), implemented by propagation delay between outputs of NOR gates 608(4) and 608(6). A falling edge of pa2d drives a rising edge of pa1d, where the time period in which both pa2d and pa1d signals are low is referred to as a fourth non-overlap delay (or delay T20-T19), which is implemented by propagation delay between outputs of NOR gates 608(6) and 608(3). The falling edge of pa2d also simultaneously drives a rising edge of pa1. A rising edge of the synchronized clock0 signal at node A drives a falling edge of pa1.

In this manner, a first total non-overlap delay from pa1 falling edge to next pa2 rising edge (or delay 944) corresponds to a delay through gates 608(2), 608(3), and 608(4), and a second total non-overlap delay from pa2 falling edge to next pa1 rising edge (or delay 940) corresponds to a delay through gates 608(5), 608(6), and 608(1). The first and second total non-overlap delays can be modified by changing the number of serially coupled gates in the respective circuitry paths, which modifies the propagation delay through the respective circuitry paths.

NOR gates 610(1)-(3) are configured as a third circuitry path and NOR gates 610(4)-(6) are configured as a fourth circuitry path, where the third and fourth circuitry paths are cross-coupled to operate as another latch circuit 616. Similarly, a falling edge of pb1d is delayed after a falling edge of pb1 by a first non-overlap delay (T12-T11), implemented between the outputs of NOR gates 610(1) and 610(3). A falling edge of pb1d drives a rising edge of pb2d, where the time period in which both pb1d and pb2d are low is referred to as a second non-overlap delay (T13-T12), implemented between the outputs of NOR gates 610(3) and 610(6). The falling edge of pb1*d* also simultaneously drives a rising edge of pb2.

A rising edge of the synchronized clock3 signal at node D drives a falling edge of pb2. A falling edge of pb2*d* is delayed after a falling edge of pb2 by a third non-overlap delay (T26-T25), implemented between outputs of NOR gates 610(4) and 610(6). A falling edge of pb2*d* drives a rising edge of pb1*d*, where the time period in which both pb2*d* and pb1*d* signals are low is referred to as a fourth non-overlap delay (T27-T26), implemented between outputs of NOR gates 610(6) and 610(3). The falling edge of pb2*d* also simultaneously drives a rising edge of pb1. A rising edge of the synchronized clock2 signal at node C drives a falling edge of pb1.

In this manner, a third total non-overlap delay from pb1 falling edge to next pb2 rising edge (or delay 946) corresponds to a delay through gates 610(2), 610(3), and 610(4), and a fourth total non-overlap delay from pb2 falling edge to next pb1 rising edge (or non-overlap delay 942) corresponds to a delay through gates 610(5), 610(6), and 610(1). The third and fourth total non-overlap delays can be modified by changing the number of serially coupled gates in the respective circuitry paths, which modifies the propagation delay through the respective circuitry paths.

FIG. 6B illustrates a circuit diagram of another example first stage clock generator 502 that can be utilized in the clock generation system of FIG. 5. In this example, first stage clock generator 502 is configured to generate two sets of non-overlapping clock phase signals when ADC 100 is configured to sample multiple input channels. Since multiple input channels are each being sampled using a respective one of the clock phase signals generated by the circuit in FIG. 6B, timing skew is less of a concern in this embodiment. For this reason, the clock0-clock3 signals generated by the divider circuits 602(2) and 602(3) do not need to be synchronized. As such, FIG. 6B includes divider circuits 602(2) and 602(3), with clock0-clock3 each respectively coupled to nodes A-D without any intervening pass gates. Further, the divider circuit 602(1) is not included in FIG. 6B, which allows the use of an input clock signal of the full system clock rate fsys to generate the two sets of non-overlapping clock phase signals. As such, FIG. 6B includes the input clock clk_in 504 to be provided as input to circuit 602(2) as clka, and an inverted version of the input clock produced by inverter 614 to be provided as input to circuit 602(3) as clkb. The circuitry paths coupled to nodes A, B, C, and D operate in a same manner as discussed above in connection with FIG. 6A, with the exception that the signals at nodes A, B, C, and D are driven directly by clock0-clock3 signals without being synchronized.

FIG. 8A illustrates a circuit diagram of another example first stage clock generator circuit that can be utilized in the clock generation system of FIG. 5. In this example, first stage clock generator 502 is configured to generate a single set of mutually non-overlapping clock phase signals when ADC 100 is configured to sample a single input channel. The clock generator circuit shown in FIG. 8A is similar to the clock generator circuit shown in FIG. 7A that is discussed below, with the addition of switches 804(1)-(4) respectively coupled between the inverted-Q and Q outputs of circuits 702(2) and 702(3) and input nodes A, B, C, and D of circuitry branches 714-720. The switches 804(1)-(4) each receive an inverted enable clock signal (ENB or inverted-EN) at a control terminal. FIG. 8A also includes a delay circuit 614 similar to that shown in FIG. 6A, which is configured to output the ENB clock signal. Delay circuit 614 produces the ENB clock signal by delaying the input clock 504 by an amount sufficient to ensure that Q and inverted-Q outputs of circuits 702(2) and 702(3) become stable in response to being activated by the input clock 504. Each switch 804 synchronizes the clock0-clock3 signals to a transition edge of the ENB clock signal, which result in essentially skew free clock phase signals generated by the circuitry branches (e.g., the timing skew between the clock phase signals delivered to the sampling channels are within operating tolerances).

In some embodiments, each switch 804 is implemented using a pass gate or transmission gate like that shown in FIG. 6A by a combination of a p-type transistor 604 and an n-type transistor 606, where the penultimate inverter of delay circuit 614 outputs an EN clock signal that is coupled to the gate of the n-type transistor, and the inverted-EN clock signal is coupled to the gate of the p-type transistor. The circuitry branches coupled to nodes A, B, C, and D operate in a same manner as discussed above in connection with FIG. 7A.

FIG. 8B illustrates a circuit diagram of another example first stage clock generator circuit that can be utilized in the clock generation system of FIG. 5. In this example, first stage clock generator 502 is configured to generate a set of mutually non-overlapping clock phase signals when ADC 100 is configured to sample multiple input channels. The clock generator circuit shown in FIG. 8B is similar to the clock generator circuit shown in FIG. 7A that is discussed below, except without divider circuit 702(1). This allows the use of an input clock signal of the full system clock rate fsys to generate the set of mutually non-overlapping clock phase signals. As such, FIG. 8B includes the input clock clk_in 504 to be provided as input to circuit 702(2) as clka, and an inverted version of the input clock produced by inverter 722 to be provided as input to circuit 702(3) as clkb. The circuitry branches coupled to nodes A, B, C, and D operate in a same manner as discussed above in connection with FIG. 7A, where the signals at nodes A, B, C, and D are driven directly by clock0-clock3 signals without being synchronized.

First Stage Clock Generator—Two Sets of Non-Overlapping Clock Phase Signals

Figure 15:
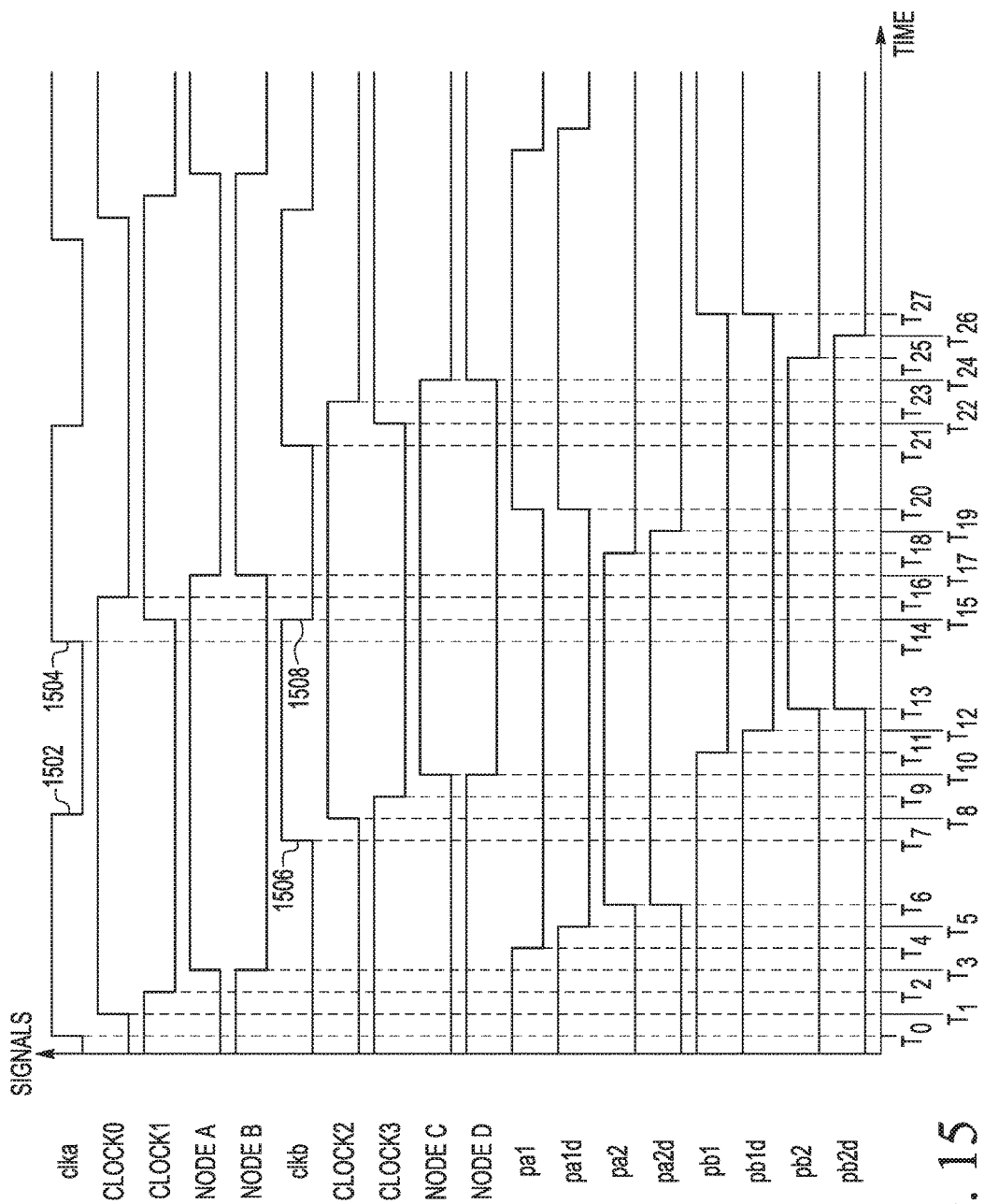

Further detail of the timing relationships between the two sets of non-overlapping clock phase signals and their delayed versions is shown in FIG. 15. The signals clka and clkb are complementary to one another, where clka and clkb may be generated from a divider circuit receiving twice the system clock rate (like in FIG. 6A) or may be generated from the system clock rate (like in FIG. 6B). In the embodiment shown, clka and clkb are generated by a divider circuit (like in FIG. 6A), resulting in clka having a falling edge 1502 that occurs after a rising edge 1506 of clkb, although edges 1502 and 1506 may be aligned if clkb is an inverted version of clka (like in FIG. 6B). Similarly, in the embodiment shown, clka has a rising edge 1504 that occurs before a falling edge 1508 of clkb, although edges 1504 and 1508 may be aligned if clkb is an inverted version of clka.

A rising edge of clka occurs at time T0, a rising edge of clock0 is subsequently output by divider circuit 602(2) at time T1, and a falling edge of clock1 is subsequently output by divider circuit 602(2) at time T2. In the embodiment shown, the clock0 and clock1 signals are synchronized at nodes A and B to an edge of a delayed version of the input clock (which may be 2×fsys or fsys) at time T3. The input clock is delayed by an amount (T3-T0) sufficient to ensure that clock0 and clock1 become stable in response to being activated by clka in divider circuit 602(2). A falling edge of pa1 occurs thereafter at time T4, as triggered by the signal at node A going high.

A falling edge of pa1*d* occurs at time T5, which is delayed relative to the falling edge of pa1 that occurs at time T4 by a first non-overlap delay (T5-T4). Rising edges of both pa2 and pa2*d* occur at time T6, which is delayed relative to the falling edge of pa1*d* by a second non-overlap delay (T6-T5). It is noted that the delay from T4 to time T6, or from pa1 falling edge to next pa2 rising edge, is illustrated as delay 944 in FIG. 9.

A next rising edge of clka occurs at time T14, a rising edge of clock1 is subsequently output by divider circuit 602(2) at time T15, and a falling edge of clock0 is output by divider circuit 602(2) at time T16. The clock0 and clock1 signals are synchronized at nodes A and B at time T17. A falling edge of pa2 occurs thereafter at time T18, as triggered by the signal at node B going high.

A falling edge of pa2*d* occurring at time T19 is delayed relative to the falling edge of pa2 occurring at time T18 by a third non-overlap delay (T19-T18). Rising edges of both pa1 and pa1*d* occur at time T20, which is delayed relative to the falling edge of pa2*d* by a fourth non-overlap delay (T20-T19). It is noted that the delay from time T18 to time T20, or from pa2 falling edge to next pa1 rising edge, is illustrated as delay 940 in FIG. 9. This timing relationship from a primary signal's falling edge to its delayed signal's falling edge to the next primary signal's rising edge repeats in a cyclical and periodic manner.

A similar process occurs for the signals based on clkb. A rising edge of clkb occurs at time T7, a rising edge of clock2 is subsequently output by divider circuit 602(3) at time T8, and a falling edge of clock3 is subsequently output by divider circuit 602(3) at time T9. In the embodiment shown, the clock2 and clock3 signals are synchronized at nodes C and D to an edge of a delayed version of the input clock (which may be 2×fsys or fsys) at time T10. The input clock is delayed by an amount (T10-T7) sufficient to ensure that clock2 and clock3 become stable in response to being activated by clkb in divider circuit 602(3). A falling edge of pb1 occurs thereafter at time T11, as triggered by the signal at node C going high.

A falling edge of pb1*d* occurs at time T12, which is delayed relative to the falling edge of pb1 that occurs at time T11 by a first non-overlap delay (T12-T11). Rising edges of both pb2 and pb2*d* occur at time T13, which is delayed relative to the falling edge of pb1*d* by a second non-overlap delay (T13-T12). It is noted that the delay from T11 to time T13, or from pb1 falling edge to next pb2 rising edge, is illustrated as delay 946 in FIG. 9.

A next rising edge of clkb occurs at time T21, a rising edge of clock3 is subsequently output by divider circuit 602(3) at time T22, and a falling edge of clock2 is output by divider circuit 602(3) at time T23. The clock2 and clock3 signals are synchronized at nodes C and D at time T24. A falling edge of pb2 occurs thereafter at time T25, as triggered by the signal at node D going high.

A falling edge of pb2*d* occurring at time T26 is delayed relative to the falling edge of pb2 occurring at time T25 by a third non-overlap delay (T26-T25). Rising edges of both pb1 and pb1*d* occur at time T27, which is delayed relative to the falling edge of pb2*d* by a fourth non-overlap delay (T27-T26). It is noted that the delay from time T25 to time T27, or from pb2 falling edge to next pb1 rising edge, is illustrated as delay 942 in FIG. 9. This timing relationship from a primary signal's falling edge to its delayed signal's falling edge to the next primary signal's rising edge repeats in a cyclical and periodic manner.

It is noted that in embodiments where the signals at nodes A, B, C, and D are not synchronized, the waveforms of the signals at nodes A-D follow the waveforms of the clock0-clock3 signals, meaning that each primary signal's falling edge, its delayed signal's falling edge, and the next primary signal's rising edge occur sooner than shown in FIG. 15 (e.g., pa1's falling edge would occur at a time comparable to time T2 in response to clock0 going high, rather than time T4).

First Stage Clock Generator—One Set of Non-Overlapping Clock Phase Signals

Figure 16:
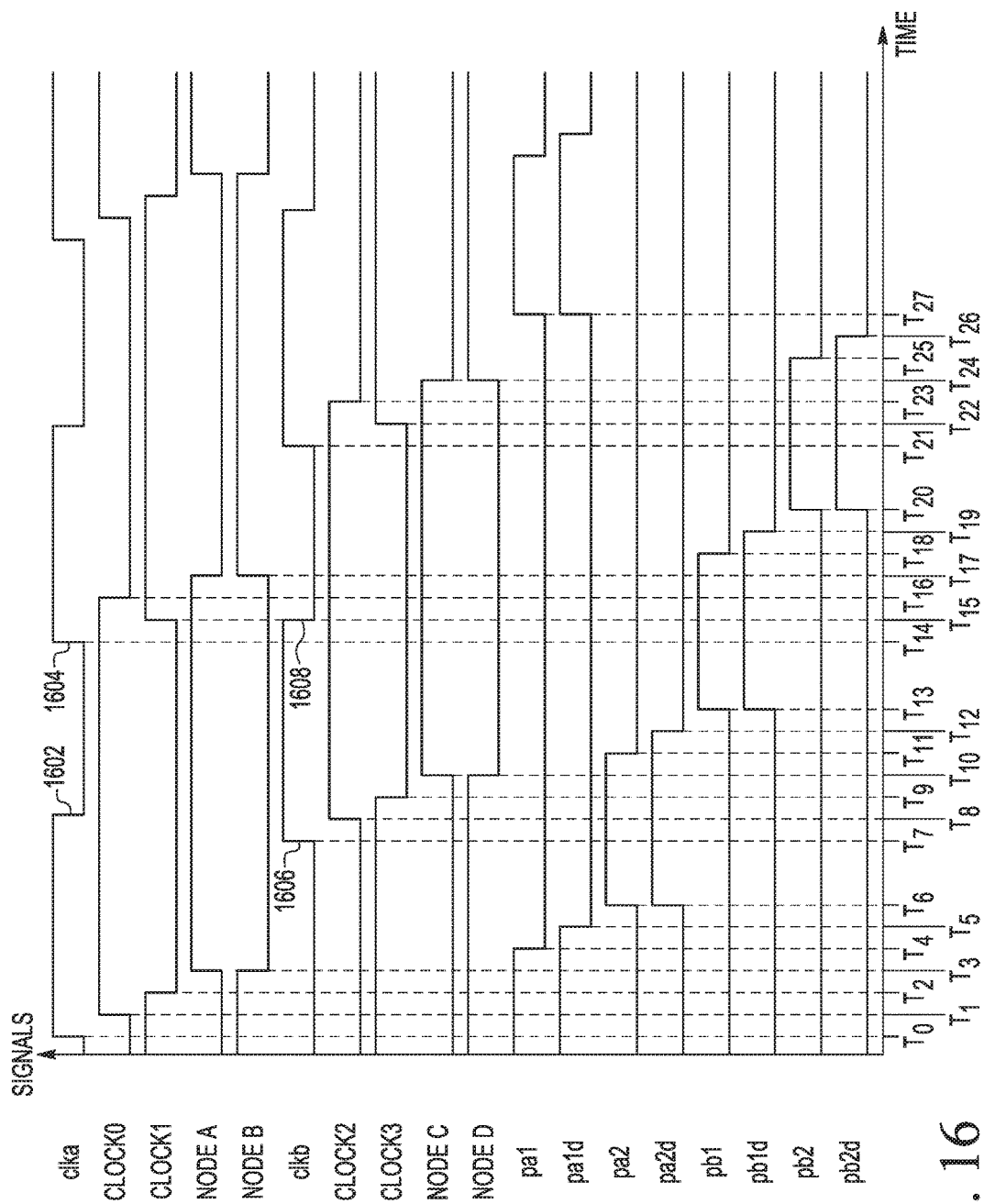

Further detail of the timing relationships between the single set of mutually non-overlapping clock phase signals and their delayed versions is shown in FIG. 16. The signals clka and clkb are complementary to one another, where clka and clkb may be generated from a divider circuit receiving twice the system clock rate (like in FIG. 8A) or may be generated from the system clock rate (like in FIG. 8B). In the embodiment shown, clka and clkb are generated by a divider circuit (like in FIG. 8A), resulting in clka having a falling edge 1602 that occurs after a rising edge 1606 of clkb, although edges 1602 and 1606 may be aligned if clkb is an inverted version of clka (like in FIG. 8B). Similarly, in the embodiment shown, clka has a rising edge 1604 that occurs before a falling edge 1608 of clkb, although edges 1604 and 1608 may be aligned if clkb is an inverted version of clka.

A rising edge of clka occurs at time T0, a rising edge of clock0 is subsequently output by divider circuit 702(2) at time T1, and a falling edge of clock1 is subsequently output by divider circuit 702(2) at time T2. In the embodiment shown, the clock0 and clock1 signals are synchronized at nodes A and B to an edge of a delayed version of the input clock (which may be 2×fsys or fsys) at time T3. The input clock is delayed by an amount (T3-T0) sufficient to ensure that clock0 and clock1 become stable in response to being activated by clka in divider circuit 702(2). A falling edge of pa1 occurs thereafter at time T4, as triggered by the signal at node A going high.

A falling edge of pa1*d* occurs at time T5, which is delayed relative to the falling edge of pa1 that occurs at time T4 by a first non-overlap delay (T5-T4). Rising edges of both pb1 and pb1*d* occur at time T6, which is delayed relative to the falling edge of pa1*d* by a second non-overlap delay (T6-T5). It is noted that the delay from T4 to time T6, or from pa1 falling edge to next pb1 rising edge, is illustrated as delay 1142 in FIG. 11.

A next rising edge of clkb occurs at time T7, a rising edge of clock2 is subsequently output by divider circuit 702(3) at time T8, and a falling edge of clock3 is output by divider circuit 702(3) at time T9. The clock2 and clock3 signals are synchronized at nodes C and D at time T10. A falling edge of pb1 occurs thereafter at time T11, as triggered by the signal at node C going high.

A falling edge of pb1*d* occurring at time T12 is delayed relative to the falling edge of pb1 occurring at time T11 by a third non-overlap delay (T12-T11). Rising edges of both pa2 and pa2*d* occur at time T13, which is delayed relative to the falling edge of pb1*d* by a fourth non-overlap delay (T13-T12). It is noted that the delay from time T11 to time T13, or from pb1 falling edge to next pa2 rising edge, is illustrated as delay 1144 in FIG. 11.

A next rising edge of clka occurs at time T14, a rising edge of clock1 is subsequently output by divider circuit 702(2) at time T15, and a falling edge of clock0 is subsequently output by divider circuit 702(2) at time T16. In the embodiment shown, the clock0 and clock1 signals are synchronized at nodes A and B to an edge of a delayed version of the input clock (which may be 2×fsys or fsys) at time T17. The input clock is delayed by an amount (T17-T14) sufficient to ensure that clock0 and clock1 become stable in response to being activated by clk1 in divider circuit 702(2). A falling edge of pa2 occurs thereafter at time T18, as triggered by the signal at node B going high.

A falling edge of pa2*d* occurs at time T19, which is delayed relative to the falling edge of pa2 that occurs at time T18 by a first non-overlap delay (T19-T18). Rising edges of both pb2 and pb2*d* occur at time T20, which is delayed relative to the falling edge of pa2*d* by a second non-overlap delay (T20-T18). It is noted that the delay from T18 to time T20, or from pa2 falling edge to next pb2 rising edge, is illustrated as delay 1146 in FIG. 11.

A next rising edge of clkb occurs at time T21, a rising edge of clock3 is subsequently output by divider circuit 702(3) at time T22, and a falling edge of clock2 is output by divider circuit 702(3) at time T23. The clock2 and clock3 signals are synchronized at nodes C and D at time T24. A falling edge of pb2 occurs thereafter at time T25, as triggered by the signal at node D going high.

A falling edge of pb2*d* occurring at time T26 is delayed relative to the falling edge of pb2 occurring at time T25 by a third non-overlap delay (T26-T25). Rising edges of both pa1 and pa1*d* occur at time T27, which is delayed relative to the falling edge of pb2*d* by a fourth non-overlap delay (T27-T26). It is noted that the delay from time T25 to time T27, or from pb2 falling edge to next pa1 rising edge, is illustrated as delay 1140 in FIG. 11. This timing relationship from a primary signal's falling edge to its delayed signal's falling edge to the next primary signal's rising edge repeats in a cyclical and periodic manner.

It is noted that in embodiments where the signals at nodes A, B, C, and D are not synchronized, the waveforms of the signals at nodes A-D follow the waveforms of the clock0-clock3 signals, meaning that each primary signal's falling edge, its delayed signal's falling edge, and the next primary signal's rising edge occur sooner than shown in FIG. 15 (e.g., pa1's falling edge would occur at a time comparable to time T2 in response to clock0 going high, rather than time T4).

Later Stage Clock Generator—Circuitry

FIG. 7A illustrates a circuit diagram of an example later stage clock generator 506 that can be utilized in the clock generation system of FIG. 5. In this example, later stage clock generator 506 is configured to generate the set of non-overlapping clock phase signals for the second stage 104 and third stage 106 (if any are present) of ADC 100, when ADC 100 is configured to sample a single input channel. The clock phase signal are generated based on an input clock signal clk_in 508, which in the embodiments shown herein is the full system clock fsys.

FIG. 7A includes frequency divider circuits 702(1)-(3), which may be implemented using D-type flip flops, and four clock generation circuitry branches 714-720, which may be implemented using a number of NOR gates. The circuitry branches output mutually non-overlapping clock phase signals pha1, pha2, phb1, phb2, and their mutually non-overlapping delayed versions of pha1_*d*, pha2_*d*, phb1_*d*, and phb2_*d*, as discussed below. Circuits 702(1)-(3) are each arranged such that its inverted-Q output node is coupled to its D input node.

Input clock clk_in 508 is received at an input of frequency divider circuit 702(1), which is configured to divide the input clock signal by two in frequency to obtain first and second complimentary clock signals clka and clkb. Frequency divider circuit 702(2) has an input that receives the Q output (clka) from circuit 702(1), and frequency divider circuit 702(3) has an input that receives the inverted-Q output (clkb) from circuit 702(1). Circuit 702(2) is configured to divide the clka clock signals by two in frequency to obtain first and second clock signals at the Q (clock0) and inverted-Q (clocks) output nodes of circuit 702(2). Circuit 702(3) is configured to divide the clkb clock signal by two in frequency to obtain first and second clock signals at the Q (clock2) and inverted-Q (clock3) output nodes of circuit 702(3). The signals clock0-clock3 each have a frequency that is one quarter of the frequency of the input clock signal 508. For desired operation of the clock generator system, rising edges corresponding to each rising edge of clka and clkb are required, but once the rising edges occur, the clock0-clock3 signals each need to stay high for an entire clock period of clka or clkb. Circuits 702(2) and 702(3) generate four desired edges, the signals stay high for the desired time periods, and the clock phase signals are generated at the correct frequency.

In the embodiment shown, the Q (clock0) output of circuit 702(2) is coupled to node A, the inverted-Q (clock1) output of circuit 702(2) is coupled to node B, the Q (clock2) output of circuit 702(3) is coupled to node C, and the inverted-Q (clock3) output of circuit 702(3) is coupled to node D. Nodes A, D, and B are inputs to the first circuitry branch 714, nodes C, A, and D are inputs to the second circuitry branch 716, nodes B, C, and A are inputs to the third circuitry branch 718, and nodes D, B, and C are inputs to the fourth circuitry branch 720.

Circuitry branch 714 includes initial NOR gate 704(1), intermediate NOR gate 706(1), and final NOR gate 708(1). Initial NOR gate 704(1) receives the following inputs: the output of non-overlap adjustment circuit 710(1), the inverted-Q output of circuit 702(3) at node D, and the inverted-Q output of circuit 702(2) at node B. The output of initial NOR gate 704(1) corresponds to the phb1 signal. Intermediate NOR gate 706(1) receives the following inputs: the Q output of circuit 702(2) at node A and the output of initial NOR gate 704(1). Final NOR gate 708(1) receives the following inputs: the output of circuit 710(1), the output of next intermediate NOR gate 706(2) of branch 716, and the output of intermediate NOR gate 706(1). The output of final NOR gate 708(1) corresponds to the phb1_*d* signal (or the delayed version of the phb1 signal). The output of final NOR gate 708(1) is also coupled as an input to inverter 712(1), where the output of inverter 712(1) corresponds to the phb1_*d*_*c* signal (or the complementary version of phb1_*d* signal). The output of final NOR gate 708(1) is also coupled as an input to circuit 710(2).

Circuitry branch 716 includes initial NOR gate 704(2), intermediate NOR gate 706(2), and final NOR gate 708(2). Initial NOR gate 704(2) receives the following inputs: the output of circuit 710(2), the Q output of circuit 702(2) at node A, and the inverted-Q output of circuit 702(3) at node D. The output of initial NOR gate 704(2) corresponds to the pha2 signal. Intermediate NOR gate 706(2) receives the following inputs: the Q output of circuit 702(3) at node C and the output of initial NOR gate 704(2). Final NOR gate 708(2) receives the following inputs: the output of circuit 710(2), the output of next intermediate NOR gate 706(3) of branch 718, and the output of intermediate NOR gate 706(2). The output of final NOR gate 708(2) corresponds to the pha2_*d* signal (or the delayed version of the pha2 signal). The output of final NOR gate 708(2) is also coupled as an input to inverter 712(2), where the output of inverter 712(2)

corresponds to the pha2_d_c signal (or the complementary version of pha2_d signal). The output of final NOR gate 708(2) is also coupled as an input to circuit 710(3).

Circuitry branch 718 includes initial NOR gate 704(3), intermediate NOR gate 706(3), and final NOR gate 708(3). Initial NOR gate 704(3) receives the following inputs: the output of circuit 710(3), the Q output of circuit 702(3) at node C, and the Q output of circuit 702(2) at node A. The output of initial NOR gate 704(3) corresponds to the phb2 signal. Intermediate NOR gate 706(3) receives the following inputs: the inverted-Q output of circuit 702(2) at node B and the output of input NOR gate 704(3). Final NOR gate 708(3) receives the following inputs: the output of circuit 710(3), the output of next intermediate NOR gate 706(4) of branch 720, and the output of intermediate NOR gate 706(3). The output of final NOR gate 708(3) corresponds to the phb2_d signal (or the delayed version of the phb2 signal). The output of final NOR gate 708(3) is also coupled as an input to inverter 712(3), where the output of inverter 712(3) corresponds to the phb2_d_c signal (or the complementary version of phb2_d signal). The output of final NOR gate 708(3) is also coupled as an input to circuit 710(4).

Circuitry branch 720 includes initial NOR gate 704(4), intermediate NOR gate 706(4), and final NOR gate 708(4). Initial NOR gate 704(4) receives the following inputs: the output of circuit 710(4), the inverted-Q output of circuit 702(2) at node B, and the Q output of circuit 702(3) at node C. The output of initial NOR gate 704(4) corresponds to the pha1 signal. Intermediate NOR gate 706(4) receives the following inputs: the inverted-Q output of circuit 702(3) at node D and the output of initial NOR gate 704(4). Final NOR gate 708(4) receives the following inputs: the output of circuit 710(4), the output of next intermediate NOR gate 706(1) of branch 714, and the output of intermediate NOR gate 706(4). The output of final NOR gate 708(4) corresponds to the pha1_d signal (or the delayed version of the pha1 signal). The output of final NOR gate 708(4) is also coupled as an input to inverter 712(4), where the output of inverter 712(4) corresponds to the pha1_d_c signal (or the complementary version of pha1_d signal). The output of final NOR gate 708(4) is also coupled as an input to circuit 710(1).

Each clock signal generation circuitry branch includes an initial NOR gate 704 that outputs a primary clock phase signal, an intermediate NOR gate 706, and a final NOR gate 708 that outputs a delayed version of the primary clock phase signal, which is delayed by the propagation delay through the intermediate NOR gate 706 and the final NOR gate 708. Additional delay may be incorporated into the delayed clock phase signal through the use of inverters, other delay elements, and the like. In the embodiment shown, the third or lowest input for the initial NOR gate 704 in each circuitry branch is coupled to one of four clock signals output by circuits 702(2) and 702(3), which are used to trigger transitions in the set of non-overlapping clock phase signals.

For each circuitry branch, the output of final NOR gate 708 is coupled to the initial and final NOR gates 704 and 708 of the next lowest circuitry branch via a non-overlap adjustment circuit 710, which incorporates a non-overlap delay between the falling edge of a present delayed clock phase signal generated by a present circuitry branch and the rising edge of a next primary clock phase signal generated by the next lowest circuitry branch. Each non-overlap adjustment circuit 710 is configured to increase or decrease the non-overlap delay by adjusting the propagation delay through circuits 710(1)-(4). In the embodiment shown, each circuit 710 is implemented as a pair of inverters that introduce a desired amount of delay. Additional pairs of inverters may be used to increase this delay. Other embodiments may employ any known means of adjusting the delay through the respective propagation paths.

Each signal at nodes A-D starts a sequence in a respective circuitry branch to generate the primary clock phase signal and delayed version of the primary clock phase signal. For example, as the respective node signal rises for a present branch, the output of the corresponding initial NOR gate 704 is forced low, thereby triggering the present primary clock phase signal to go low, followed some time later by the delayed version of the primary clock phase signal going low. This delayed signal also passes through circuit 710 to the initial and final NOR gates 704 and 708 of the next lowest branch, causing the next primary and delayed clock phase signals in the next lowest branch to simultaneously rise. The sequence repeats for the next branch once the trigger signal for the next branch rises. It is noted that the delayed clock signal generated by the fourth branch 720 is provided to the first branch 714 via circuit 710(1) as the next lowest branch.

In the embodiment shown, when the signal at node B goes high, phb1 is triggered by gate 704(1) to go low, followed by phb1_d going low. When the phb1_d signal goes low, it is passed through circuit 710(2), which simultaneously drives signals pha2 and pha2_d high. When the signal at node D goes high, pha2 is triggered by gate 704(2) to go low, followed by pha2_d going low. When the pha2_d signal goes low, it is passed through circuit 710(3), which simultaneously drives signals phb2 and phb2_d high. When the signal at node A goes high, phb2 is triggered by gate 704(3) to go low, followed by phb2_d going low. When the phb2_d signal goes low, it is passed through circuit 710(4), which simultaneously drives signals pha1 and pha1_d high. When the signal at node C goes high, pha1 is triggered by gate 704(4) to go low, followed by pha1_d going low. When the pha1_d signal goes low, it is passed through circuit 710(1), which simultaneously drives signals phb1 and phb1_d high. The process then repeats.

It is noted that the outputs of circuits 702(2) and 702(3) are used in the initial and intermediate NOR gates 704 and 706 to suppress glitches that might otherwise occur. In this manner, the clock generator circuit 506 produces all of the desired clock signals while maximizing stage settling time and maintaining the correct timing relationships despite random process variations that occur in practical implementations. It is also noted that while FIG. 7A illustrates what appears to be three-input NOR gates, true three-input NOR gates with three stacked PMOS transistors are not required. The third NOR gate input is included to control a third NMOS transistor in order to hold the NOR gate output low when desired, thus suppressing unwanted glitches.

Figure 7B:
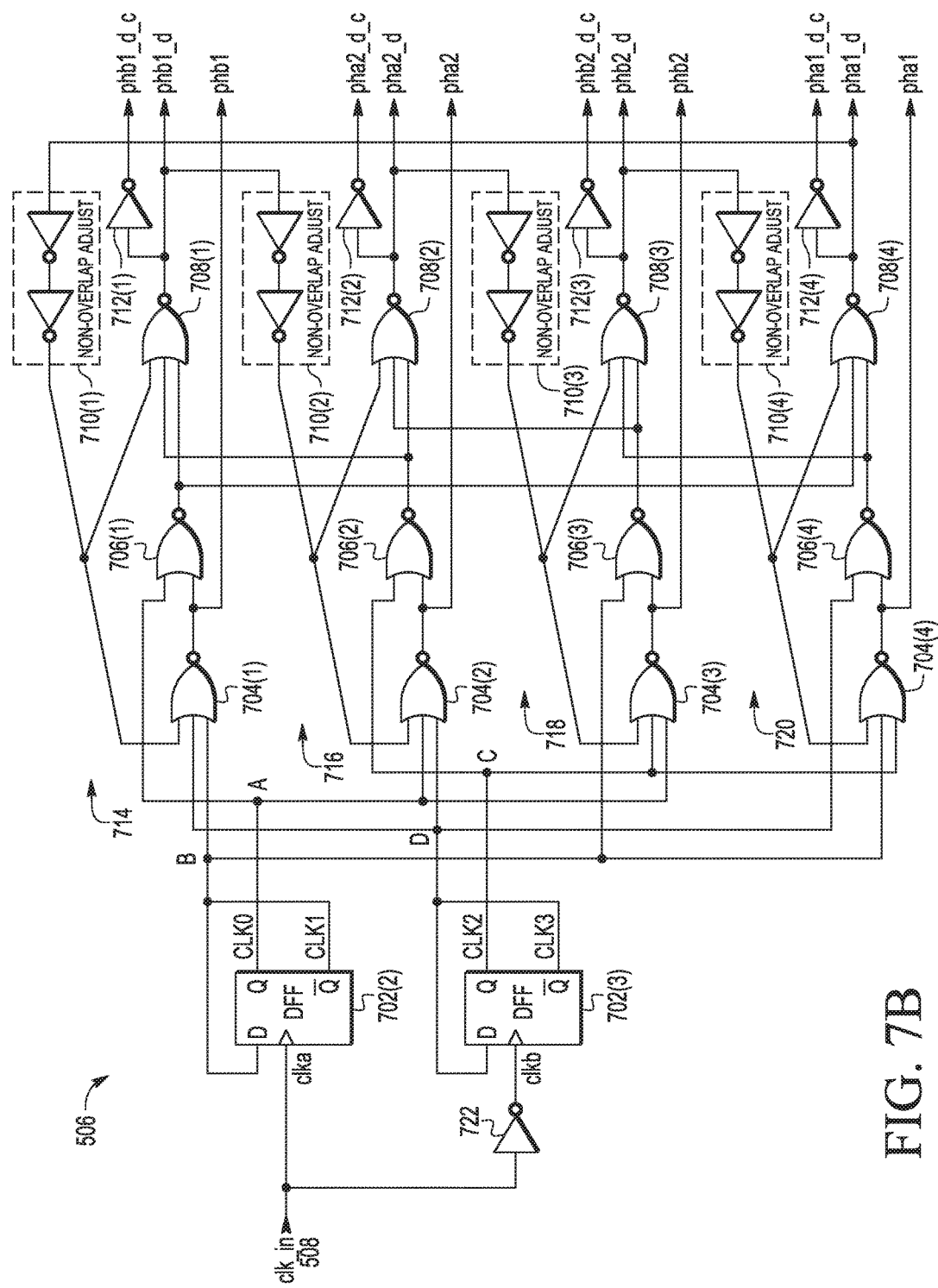

FIG. 7B illustrates a circuit diagram of another example later stage clock generator 506 that can be utilized in the clock generation system of FIG. 5. In this example, later stage clock generator 506 is configured to generate the set of non-overlapping clock phase signals when ADC 100 is configured to sample multiple input channels. The divider circuit 702(1) is not included in FIG. 7B, which allows the use of an input clock signal of the full system clock rate fsys to generate the non-overlapping clock phase signals. As such, FIG. 7B includes the input clock clk_in 508 to be provided as input to circuit 702(2) as clka, and an inverted version of the input clock produced by inverter 722 to be provided as input to circuit 702(3) as clkb. The circuitry paths coupled to nodes A, B, C, and D operate in a same manner as discussed above in connection with FIG. 7A.

Later Stage Clock Generator—Clock Phase Signals

The clock phase signals generated by the later stage clock generator of FIGS. 7A and 7B are analogous to those clock phase signals shown in FIG. 16, as described above. For example, the clock phase signals phb1, pha2, phb2, and pha1 are respectively analogous to the clock phase signals pa2, pb2, pa1, and pb1, which have the same timing relationship shown in FIG. 16.

By now it should be appreciated that there has been provided various stages for a pipelined ADC, which includes at least two distinct first stages each having two input nodes, where the nodes are coupled to four different input channels or are tied together to a single input channel. A second stage operates at twice the frequency of the first stage and combines the outputs of the first stages in a time-interleaved manner. A clock generation system is also provided, which outputs non-overlapping clock phase signals that control the sampling and gain phases of the switched capacitor circuit paths in each stage in a time-interleaved manner.

In one embodiment of the present disclosure, a clock generator that generates multiple non-overlapping clock phase signals is provided, the clock generator including: a first frequency divider having an input to receive an input clock signal, the first frequency divider configured to divide the input clock signal into a first clock signal and a second clock signal; a second frequency divider having an input to receive the first clock signal, the second frequency divider configured to divide the first clock signal into a first clock signal at a first output and a second clock signal at a second output; a third frequency divider having an input to receive the second clock signal, the third frequency divider configured to divide the second clock signal into a third clock signal at a third output and a fourth clock signal at a fourth output; a first latch circuit having a first input node and a second input node, the first latch circuit configured to output a first clock phase signal, a delayed first clock phase signal, a second clock phase signal, and a delayed second clock phase signal; a second latch circuit having a third input node and a fourth input node, the second latch circuit configured to output a third clock phase signal, a delayed third clock phase signal, a fourth clock phase signal, and a delayed fourth clock phase signal; first, second, third, and fourth transmission gates respectively coupled between the first, second, third, and fourth outputs of the second and third frequency dividers and the first, second, third, and fourth input nodes of the latch circuits, wherein each transmission gate has a control electrode coupled to receive an enable signal, the enable signal is a delayed version of the input clock signal by at least an amount sufficient to ensure that the first, second, third, and fourth clock signals become stable in response to a transition edge of the input clock signal, and the transmission gates are configured to respectively output the first, second, third, and fourth clock signals at the first, second, third, and fourth input nodes synchronously with a transition edge of the enable signal.

One aspect of the above embodiment provides that the first and second clock phase signals are non-overlapping with respect to one another, and the third and fourth clock phase signals are non-overlapping with respect to one another.

Another aspect of the above embodiment provides that the first, second, third, and fourth clock signals each have a frequency that is a quarter of a frequency of the input clock signal, and the input clock signal is twice a system clock rate.

Another aspect of the above embodiment provides that a falling edge of each of the first, second, third, and fourth clock phase signals occurs after a delay from a corresponding rising edge of the enable signal, and a rising edge of the third clock phase signal occurs between a rising edge of the first and second clock phase signals, and a rising edge of the fourth clock phase signal occurs between the rising edge of the second clock phase signal and a next rising edge of the first clock phase signal.

Another aspect of the above embodiment provides that the first clock signal synchronized at the first input node drives the first clock phase signal low, the delayed first clock phase signal drives both the second clock phase signal and the delayed second clock phase signal high, the second clock signal synchronized at the second input node drives the second clock phase signal low, and the delayed second clock phase signal drives both the first clock phase signal and the delayed first clock phase signal high.

In another embodiment of the present disclosure, a clock generator that generates multiple non-overlapping clock phase signals is provided, the clock generator including: a first frequency divider having an input to receive an input clock signal, the first frequency divider configured to divide the input clock signal into a first clock signal and a second clock signal; a second frequency divider having an input to receive the first clock signal, the second frequency divider configured to divide the first clock signal into a first clock signal at a first output and a second clock signal at a second output; a third frequency divider having an input to receive the second clock signal, the third frequency divider configured to divide the second clock signal into a third clock signal at a third output and a fourth clock signal at a fourth output; first, second, third, and fourth switches respectively coupled between the first, second, third, and fourth outputs and first, second, third, and fourth input nodes; first, second, third, and fourth circuitry branches each coupled to ones of the first, second, third, and fourth input nodes, the first, second, third, and fourth circuitry branches configured to respectively output first, second, third, and fourth clock phase signals, wherein each switch has a control electrode coupled to receive an enable signal, the enable signal is a delayed version of the input clock signal by at least an amount sufficient to ensure that the first, second, third, and fourth clock signals become stable in response to a transition edge of the input clock signal, and the switches are configured to respectively output the first, second, third, and fourth clock signals at the first, second, third, and fourth input nodes synchronously with a transition edge of the enable signal.

One aspect of the above embodiment provides that the first, second, third, and fourth clock phase signals are non-overlapping with respect to one another.

Another aspect of the above embodiment provides that the first, second, third, and fourth clock phase signals each have a frequency that is a quarter of a frequency of the input clock signal, and the input clock signal is twice a system clock rate.

Another aspect of the above embodiment provides that each circuitry branch includes an initial NOR gate, an intermediate NOR gate, and a final NOR gate, coupled in series, each initial NOR gate outputs a respective one of the first, second, third, and fourth clock phase signals, each final NOR gate outputs a respective one of delayed first, second, third, and fourth clock phase signals, each circuitry branch is coupled to output its respective delayed clock phase signal to a next circuitry branch and is further coupled to receive another respective delayed clock phase signal from a previous circuitry branch.

Another aspect of the above embodiment provides that a falling edge of each of the first, second, third, and fourth clock phase signals occurs after a delay from a corresponding rising edge of the enable signal, a clock pulse of the second clock phase signal occurs between a clock pulse of the first and third clock phase signals, and a clock pulse of the fourth clock phase signal occurs between a clock pulse of the third clock phase signal and a next clock pulse of the first clock phase signal.

Another aspect of the above embodiment provides that the first clock signal synchronized at the first input node drives the first clock phase signal low, a delayed version of the first clock phase signal drives the second clock phase signal high, the third clock signal synchronized at the third input node drives the second clock phase signal low, a delayed version of the second clock phase signal drives the third clock phase signal high, the second clock signal synchronized at the second input node drives the third clock phase signal low, a delayed version of the third clock phase signal drives the fourth clock phase signal high, the fourth clock signal synchronized at the fourth input node drives the fourth clock phase signal low, and a delayed version of the fourth clock phase signal drives the first clock phase signal high.

In another embodiment of the present disclosure, a multi-stage clock generator architecture that generates multiple non-overlapping clock phase signals is provided, the clock generator architecture including: a first stage clock generator having an input for an input clock signal, the first stage clock generator configured to: divide the input clock signal into first, second, third, and fourth clock signals, synchronize each of the first, second, third, and fourth clock signals to a transition edge of a synchronization signal to produce synchronized first, second, third, and fourth clock signals at first, second, third, and fourth input nodes, wherein the synchronization signal is a delayed version of the input clock signal by at an amount sufficient to ensure that the first, second, third, and fourth clock signals become stable in response to a transition edge of the input clock signal, and generate first, second, third, and fourth clock phase signals based on the synchronized first, second, third, and fourth clock signals; and a later stage clock generator having an input for the input clock signal, the later stage clock generator configured to: divide the input clock signal into fifth, sixth, seventh, and eighth clock signals, and generate mutually non-overlapping fifth, sixth, seventh, and eighth clock phase signals based on the fifth, sixth, seventh, and eighth clock signals.

One aspect of the above embodiment provides that the first and second clock phase signals are non-overlapping with respect to one another, and the third and fourth clock phase signals are non-overlapping with respect to one another.

Another aspect of the above embodiment provides that the first, second, third, and fourth clock phase signals are mutually non-overlapping with respect to one another.

Another aspect of the above embodiment provides that the first stage clock generator further includes a delay circuit configured to delay the input clock signal to produce the synchronization signal.

Another aspect of the above embodiment provides that the input clock signal has a first frequency that is twice a system clock rate, and the first, second, third, and fourth clock signals each have a second frequency that is one quarter of the first frequency.

Another aspect of the above embodiment provides that the first stage clock generator further includes: a plurality of circuitry branches including a plurality of NOR gates, each circuitry branch configured to output a respective one of the first, second, third, and fourth clock phase signals and a delayed version of the first, second, third, and fourth clock phase signals.

Another aspect of the above embodiment provides that the first clock signal synchronized at the first input node drives the first clock phase signal low, the delayed first clock phase signal drives both the second clock phase signal and the delayed second clock phase signal high, the second clock signal synchronized at the second input node drives the second clock phase signal low, and the delayed second clock phase signal drives both the first clock phase signal and the delayed first clock phase signal high.

Another aspect of the above embodiment provides that the first clock signal synchronized at the first input node drives the first clock phase signal low, a delayed version of the first clock phase signal drives the second clock phase signal high, the third clock signal synchronized at the third input node drives the second clock phase signal low, a delayed version of the second clock phase signal drives the third clock phase signal high, the second clock signal synchronized at the second input node drives the third clock phase signal low, a delayed version of the third clock phase signal drives the fourth clock phase signal high, the fourth clock signal synchronized at the fourth input node drives the fourth clock phase signal low, and a delayed version of the fourth clock phase signal drives the first clock phase signal high.

Another aspect of the above embodiment provides that the first stage clock generator is further configured to: generate delayed versions of the first, second, third, and fourth clock phase signals, provide the first, second, third, and fourth clock phase signals and the delayed versions to first stages of a pipelined analog to digital converter (ADC), provide the delayed versions to a second stage of the pipelined ADC; the later stage clock generator is further configured to: generate additional delayed versions of the fifth, sixth, seventh, and eighth clock phase signals, provide the fifth, sixth, seventh, and eighth clock phase signals and the additional delayed versions to the second stage of the pipelined ADC, and provide the fifth, sixth, seventh, and eighth clock phase signals and the additional delayed versions to zero or more third stages of the pipelined ADC.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node of feature. For example, a switch may be "coupled to a plurality of nodes, but all of those nodes need not always be "connected" to each other;

the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "activate" (or "assert" or "set") and "clear" (or "deassert" or "negate") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value. Also as used herein, the terms "approximately" and "about" mean a value close to or within an acceptable range of an indicated value, amount, or quality, which also includes the exact indicated value itself.

Although the invention is described herein with reference to specific embodiments, various modifications and changes can be made without departing from the scope of the present invention as set forth in the claims below. For example, additional channels may be implemented in the multi-channel ADC 100 of FIG. 1, and additional clock phase signals may be output by the clock generation system of FIG. 5. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A clock generator that generates multiple non-overlapping clock phase signals, the clock generator comprising:
   a first frequency divider having an input to receive a master clock signal, the first frequency divider configured to divide the master clock signal into a first input clock signal and a second input clock signal;
   a second frequency divider having an input to receive the first input clock signal, the second frequency divider configured to divide the first input clock signal into a first clock signal at a first output and a second clock signal at a second output;
   a third frequency divider having an input to receive the second input clock signal, the third frequency divider configured to divide the second input clock signal into a third clock signal at a third output and a fourth clock signal at a fourth output;
   a first latch circuit having a first input node and a second input node, the first latch circuit configured to output a first clock phase signal, a delayed first clock phase signal, a second clock phase signal, and a delayed second clock phase signal;
   a second latch circuit having a third input node and a fourth input node, the second latch circuit configured to output a third clock phase signal, a delayed third clock phase signal, a fourth clock phase signal, and a delayed fourth clock phase signal;

first, second, third, and fourth transmission gates respectively coupled between the first, second, third, and fourth outputs of the second and third frequency dividers and the first, second, third, and fourth input nodes of the latch circuits, wherein each transmission gate has a control electrode coupled to receive an enable signal, the enable signal is a delayed version of the master clock signal by at least an amount sufficient to ensure that the first, second, third, and fourth clock signals become stable in response to a transition edge of the master clock signal, and the transmission gates are configured to respectively output the first, second, third, and fourth clock signals at the first, second, third, and fourth input nodes synchronously with a transition edge of the enable signal.

2. The clock generator of claim 1, wherein
the first and second clock phase signals are non-overlapping with respect to one another, and
the third and fourth clock phase signals are non-overlapping with respect to one another.

3. The clock generator of claim 1, wherein
the first, second, third, and fourth clock signals each have a frequency that is a quarter of a frequency of the master clock signal, and
the master clock signal is twice a system clock rate.

4. The clock generator of claim 1, wherein
a falling edge of each of the first, second, third, and fourth clock phase signals occurs after a delay from a corresponding rising edge of the enable signal, and
a rising edge of the third clock phase signal occurs between a rising edge of the first and second clock phase signals, and
a rising edge of the fourth clock phase signal occurs between the rising edge of the second clock phase signal and a next rising edge of the first clock phase signal.

5. The clock generator of claim 1, wherein
the first clock signal synchronized at the first input node drives the first clock phase signal low,
the delayed first clock phase signal drives both the second clock phase signal and the delayed second clock phase signal high,
the second clock signal synchronized at the second input node drives the second clock phase signal low, and
the delayed second clock phase signal drives both the first clock phase signal and the delayed first clock phase signal high.

6. A clock generator that generates multiple non-overlapping clock phase signals, the clock generator comprising:

a first frequency divider having an input to receive a master clock signal, the first frequency divider configured to divide the master clock signal into a first input clock signal and a second input clock signal;

a second frequency divider having an input to receive the first input clock signal, the second frequency divider configured to divide the first input clock signal into a first clock signal at a first output and a second clock signal at a second output;

a third frequency divider having an input to receive the second input clock signal, the third frequency divider configured to divide the second input clock signal into a third clock signal at a third output and a fourth clock signal at a fourth output;

first, second, third, and fourth switches respectively coupled between the first, second, third, and fourth outputs and first, second, third, and fourth input nodes;

first, second, third, and fourth circuitry branches each coupled to ones of the first, second, third, and fourth input nodes, the first, second, third, and fourth circuitry branches configured to respectively output first, second, third, and fourth clock phase signals, wherein each switch has a control electrode coupled to receive an enable signal, the enable signal is a delayed version of the master clock signal by at least an amount sufficient to ensure that the first, second, third, and fourth clock signals become stable in response to a transition edge of the master clock signal, and the switches are configured to respectively output the first, second, third, and fourth clock signals at the first, second, third, and fourth input nodes synchronously with a transition edge of the enable signal.

7. The clock generator of claim 6, wherein
the first, second, third, and fourth clock phase signals are non-overlapping with respect to one another.

8. The clock generator of claim 6, wherein
the first, second, third, and fourth clock phase signals each have a frequency that is a quarter of a frequency of the master clock signal, and
the master clock signal is twice a system clock rate.

9. The clock generator of claim 6, wherein
each circuitry branch includes an initial NOR gate, an intermediate NOR gate, and a final NOR gate, coupled in series,
each initial NOR gate outputs a respective one of the first, second, third, and fourth clock phase signals,
each final NOR gate outputs a respective one of delayed first, second, third, and fourth clock phase signals,
each circuitry branch is coupled to output its respective delayed clock phase signal to a next circuitry branch and is further coupled to receive another respective delayed clock phase signal from a previous circuitry branch.

10. The clock generator of claim 6, wherein
a falling edge of each of the first, second, third, and fourth clock phase signals occurs after a delay from a corresponding rising edge of the enable signal,
a clock pulse of the second clock phase signal occurs between a clock pulse of the first and third clock phase signals, and
a clock pulse of the fourth clock phase signal occurs between a clock pulse of the third clock phase signal and a next clock pulse of the first clock phase signal.

11. The clock generator of claim 6, wherein
the first clock signal synchronized at the first input node drives the first clock phase signal low,
a delayed version of the first clock phase signal drives the second clock phase signal high,
the third clock signal synchronized at the third input node drives the second clock phase signal low,
a delayed version of the second clock phase signal drives the third clock phase signal high,
the second clock signal synchronized at the second input node drives the third clock phase signal low,
a delayed version of the third clock phase signal drives the fourth clock phase signal high, the fourth clock signal synchronized at the fourth input node drives the fourth clock phase signal low, and
a delayed version of the fourth clock phase signal drives the first clock phase signal high.

12. A multi-stage clock generator architecture that generates multiple non-overlapping clock phase signals for a multi-stage pipelined analog to digital converter (ADC), the clock generator architecture comprising:
a first stage clock generator having an input for an input clock signal, the first stage clock generator configured to:
divide the input clock signal into first, second, third, and fourth clock signals,
synchronize each of the first, second, third, and fourth clock signals to a transition edge of a synchronization signal to produce synchronized first, second, third, and fourth clock signals at first, second, third, and fourth input nodes, wherein
the synchronization signal is a delayed version of the input clock signal by an amount sufficient to ensure that the first, second, third, and fourth clock signals become stable in response to a transition edge of the input clock signal,
generate first, second, third, and fourth clock phase signals based on the synchronized first, second, third, and fourth clock signals,
provide the first, second, third, and fourth clock phase signals to a first stage and a second stage of the multi-stage pipelined ADC, wherein
the second stage comprises a multiplying digital to analog converter (MDAC) circuit that implements first, second, third, and fourth channels, and
the first, second, third, and fourth clock phase signals are configured to implement a respective sample phase of the first, second, third, and fourth channels; and
a later stage clock generator having an input for the input clock signal, the later stage clock generator configured to:
divide the input clock signal into fifth, sixth, seventh, and eighth clock signals at fifth, sixth, seventh, and eighth input nodes,
generate mutually non-overlapping fifth, sixth, seventh, and eighth clock phase signals based on the fifth, sixth, seventh, and eighth clock signals,
provide the fifth, sixth, seventh, and eighth clock phase signals to the MDAC of the second stage, wherein
the fifth, sixth, seventh, and eighth clock phase signals are configured to implement a respective gain phase of the first, second, third, and fourth channels.

13. The clock generator architecture of claim 12, wherein the first and second clock phase signals are non-overlapping with respect to one another, and
the third and fourth clock phase signals are non-overlapping with respect to one another.

14. The clock generator architecture of claim 12, wherein the first, second, third, and fourth clock phase signals are mutually non-overlapping with respect to one another.

15. The clock generator architecture of claim 12, wherein the first stage clock generator further comprises a delay circuit configured to delay the input clock signal to produce the synchronization signal.

16. The clock generator architecture of claim 12, wherein the input clock signal has a first frequency that is twice a system clock rate, and
the first, second, third, and fourth clock signals each have a second frequency that is one quarter of the first frequency.

17. The clock generator architecture of claim 12, wherein the first, second, third, and fourth clock phase signals are delayed versions of original first, second, third, and fourth clock phase signals, and
the first stage clock generator further comprises:
a plurality of circuitry branches comprising a plurality of NOR gates, each circuitry branch configured to output a respective one of the original first, second, third, and fourth clock phase signals and a respective one of the delayed versions of the first, second, third, and fourth clock phase signals.

18. The clock generator architecture of claim 17, wherein the first clock signal synchronized at the first input node drives the original first clock phase signal low,
the delayed first clock phase signal drives both the original second clock phase signal and the delayed second clock phase signal high,
the second clock signal synchronized at the second input node drives the original second clock phase signal low, and
the delayed second clock phase signal drives both the original first clock phase signal and the delayed first clock phase signal high.

19. The clock generator architecture of claim 17, wherein the first clock signal synchronized at the first input node drives the original first clock phase signal low,
the delayed first clock phase signal drives the original second clock phase signal high,
the third clock signal synchronized at the third input node drives the original second clock phase signal low,
the delayed second clock phase signal drives the original third clock phase signal high,
the second clock signal synchronized at the second input node drives the original third clock phase signal low,
the delayed third clock phase signal drives the original fourth clock phase signal high,
the fourth clock signal synchronized at the fourth input node drives the original fourth clock phase signal low, and
the delayed fourth clock phase signal drives the original first clock phase signal high.

20. The clock generator architecture of claim 12, wherein the first stage clock generator is further configured to:
provide the first and second clock phase signals to a first MDAC circuit of the first stage, wherein the first and second clock phase signals are configured to implement alternating sample and gain phases of the first and second channels in the first MDAC circuit, and
provide the third and fourth clock phase signals to a second MDAC circuit of the first stage, wherein the third and fourth clock phase signals are configured to implement alternating sample and gain phases of the third and fourth channels in the second MDAC circuit; and
the later stage clock generator is further configured to:
provide the fifth, sixth, seventh, and eighth clock phase signals to zero or more third stages of the multi-stage pipelined ADC.

* * * * *